(12) United States Patent
Nosaka

(10) Patent No.: US 10,763,825 B2
(45) Date of Patent: Sep. 1, 2020

(54) RADIO-FREQUENCY FILTER, RADIO-FREQUENCY FRONT-END CIRCUIT, AND COMMUNICATION DEVICE

(71) Applicant: Murata Manufacturing Co., Ltd., Kyoto (JP)

(72) Inventor: Koji Nosaka, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/527,639

(22) Filed: Jul. 31, 2019

(65) Prior Publication Data
US 2019/0363698 A1 Nov. 28, 2019

Related U.S. Application Data

(63) Continuation of application No. PCT/JP2018/003140, filed on Jan. 31, 2018.

(30) Foreign Application Priority Data

Feb. 7, 2017 (JP) .................................. 2017-020579

(51) Int. Cl.
*H03H 11/04* (2006.01)
*H04B 1/44* (2006.01)

(52) U.S. Cl.
CPC ............. *H03H 11/04* (2013.01); *H04B 1/44* (2013.01); *H03H 2210/025* (2013.01); *H03H 2210/026* (2013.01)

(58) Field of Classification Search
CPC ....................................................... H04B 1/44
See application file for complete search history.

(56) References Cited

U.S. PATENT DOCUMENTS

| 5,559,481 A | 9/1996 | Satoh et al. |
| 2004/0095206 A1* | 5/2004 | Tsutsumi ............. H03H 9/6483 333/133 |

(Continued)

FOREIGN PATENT DOCUMENTS

| JP | H05183380 A | 7/1993 |
| JP | H11330904 A | 11/1999 |

(Continued)

OTHER PUBLICATIONS

International Search Report for International Application No. PCT/JP2018/003140 dated Apr. 17, 2018.

(Continued)

*Primary Examiner* — Hsinchun Liao
(74) *Attorney, Agent, or Firm* — Pearne & Gordon LLP

(57) ABSTRACT

A radio-frequency filter (10) includes a series arm circuit (11) and a parallel arm circuit (12). The series arm circuit (11) includes a series arm resonator (s1a) and a variable frequency circuit (11b) connected in parallel with the series arm resonator (s1a). The variable frequency circuit (11b) includes a series arm resonator (s1b) and a switch (SWb) connected in series with the series arm resonator (s1b). The variable frequency circuit (11b) is configured to change at least one of a resonant frequency that provides a pass band of the radio-frequency filter (10) and an anti-resonant frequency that provides an attenuation pole of the radio-frequency filter (10). A resonant frequency of the series arm resonator (s1b) is different from a resonant frequency of the series arm resonator (s1a).

14 Claims, 35 Drawing Sheets

(56) References Cited

U.S. PATENT DOCUMENTS

| | | | |
|---|---|---|---|
| 2009/0201104 A1 | 8/2009 | Ueda et al. | |
| 2009/0251235 A1 | 10/2009 | Belot et al. | |
| 2010/0110940 A1 | 5/2010 | Hara et al. | |
| 2012/0313731 A1 | 12/2012 | Burgener et al. | |

FOREIGN PATENT DOCUMENTS

| | | | |
|---|---|---|---|
| JP | 2008-219748 A | 9/2008 | |
| JP | 2009-207116 A | 9/2009 | |
| JP | 2011-146768 A | 7/2011 | |
| JP | 2014-502803 A | 2/2014 | |
| JP | 5441095 A | 3/2014 | |
| JP | 2015-159488 A | 9/2015 | |
| WO | 2009/025055 A1 | 2/2009 | |

OTHER PUBLICATIONS

Written Opinion for International Application No. PCT/JP2018/003140, dated Apr. 17, 2018.

\* cited by examiner

EXAMPLE 1-2-1

EXAMPLE 1-2-2

EXAMPLE 2-1

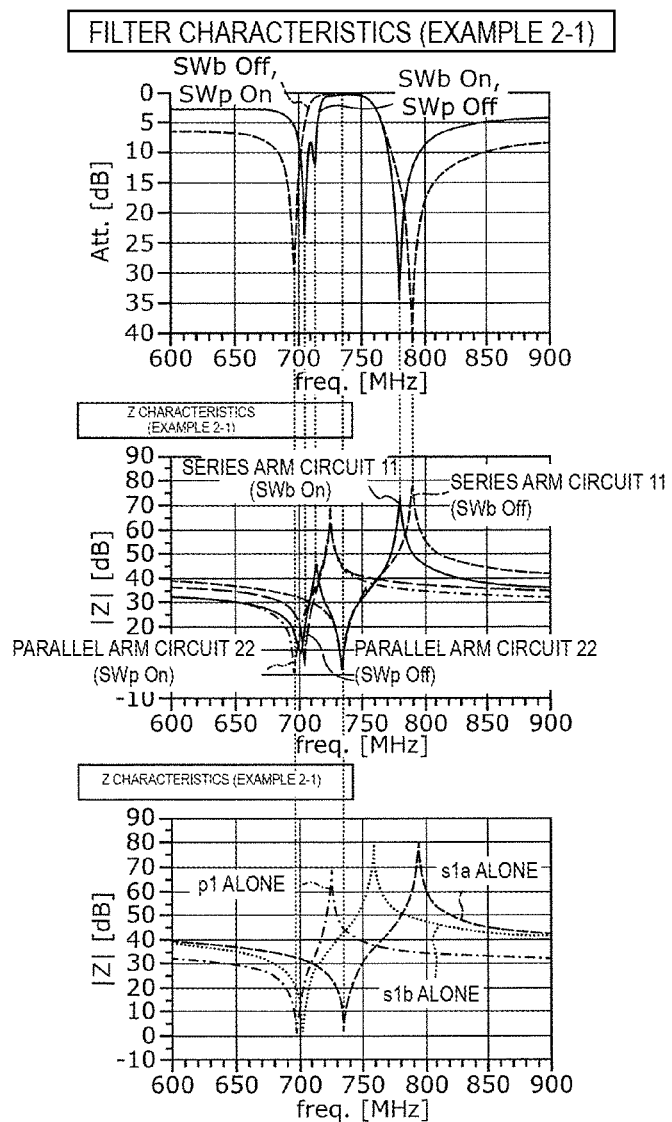

○ SWITCH-DRIVEN POWER SUPPLY TERMINAL
○ SWITCH CONTROL TERMINAL

RADIO-FREQUENCY FILTER, RADIO-FREQUENCY FRONT-END CIRCUIT, AND COMMUNICATION DEVICE

This is a continuation of International Application No. PCT/JP2018/003140 filed on Jan. 31, 2018 which claims priority from Japanese Patent Application No. 2017-020579 filed on Feb. 7, 2017. The contents of these applications are incorporated herein by reference in their entireties.

BACKGROUND OF THE DISCLOSURE

Field of the Disclosure

The present disclosure relates to a radio-frequency filter having resonators, a radio-frequency front-end circuit, and a communication device.

Description of the Related Art

Hitherto, tunable radio-frequency filters (tunable filters) have been suggested as radio-frequency filters that support multiband functionality.

As such a tunable radio-frequency filter, for example, a first configuration in which two parallel arm resonators having resonant frequencies different from each other are connected in series with each other and a switch is connected in parallel with at least one of these two parallel arm resonators is known (see, for example, FIG. 10 of Patent Document 1). This first configuration is star-delta transformed into a second configuration that a series connection circuit made up of a resonator (correction resonator) and a switch is connected in parallel with two series arm resonators connected via a node to which a parallel arm resonator is connected (see, for example, FIG. 9A of Patent Document 1).

Patent Document 1: Japanese Patent No. 5441095

BRIEF SUMMARY OF THE DISCLOSURE

With the above-described existing configuration, a first attenuation pole at a lower edge of a pass band changes in frequency toward the pass band in response to switching between an on state (conductive state) and an off state (nonconductive state) of the switch. Therefore, the presence or absence of a new third attenuation pole between a second attenuation pole at a higher edge of the pass band and the pass band can be switched. Specifically, when the switch is switched from the on state to the off state, the first attenuation pole on the lower side of the pass band changes in frequency toward the pass band (that is, toward a higher frequency side), and a new third attenuation pole is added between the second attenuation pole on the higher side of the pass band and the pass band. With the above-described existing configuration, the difference from the frequency of the second attenuation pole to the frequency of the third attenuation pole is greater than the variable frequency width of the first attenuation pole. For this reason, there is inconvenience that the loss at the lower edge of the pass band deteriorates (an insertion loss increases) and an attenuation on the higher side of the pass band deteriorates, or the loss at the higher edge of the pass band deteriorates (an insertion loss increases) and an attenuation on the lower side of the pass band deteriorates.

It is an object of the present disclosure to provide a tunable radio-frequency filter, radio-frequency front-end circuit, and communication device that are able to improve a loss at a lower edge of a pass band and an attenuation on a higher side of the pass band or improve a loss at a higher edge of the pass band and an attenuation on a lower side of the pass band.

To achieve the above object, a radio-frequency filter according to an aspect of the present disclosure includes a series arm circuit provided in a path connecting a first input and output terminal and a second input and output terminal, and a parallel arm circuit connected to a ground and a node in the path. The series arm circuit includes a first series arm resonator provided in the path, and a first variable frequency circuit connected in parallel with the first series arm resonator. The first variable frequency circuit includes a second series arm resonator and a first switch connected in series with the second series arm resonator. The first variable frequency circuit is configured to change at least one of a resonant frequency that provides a pass band of the radio-frequency filter and an anti-resonant frequency that provides an attenuation pole of the radio-frequency filter. A resonant frequency of the second series arm resonator is different from a resonant frequency of the first series arm resonator.

With such a configuration, at least one of the resonant frequency that provides the pass band of the radio-frequency filter and the anti-resonant frequency that provides the attenuation pole of the radio-frequency filter is changed for the series arm circuit by switching between an on state and off state of the first switch. Specifically, when the first switch is off, the series arm circuit has a third resonant frequency that is the same as the resonant frequency of the first series arm resonator and a third anti-resonant frequency that lies on a slightly lower frequency side than an anti-resonant frequency of the first series arm resonator. When the first switch is on, the series arm circuit has a first resonant frequency that is the same as the resonant frequency of the first series arm resonator, a second resonant frequency that is the same as the resonant frequency of the second series arm resonator, a first anti-resonant frequency that lies between the resonant frequency of the first series arm resonator and the resonant frequency of the second series arm resonator, and a second anti-resonant frequency that lies on a higher frequency side than the second resonant frequency.

In this respect, when the resonant frequency of the second series arm resonator is lower than the resonant frequency of the first series arm resonator, and when the first switch is off, the third resonant frequency provides the pass band, and the third anti-resonant frequency provides the attenuation pole on a higher side of the pass band. In this case, when the first switch is on, the second resonant frequency provides the pass band, the first anti-resonant frequency provides the attenuation pole on a lower side of the pass band, and the second anti-resonant frequency provides the attenuation pole on a higher side of the pass band. In other words, in this case, a new attenuation pole is provided on the lower side of the pass band by turning the first switch from the off state to the on state.

On the other hand, when the resonant frequency of the second series arm resonator is higher than the resonant frequency of the first series arm resonator, and when the first switch is off, the third resonant frequency provides the pass band, and the third anti-resonant frequency provides the attenuation pole on a higher side of the pass band. In this case, when the first switch is on, the first resonant frequency provides the pass band, and both the first anti-resonant frequency and the second anti-resonant frequency provide the attenuation poles on a higher side of the pass band. In other words, a new attenuation pole is provided on a higher side of the pass band by turning the first switch from the off state to the on state.

Thus, when the attenuation pole on the lower side of the pass band, which is provided by the resonant frequency of the parallel arm circuit, is considered, the following can be said on the relationship between switching the on state and off state of the first switch and the pass band. Specifically, when the first switch is switched from the off state to the on state, a new attenuation pole is provided on one side (for example, a lower side) of the pass band, so the stop band on the one side of the pass band is widened. At this time, since no new attenuation pole is provided on the other side (in this case, a higher side) of the pass band, the deterioration of a loss at the other edge (in this case, a higher edge) of the pass band is reduced, and the deterioration of the attenuation on the other side (in this case, a lower side) of the pass band is reduced.

Therefore, according to this aspect, the tunable radio-frequency filter that is able to improve a loss at the higher edge of the pass band and the attenuation on the lower side of the pass band or improve a loss at the lower edge of the pass band and the attenuation on the higher side of the pass band is implemented.

The resonant frequency of the second series arm resonator may be lower than the resonant frequency of the first series arm resonator.

When the resonant frequency of the second series arm resonator is lower than the resonant frequency of the first series arm resonator in this way, the number of attenuation poles on the lower side of the pass band can be increased or reduced by switching between the on state and off state of the first switch. Thus, the frequencies of the pass band and the frequency of the attenuation pole on the lower side of the pass band can be changed while a loss at the higher edge of the pass band is reduced and the attenuation on the lower side of the pass band is improved.

The series arm circuit may include a plurality of the first variable frequency circuits, and the resonant frequencies of a plurality of the second series arm resonators that the plurality of first variable frequency circuits includes may be different from each other.

When the resonant frequencies of the plurality of second series arm resonators are different from each other in this way, the pass band and the stop band can be changed according to the first switch selected and set to the on state from among the plurality of first switches that the plurality of first variable frequency circuits includes. In other words, while a loss at one edge of the pass band is reduced, the variable width of the frequencies of the pass band and the variable width of the frequency of the attenuation pole on the other side of the pass band can be minutely set.

The resonant frequency of at least one of the plurality of second series arm resonators may be lower than the resonant frequency of the first series arm resonator, and the resonant frequency of another one of the plurality of second series arm resonators may be higher than the resonant frequency of the first series arm resonator.

When the resonant frequency of at least one of the plurality of second series arm resonators is lower than the resonant frequency of the first series arm resonator in this way, the frequencies of the pass band and the frequency of the attenuation pole on the lower side of the pass band can be changed while a loss at the higher edge of the pass band is reduced by switching between the on state and off state of the first switch (hereinafter, lower-side variable switch) connected in series with the at least one second series arm resonator. When the resonant frequency of at least another one of the plurality of second series arm resonators is higher than the resonant frequency of the first series arm resonator in this way, the frequencies of the pass band and the frequency of the attenuation pole on the higher side of the pass band can be changed while a loss at the lower edge of the pass band is reduced by switching between the on state and off state of the first switch (hereinafter, higher-side variable switch) connected in series with the at least one second series arm resonator.

Therefore, according to this aspect, the frequency of the attenuation pole can be changed while a loss at the edge of the pass band is reduced for each of the lower side and higher side of the pass band by individually switching between the on state and off state of a corresponding one of the lower-side variable switch and the higher-side variable switch.

Any of the resonant frequencies of the plurality of second series arm resonators may be lower than the resonant frequency of the first series arm resonator.

When any of the resonant frequencies of the plurality of second series arm resonators is lower than the resonant frequency of the first series arm resonator in this way, the pass band and the stop band on the lower side of the pass band can be changed according to the first switch selected and set to the on state from among the plurality of first switches that the plurality of first variable frequency circuits includes. In other words, while a loss at the higher edge of the pass band is reduced, the variable width of the frequencies of the pass band and the variable width of the frequency of the attenuation pole on the lower side of the pass band can be minutely set.

The series arm circuit may further include a first impedance element connected in series with the first series arm resonator, and the first variable frequency circuit may be connected in parallel with a first series connection circuit made up of the first series arm resonator and the first impedance element.

When the first series arm resonator and the first impedance element are connected in series with each other in this way, the difference between the resonant frequency and anti-resonant frequency of the first series connection circuit can be changed from the frequency difference of the first series arm resonator. Specifically, the frequency difference can be reduced when the first impedance element is a capacitor, and the frequency difference can be increased when the first impedance element is an inductor. Thus, since the difference between the second resonant frequency and second anti-resonant frequency of the series arm circuit can be adjusted by adjusting the circuit constants of the first impedance element as needed, the difference between a cut-off frequency on the higher side of the pass band, determined by the frequency difference, and the attenuation pole on the higher side of the pass band can be adjusted. Therefore, the pass band width and the steepness of an attenuation slope can be selectively set.

The parallel arm circuit may include a first parallel arm resonator connected between the node and the ground, and a second variable frequency circuit connected in series with the first parallel arm resonator, the second variable frequency circuit may include a second impedance element and a second switch connected in parallel with the second impedance element, and a resonant frequency of the first parallel arm resonator may be lower than the resonant frequency of the first series arm resonator.

As a result of changing the frequency of the attenuation pole by switching between the on state and off state of the first switch, the attenuation can deteriorate. For this reason, by providing the second variable frequency circuit connected in series with the first parallel arm resonator, the resonant frequency that provides the attenuation pole of the radio-frequency filter can be changed for the parallel arm circuit by switching between the on state and off state of the second switch. Thus, when a circuit constant of the second impedance element is adjusted as needed according to the stop band and attenuation required for the radio-frequency filter, the deterioration of the attenuation on the lower side of the pass band resulting from changing of the frequency of the series arm circuit is reduced.

The parallel arm circuit may further include a second parallel arm resonator connected in parallel with a second series connection circuit made up of the first parallel arm resonator and the second variable frequency circuit, and a resonant frequency of the second parallel arm resonator may be higher than the resonant frequency of the first parallel arm resonator.

When the parallel arm circuit includes the second parallel arm resonator whose resonant frequency is higher than the resonant frequency of the first series arm resonator in this way, a new attenuation pole is provided on the higher side of the pass band by the resonant frequency of the second parallel arm resonator. Therefore, the attenuation on the higher side of the pass band is improved.

Since the parallel arm circuit includes the second parallel arm resonator, the parallel arm circuit has two resonant frequencies and two anti-resonant frequencies. In comparison with the difference between the resonant frequency and the anti-resonant frequency in the case where the parallel arm circuit includes no second parallel arm resonator, the difference between the lower frequency-side resonant frequency and the lower frequency-side anti-resonant frequency is reduced. Therefore, according to this aspect, the cut-off frequency on the lower side of the pass band can be shifted toward a lower frequency side, so a loss at the lower edge of the pass band is improved.

The second impedance element may be a capacitor. When the first switch is on, the second switch may be off. When the first switch is off, the second switch may be on.

Thus, when the second switch is switched from the on state to the off state, the capacitor connected in series with the first parallel arm resonator becomes effective. Thus, since the resonant frequency of the parallel arm circuit shifts toward a higher side, the attenuation pole on the lower side of the pass band, which is provided by the resonant frequency, shifts toward a higher frequency side. Therefore, since the second switch is off when the first switch is on, an attenuation on the lower side of the pass band when the lower side of the pass band is shifted toward a higher frequency side (at the time of higher frequency shift) is improved (increased).

A control circuit for the first switch and a control circuit for the second switch can be integrated, so the miniaturization of the radio-frequency filter is possible.

The second impedance element may be an inductor. When the first switch is on, the second switch may be on. When the first switch is off, the second switch may be off.

Thus, when the second switch is switched from the on state to the off state, the inductor is connected in series with the first parallel arm resonator. Thus, since the resonant frequency of the parallel arm circuit shifts toward a lower side, the attenuation pole on the lower side of the pass band, which is provided by the resonant frequency, shifts toward a lower frequency side. Therefore, since the second switch is on when the first switch is on, the frequency on the lower side of the pass band when the lower side of the pass band is shifted toward a lower frequency side (at the time of lower frequency shift) is decreased. In other words, the variable frequency width on the lower side of the pass band is increased.

A control circuit for the first switch and a control circuit for the second switch can be integrated, so the miniaturization of the radio-frequency filter is possible.

The first switch may be connected to the first input and output terminal or the second input and output terminal without intervening any of the series arm resonators.

Thus, when the series arm resonators are provided on or in a chip for resonators and the first switch is provided on or in another chip, the number of terminals of the chip for resonators is reduced. Specifically, in this case, in the chip for resonators, terminals that are connected to the one input and output terminal and terminals that are connected to the other chip are respectively shared. Therefore, according to this aspect, in comparison with the configuration in which these terminals are individually provided, the number of terminals of the chip for resonators is reduced, so the miniaturization of the radio-frequency filter is achieved.

The first switch may be an FET switch made from GaAs or CMOS, or a diode switch.

Thus, the resistance of the first switch is reduced, so a loss in the pass band is reduced. In addition, the first switch is miniaturized, so the miniaturization and cost reduction of the radio-frequency filter are possible.

A radio-frequency front-end circuit according to an aspect of the present disclosure includes any one of the above-described radio-frequency filters, and a control unit configured to control the first switch between the on state and the off state.

Thus, the small-sized radio-frequency front-end circuit that improves a loss at the lower edge of the pass band and the attenuation on the higher frequency side of the pass band or improves a loss at the higher edge of the pass band and the attenuation on the lower side of the pass band is achieved.

A communication device according to an aspect of the present disclosure includes an RF signal processing circuit configured to process a radio-frequency signal that is transmitted or received by an antenna element, and the above-described radio-frequency front-end circuit configured to transfer the radio-frequency signal between the antenna element and the RF signal processing circuit.

Thus, the small-sized communication device that improves a loss at the lower edge of the pass band and the attenuation on the higher side of the pass band or improves a loss at the higher edge of the pass band and the attenuation on the lower side of the pass band is achieved.

With the tunable radio-frequency filter, radio-frequency front-end circuit, and the communication device according to the present disclosure, a loss at the lower edge of the pass band and the attenuation on the higher side of the pass band are improved, or a loss at the higher edge of the pass band and the attenuation on the lower side of the pass band are improved.

BRIEF DESCRIPTION OF THE SEVERAL VIEWS OF THE DRAWINGS

FIG. 10B shows graphs of various characteristics of the radio-frequency filter according to Example 2-1.

DETAILED DESCRIPTION OF THE DISCLOSURE

Figure 1A:
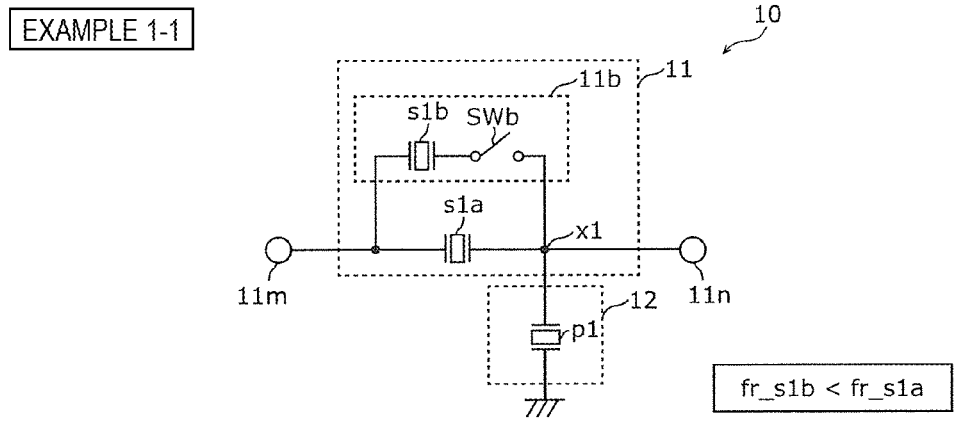
FIG. 1A is a circuit configuration diagram of a radio-frequency filter according to Example (Example 1-1) of a first embodiment.

Hereinafter, embodiments of the present disclosure will be described in detail with reference to Examples and the drawings. Any of the embodiments that will be described below describes a comprehensive or specific example. Numeric values, shapes, materials, elements, disposition and connection modes of the elements, and the like, that will be described below are illustrative, and are not intended to limit the present disclosure. Of the elements in the following embodiments, the elements not included in the independent claims will be described as optional elements. In addition, the size or size ratio of elements shown in the drawings is not necessarily strict. In the drawings, like reference signs denote substantially identical components, and the overlap description may be omitted or simplified. For circuit elements, such as resonators, constants can be adjusted as needed according to the required specifications or others.

Therefore, for circuit elements, constants can be different even with the same reference numerals. In the following description, the term "lower edge of a pass band" and the term "higher edge of a pass band" respectively mean a lower edge (lower frequency-side edge) in a pass band and a higher edge (higher frequency-side edge) in a pass band. In the following description, the term "lower side of a pass band" and the term "higher side of a pass band" respectively mean frequencies outside a pass band and lower (lower frequency side) than the pass band and frequencies outside a pass band and higher (higher frequency side) than the pass band.

The resonant frequency of a resonator or circuit, unless otherwise specified, is a resonant frequency for forming a pass band of a filter including the resonator or the circuit or an attenuation pole near the pass band, and is a frequency at a resonant point that is a singular point where the impedance of the resonator or the circuit is local minimum (ideally, a point where the impedance is zero).

The anti-resonant frequency of a resonator or circuit, unless otherwise specified, is an anti-resonant frequency for forming a pass band of a filter including the resonator or the circuit or an attenuation pole near the pass band, and is a frequency at an anti-resonant point that is a singular point where the impedance of the resonator or the circuit is local maximum (ideally, a point where the impedance is infinite).

In the following embodiments, a series arm circuit and a parallel arm circuit are defined as follows.

A parallel arm circuit is a circuit disposed between a ground and a node in a path that connects a first input and output terminal and a second input and output terminal.

A series arm circuit is a circuit disposed between the first input and output terminal or second input and output terminal and a node in the path to which the parallel arm circuit is connected or a circuit disposed between one node in the path to which one parallel arm circuit is connected and another node in the path to which another parallel arm circuit is connected.

First Embodiment

Hereinafter, a radio-frequency filter according to the present embodiment will be described by way of Examples (Example 1-1, Example 1-2, and Example 1-3).

[1-1. Configuration]

FIG. 1A is a circuit configuration diagram of a radio-frequency filter 10 according to Example 1-1. The radio-frequency filter 10 shown in the diagram includes a series arm circuit 11 and a parallel arm circuit 12.

The series arm circuit 11 is a resonant circuit provided in a path (series arm) connecting an input and output terminal 11m (first input and output terminal) and an input and output terminal 11n (second input and output terminal). Specifically, the series arm circuit 11 includes a series arm resonator s1a (first series arm resonator) and a variable frequency circuit 11b (first variable frequency circuit). The variable frequency circuit 11b is made up of a series arm resonator s1b (second series arm resonator) and a switch SWb (first switch). In this way, since the series arm circuit 11 includes the series arm resonators s1a, s1b each having a resonant frequency (resonant point) at which the impedance is local minimum and an anti-resonant frequency (anti-resonant point) at which the impedance is local maximum, the series arm circuit 11 has a resonant frequency and an anti-resonant frequency that depend on the resonant frequencies and anti-resonant frequencies of the series arm resonators s1a, s1b. The details will be described later.

The series arm resonator s1a is a first series arm resonator provided in the series arm connecting the input and output terminal 11m and the input and output terminal 11n, and is connected between the input and output terminal 11m (first input and output terminal) and the input and output terminal 11n (second input and output terminal).

The series arm resonator s1b is a second series arm resonator provided in the series arm and in a path that bypasses the series arm resonator s1a. One terminal of the series arm resonator s1b is connected to one terminal of the series arm resonator s1a, and the other terminal of the series arm resonator s1b is connected to the other terminal of the series arm resonator s1a via the switch SWb.

The switch SWb is a first switch connected in series with the series arm resonator s1b (second series arm resonator). The switch SWb is an SPST (single pole single throw) switch element. Examples of the switch SWb include an FET (field effect transistor) switch made from GaAs (gallium arsenide) or CMOS (complementary metal oxide semiconductor), and a diode switch. The switch SWb is configured as, for example, a switch IC (integrated circuit). The switch SWb is not limited to a semiconductor switch formed on or in a semiconductor substrate and may be a mechanical switch made up of MEMS (micro electro mechanical systems).

The variable frequency circuit 11b (first variable frequency circuit) made up of these series arm resonator s1b and switch SWb changes the resonant frequency that provides the pass band of the radio-frequency filter 10 and the anti-resonant frequency that provides the attenuation pole of the radio-frequency filter 10. Specifically, the variable frequency circuit 11b changes the resonant frequency and the anti-resonant frequency by switching between the on state (conductive state) and off state (nonconductive state) of the switch SWb in accordance with a control signal from a control unit (not shown), such as an RFIC or other like controller, processor, or integrated or discrete circuit.

The variable frequency circuit 11b just needs to change at least one of the resonant frequency and the anti-resonant frequency and may change only any one of the resonant frequency and the anti-resonant frequency.

In this Example, the series arm resonator s1b and the switch SWb that make up the variable frequency circuit 11b are connected in this order from the input and output terminal 11m side. Alternatively, the series arm resonator s1b and the switch SWb may be connected in reverse order.

In this way, the series arm circuit 11 includes the series arm resonator s1a (first series arm resonator) and the variable frequency circuit 11b connected in parallel with the series arm resonator s1a.

The parallel arm circuit 12 is a resonant circuit connected with a ground (reference terminal) and a node x1 in the path (series arm) connecting the input and output terminal 11m and the input and output terminal 11n. Specifically, the parallel arm circuit 12 includes a parallel arm resonator p1 connected between the node x1 and the ground. In this way, since the parallel arm circuit 12 includes the parallel arm resonator p1 that has a resonant frequency (resonant point) at which the impedance is local minimum and an anti-resonant frequency (anti-resonant point) at which the impedance is local maximum, the parallel arm circuit 12 has a resonant frequency and an anti-resonant frequency that depend on the resonant frequency and anti-resonant frequency of the parallel arm resonator p1.

In the thus configured radio-frequency filter 10, each of the resonators (in this Example, the series arm resonators s1a, s1b, and the parallel arm resonator p1) is, for example, an acoustic wave resonator that uses surface acoustic waves.

Figure 2:
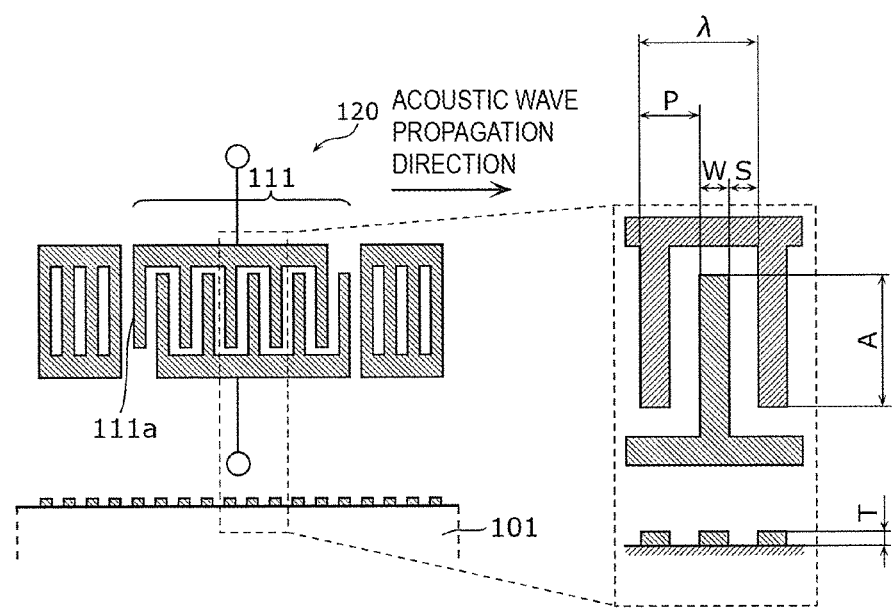
FIG. 2 shows a schematic plan view and cross-sectional view of the electrode configuration of an acoustic wave resonator that uses surface acoustic waves.

FIG. 2 shows a schematic plan view and cross-sectional view of the electrode configuration of an acoustic wave resonator 120 that uses surface acoustic waves. The electrode configuration shown in the drawings is the one for illustrating the typical structure of each of the resonators in the radio-frequency filter 10, and the number of electrode fingers that make up the electrode, the length of each electrode finger, and the like, are not limited thereto.

As shown in the drawings, the acoustic wave resonator 120 includes a piezoelectric substrate 101 and an interdigital transducer electrode 111. The piezoelectric substrate 101 is a substrate at least partially having piezoelectricity. The interdigital transducer electrode 111 is formed on the piezoelectric substrate 101.

The interdigital transducer electrode 111 includes a plurality of electrode fingers 111a and a pair of busbar electrodes disposed on opposite sides with the plurality of electrode fingers 111a interposed therebetween. The plurality of electrode fingers 111a is alternately connected to one and the other of the pair of busbar electrodes. The plurality of electrode fingers 111a is formed along a direction perpendicular to a propagation direction of surface acoustic waves, and is periodically formed along the propagation direction.

In the thus configured acoustic wave resonator 120, the wave length of surface acoustic waves to be excited is determined by design parameters of the interdigital transducer electrode 111, or other parameters. Hereinafter, the design parameters of the interdigital transducer electrode 111 will be described.

The wave length of surface acoustic waves is determined by a cycle period λ of the electrode fingers 111a connected to one busbar electrode among the plurality of electrode fingers 111a. An electrode finger pitch (the pitch of the plurality of electrode fingers 111a, that is, an electrode finger period) P is a half of the cycle period λ. The electrode finger pitch is defined as P=(W+S) where the line width of each electrode finger 111a is W and the space width between any adjacent electrode fingers 111a is S. An electrode duty (duty ratio) is the occupancy of the line widths of the plurality of electrode fingers 111a, and is the proportion of the line width to an added value of the line width of each of the plurality of electrode fingers 111a and the space width between any adjacent two of the plurality of electrode fingers 111a, that is, the electrode duty is defined as W/(W+S). In other words, the electrode duty is the ratio of the width of each of the plurality of electrode fingers 111a to the electrode finger pitch (the pitch of the plurality of electrode fingers 111a), that is, the electrode duty is defined as W/P. The number of pairs is the number of paired electrode fingers 111a, and is about a half of the total number of the electrode fingers 111a. For example, where the number of pairs is N and the total number of the electrode fingers 111a is M, M=2N+1. The electrostatic capacity $C_0$ of the acoustic wave resonator 120 is expressed by the following mathematical expression 1.

[Mathematical 1]

$$\text{ELECTROSTATIC CAPACITY } C_0 = \frac{\varepsilon_0 \cdot \varepsilon_r \cdot \text{NUMBER OF PAIRS} \cdot \text{OVERLAP WIDTH}}{2 \cdot (1 - \text{ELECTRODE DUTY})} \quad (1)$$

$\varepsilon_0$ is the permittivity in a vacuum, and $\varepsilon_r$ is the permittivity of the piezoelectric substrate 101.

[1-2. Characteristics]

The radio-frequency filter 10 configured as described above is able to reduce the loss at the higher edge of the pass band and change (shift) frequencies on the lower side of the pass band. Hereinafter, the filter characteristics (bandpass characteristics) of the radio-frequency filter 10 of this Example will be described while impedance characteristics (resonant characteristics) that determine the filter characteristics are discussed.

Circuit constants of the radio-frequency filter 10 of Example 1-1 are shown in Table 1. An off capacitance (Coff) that is a capacitive component when the switch SWb is off is 0.2 pF. The details of the off capacitance (Coff) will be described later.

TABLE 1

|  | Series Arm Resonator s1a | Series Arm Resonator s1b | Parallel Arm Resonator p1 |
| --- | --- | --- | --- |
| Resonant Frequency fr [MHz] | 735 | 702 | 697 |
| Anti-Resonant Frequency fa [MHz] | 794 | 758 | 725 |
| Electrostatic Capacity $C_0$ [pF] | 2.0 | 2.0 | 2.0 |

As shown in Table 1, the resonant frequency (fr_s1b) of the series arm resonator s1b (second series arm resonator) is different from the resonant frequency (fr_s1a) of the series arm resonator s1a (first series arm resonator) (fr_s1b≠fr_s1a), and, in this Example, is lower than the resonant frequency of the series arm resonator s1a (fr_s1b<fr_s1a). The resonant frequency (fr_p1) of the parallel arm resonator p1 is lower than the resonant frequency of the series arm resonator s1a (fr_p1<fr_s1a).

Figure 1B:
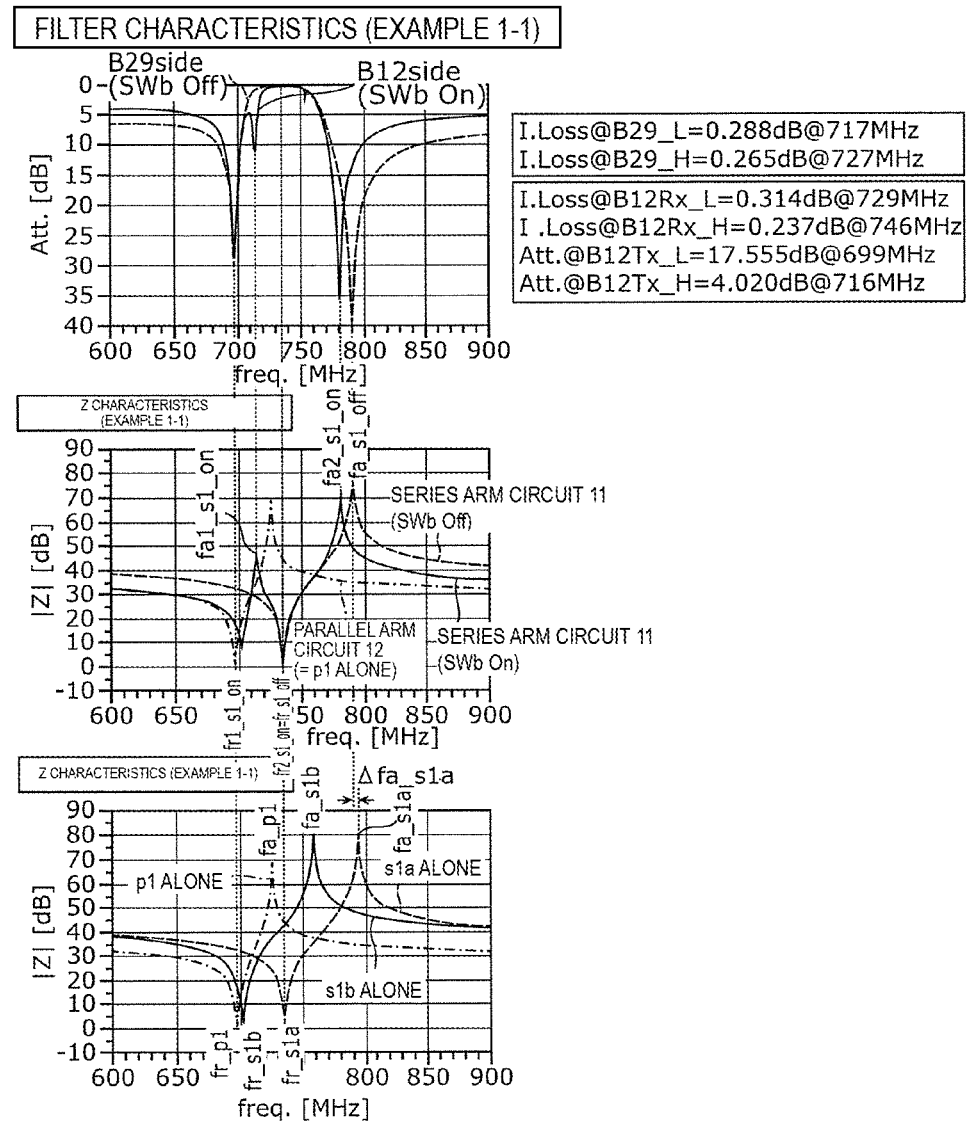
FIG. 1B shows graphs of various characteristics of the radio-frequency filter according to Example 1-1.

FIG. 1B shows graphs of various characteristics of the radio-frequency filter 10. Specifically, the top graph shows filter characteristics in two states, that is, the case where the switch SWb is on and the case where the switch SWb is off. The middle graph shows the impedance characteristics of the series arm circuit 11 and parallel arm circuit 12. The bottom graph shows the impedance characteristics of the series arm resonator s1a, the series arm resonator s1b, and the parallel arm resonator p1. For the series arm circuit 11, the impedance characteristics in two states, that is, the case where the switch SWb is on and the case where the switch SWb is off, are shown.

The radio-frequency filter 10 according to this Example is a tunable receiving filter that switches an accepting frequency band (that is, a frequency band to be filtered) between Band 29 and Band 12 defined in 3GPP (third generation partnership project). Therefore, as shown in the top graph of FIG. 1B, the radio-frequency filter 10 switches the pass band between Band 29Rx (717 MHz. to 727 MHz) that is the receiving band of Band 29 and Band 12Rx (729 MHz. to 746 MHz) that is the receiving band of Band 12.

First, characteristics when the switch SWb is off in the circuit configuration shown in FIG. 1A will be described.

In this case, the series arm circuit 11 is placed in a state where the variable frequency circuit 11b whose switch SWb is off is connected in parallel with the series arm resonator s1a. At this time, since the impedance of the variable frequency circuit 11b is extremely high (ideally, infinite), the series arm circuit 11 exhibits substantially the same characteristics (ideally, exactly the same characteristics) as the characteristics of the series arm resonator s1a.

However, actually, as shown in the middle and bottom graphs in FIG. 1B, the anti-resonant frequency (fa_s1_off) of the series arm circuit 11 is influenced by a combined capacitance of the series arm resonator s1b of the variable frequency circuit 11b and the off capacitance (Coff) of the switch SWb. Therefore, the anti-resonant frequency (fa_s1_off) slightly shifts (Δfa_s1a) toward a lower frequency side from the anti-resonant frequency (fa_s1a) of the series arm resonator s1a.

The off capacitance (Coff) of the switch SWb is a capacitive component when the switch SWb is off. In other words, the switch SWb is placed in a state of ideally no capacitive component (that is, the impedance is infinite) when the switch SWb is off; however, the switch SWb actually has an off capacitance (Coff) that is a slight capacitive component. Since the off capacitance is sufficiently less than the electrostatic capacity of the series arm resonator s1b (0.2 pF in this Example), a combined capacitance of the series arm resonator s1b and the off capacitance of the switch SWb is sufficiently less than the electrostatic capacity of the series arm resonator s1b. Thus, there is a slight frequency difference (Δfa_s1a) in the anti-resonant frequency of the series arm circuit 11 between when the switch SWb is off and when the switch SWb is on.

On the other hand, since the resonant frequency (fr_s1_off) of the series arm circuit 11 is not influenced by the variable frequency circuit 11b, the resonant frequency (fr_s1_off) is equal to the resonant frequency (fr_s1a) of the series arm resonator s1a.

Next, characteristics when the switch SWb is on in the circuit configuration shown in FIG. 1A will be described.

In this case, the series arm circuit 11 is placed in a state where the variable frequency circuit 11b whose switch SWb is on is connected in parallel with the series arm resonator s1a. In other words, the series arm circuit 11 becomes a parallel connection circuit of the series arm resonator s1a and the series arm resonator s1b.

Therefore, as shown in the middle graph in FIG. 1B, the series arm circuit 11 has two resonant frequencies and two anti-resonant frequencies. Specifically, the series arm circuit 11 has a first resonant frequency (fr1_s1_on) equal to the resonant frequency (fr_s1b) of the series arm resonator s1b, a second resonant frequency (fr2_s1_on) equal to the resonant frequency (fr_s1a) of the series arm resonator s1a, a first anti-resonant frequency (fa1_s1_on) that lies between the first resonant frequency (fr_s1_on) and the second resonant frequency (fr2_s1_on), and a second anti-resonant frequency (fa2_s1_on) that lies between the second resonant frequency (fr2_s1_on) and the anti-resonant frequency (fa_s1a) of the series arm resonator s1a.

In this way, in this Example, the anti-resonant frequency and resonant frequency of the series arm circuit 11 shift in response to switching between the on state and off state of the switch SWb.

The resonant frequency and anti-resonant frequency of the parallel arm circuit 12 do not shift in response to switching between the on state and off state of the switch SWb. The resonant frequency of the parallel arm circuit 12 is equal to the resonant frequency (fr_p1) of the parallel arm resonator p2, and the anti-resonant frequency of the parallel arm circuit 12 is equal to the anti-resonant frequency (fa_p1) of the parallel arm resonator p2.

Generally, a series arm circuit made up of only a series arm resonator has one resonant frequency (frs) and one anti-resonant frequency (fas). Similarly, a parallel arm circuit made up of only a parallel arm resonator has one resonant frequency (frp) and one anti-resonant frequency (fap). For this reason, in a bandpass ladder filter made up of a series arm circuit and a parallel arm circuit, a pass band is provided by bringing the anti-resonant frequency (fap) of the parallel arm circuit and the resonant frequency (frs) of the series arm circuit close to each other, an attenuation pole on the lower side of the pass band is provided by the resonant frequency (frp) of the parallel arm circuit, and an attenuation pole on the higher side of the pass band is provided by the anti-resonant frequency (fas) of the series arm circuit.

Therefore, in this Example, filter characteristics as follows are provided.

First, when the switch SWb is off, the pass band is provided by the resonant frequency (fr_s1_off=fr_s1a) of the series arm circuit 11 and the anti-resonant frequency (fa_p1) of the parallel arm circuit 12, the attenuation pole on the lower side of the pass band is provided by the resonant frequency (fr_p1) of the parallel arm circuit 12, and the attenuation pole on the higher side of the pass band is provided by the anti-resonant frequency (fa_s1_off=fa_s1a−Δfa_s1a) of the series arm circuit 11.

Thus, when the switch SWb is off, the filter characteristics represented by the dashed line (B29 side (SWb Off)) in the top graph of FIG. 1B, that is, the filter characteristics having Band 29Rx (717 MHz to 727 MHz) as a pass band, are provided. At this time, the loss (I. Loss: insertion loss) at the lower edge (717 MHz) of the pass band is 0.288 dB, and the loss at the higher edge (727 MHz) of the pass band is 0.265 dB, so the loss in the pass band is reduced. Band 29 is a receive-only band.

On the other hand, when the switch SWb is on, the pass band is provided by the second resonant frequency (fr2_s1_on, that is, fr_s1a) of the series arm circuit 11 and the anti-resonant frequency (fa_p1) of the parallel arm circuit 12, the attenuation pole on the lower side of the pass band is provided by the resonant frequency (fr_p1) of the parallel arm circuit 12, and the attenuation pole on the higher side of the pass band is provided by the second anti-resonant frequency (fa2_s1_on) of the series arm circuit 11. In addition, a new attenuation pole is provided on the lower side of the pass band by the first anti-resonant frequency (fa1_s1_on) of the series arm circuit 11.

Thus, when the switch SWb is on, the filter characteristics represented by the continuous line (B12 side (SWb On)) in the top graph of FIG. 1B, that is, the filter characteristics having Band 12Rx (729 MHz to 746 MHz) as a pass band and having Band 12Tx (699 MHz to 716 MHz) as a stop band, are provided. At this time, the loss at the lower edge (729 MHz) of the pass band is 0.314 dB, and the loss at the higher edge (746 MHz) of the pass band is 0.237 dB, so the loss in the pass band is reduced. The attenuation (Att.: attenuation) at the lower edge (699 MHz) of the stop band is 17.555 dB, and the attenuation at the higher edge (716 MHz) of the stop band is 4.020 dB, so the attenuation in the stop band is ensured.

In this way, the radio-frequency filter 10 according to this Example is applicable to a variable frequency filter that switches between Band 29Rx and Band 12Rx.

[1-3. Advantageous Effects, and Others]

Hereinafter, advantageous effects that are obtained from this Example will be described by way of comparison with a radio-frequency filter according to Comparative Example of the present embodiment.

[1-3-1. Comparative Example]

Figure 3A:
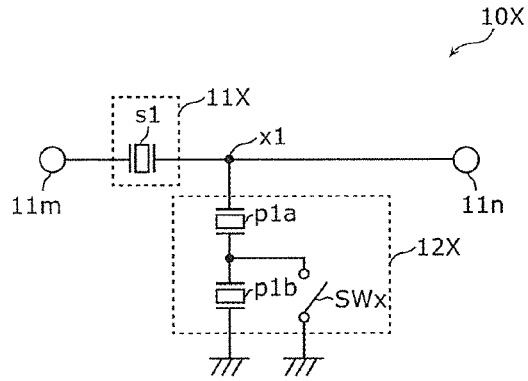
FIG. 3A is a circuit configuration diagram of a radio-frequency filter according to Comparative Example.

FIG. 3A is a circuit configuration diagram of the radio-frequency filter 10X according to Comparative Example.

The radio-frequency filter 10X shown in the diagram includes a series arm circuit 11X made up of a series arm resonator s1 and a parallel arm circuit 12X made up of parallel arm resonators p1a, p1b and a switch SWx. The parallel arm resonator p1a and the parallel arm resonator p1b are connected in series with each other. The parallel arm resonator p1b and the switch SWx are connected in parallel with each other.

The thus configured radio-frequency filter 10X is also able to change the frequency of the attenuation pole on the lower side of the pass band by switching between an on state and off state of the switch SWx. Hereinafter, the filter characteristics (bandpass characteristics) of the radio-frequency filter 10X of Comparative Example will be described while impedance characteristics (resonant characteristics) that determine the filter characteristics are also discussed.

Circuit constants of the radio-frequency filter 10X of Comparative Example are shown in Table 2. The off capacitance (Coff) of the switch SWx is 0.2 pF.

TABLE 2

|  | Series Arm Resonator s1 | Parallel Arm Resonator p1a | Parallel Arm Resonator p1b |
|---|---|---|---|
| Resonant Frequency fr [MHz] | 735 | 697 | 735 |
| Anti-Resonant Frequency fa [MHz] | 794 | 725 | 764 |
| Electrostatic Capacity $C_0$ [pF] | 2.0 | 5.0 | 3.0 |

Figure 3B:
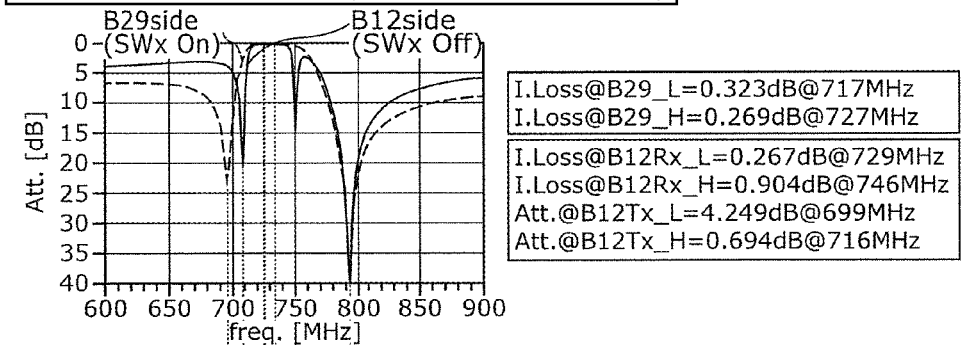
FIG. 3B shows graphs of various characteristics of the radio-frequency filter according to Comparative Example.
Figure 3B:
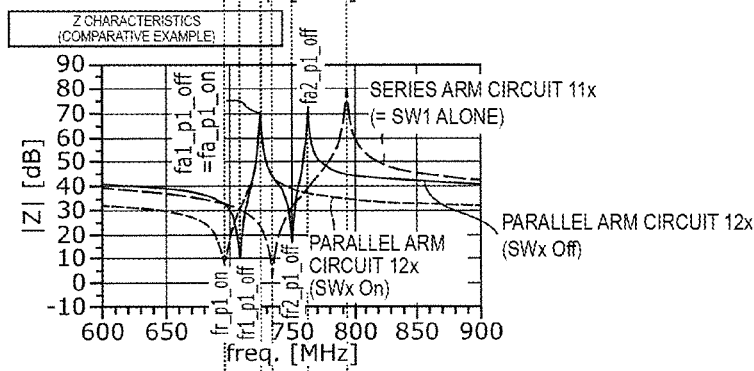
Figure 3B:
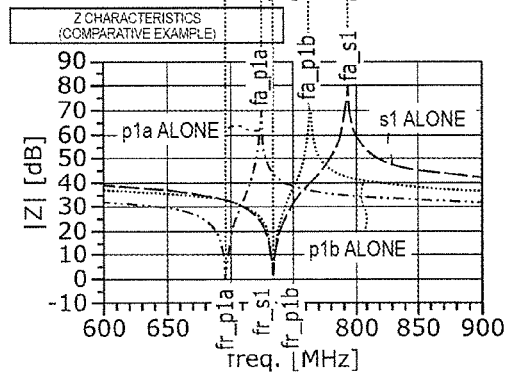

FIG. 3B shows graphs of various characteristics of the radio-frequency filter 10X. Specifically, the top graph shows filter characteristics in two states, that is, the case where the switch SWx is on and the case where the switch SWx is off. The middle graph shows the impedance characteristics of the series arm circuit 11X and parallel arm circuit 12X. The bottom graph shows the impedance characteristics of the series arm resonator s1, the parallel arm resonator p1a, and the parallel arm resonator p1b. For the parallel arm circuit 12X, the impedance characteristics in two states, that is, the case where the switch SWx is on and the case where the switch SWx is off, are shown.

First, characteristics when the switch SWx is on in the circuit configuration shown in FIG. 3A will be described.

In this case, the parallel arm circuit 12X exhibits the same characteristics as the parallel arm resonator p1a since the parallel arm resonator p1b is short-circuited by the switch SWx. That is, the resonant frequency (fr_p1_on) of the parallel arm circuit 12X is equal to the resonant frequency (fr_p1a) of the parallel arm resonator p1a, and the anti-resonant frequency (fa_p1_on) of the parallel arm circuit 12X is equal to the anti-resonant frequency (fa_p1a) of the parallel arm resonator p1a.

Next, characteristics when the switch SWx is off in the circuit configuration shown in FIG. 3A will be described.

In this case, since the parallel arm circuit 12X is a circuit in which the parallel arm resonator p1a and the parallel arm resonator p1b are connected in series with each other, the parallel arm circuit 12X exhibits combined characteristics of the parallel arm resonator p1a and parallel arm resonator p1b.

In this case, actually, since there is the off capacitance of the switch SWx, the parallel arm circuit 12X exhibits characteristics slightly different from the combined characteristics. However, since the off capacitance of the switch SWx is small enough (0.2 pF in this Example) as compared to the electrostatic capacities of the parallel arm resonators p1a, p1b (5.0 pF, 3.0 pF in this Example), the off capacitance almost does not influence the characteristics of the parallel arm circuit 12X. Thus, for the sake of succinctness, the description will be made on the assumption that the switch SWx is an ideal switch having no off capacitance.

Therefore, as shown in the middle graph of FIG. 3B, the parallel arm circuit 12X has two resonant frequencies and two anti-resonant frequencies. Specifically, the parallel arm circuit 12X has a first anti-resonant frequency (fa1_p1_off) equal to the anti-resonant frequency (fa_p1a) of the parallel arm resonator p1a, a second anti-resonant frequency (fa2_p1_off) equal to the anti-resonant frequency (fa_p1b) of the parallel arm resonator p1b, a first resonant frequency (fr1_p1_off) that lies between the resonant frequency (fr_p1a) of the parallel arm resonator p1a and the first anti-resonant frequency (fa1_p1_off), and a second resonant frequency (fr2_p1_off) that lies between the first resonant frequency (fr1_p1_off) and the second anti-resonant frequency (fa2_p1_off).

In this way, in Comparative Example, in response to switching between the on state and off state of the switch SWx, the numbers of the anti-resonant frequencies and resonant frequencies of the parallel arm circuit 12X change, and the resonant frequencies shift.

The resonant frequency and anti-resonant frequency of the series arm circuit 11X do not shift in response to switching between the on state and off state of the switch SWx. The resonant frequency of the series arm circuit 11X is equal to the resonant frequency (fr_s1) of the series arm resonator s1, and the anti-resonant frequency of the series arm circuit 11X is equal to the anti-resonant frequency (fa_s1) of the series arm resonator s1.

Thus, in this Comparative Example, when the switch SWx is on, the filter characteristics represented by the dashed line (B29 side (SWx On)) in the top graph of FIG. 3B, that is, the filter characteristics (B29 side in the graph) having Band 29Rx as a pass band, are provided. At this time, the loss at the lower edge (717 MHz) of the pass band is 0.323 dB, and the loss at the higher edge (727 MHz) of the pass band is 0.269 dB, so the loss in the pass band is reduced.

On the other hand, when the switch SWx is off, the filter characteristics represented by the continuous line (B12 side (SWx Off)) in the top graph of FIG. 3B, that is, the filter characteristics having Band 12Rx as a pass band and having Band 12Tx as a stop band, are provided. At this time, the loss at the lower edge (729 MHz) of the pass band is 0.267 dB, and the loss at the higher edge (746 MHz) of the pass band is 0.904 dB, so the loss at the higher edge of the pass band becomes deteriorated (increased). The attenuation at the lower edge (699 MHz) of the stop band is 4.249 dB, and the attenuation at the higher edge (716 MHz) of the stop band is 0.694 dB, so the attenuation at the higher edge of the stop band is insufficient.

Thus, when the radio-frequency filter 10X according to Comparative Example is applied to a variable frequency filter that switches between Band 29Rx and Band 12Rx, the loss at the higher edge of the pass band deteriorates and the attenuation in the stop band on the lower side of the pass band deteriorates when SWx is off. In this way, in Comparative Example, when the lower side of the pass band is changed toward a higher frequency side, there is inconvenience that the loss at the higher edge of the pass band deteriorates and the attenuation in the stop band on the lower side of the pass band deteriorates.

[1-3-2. Comparison with Comparative Example]

The inventors of the subject application diligently studied and finally found that, in Comparative Example, when the frequency of the attenuation pole on the lower side of the pass band was changed toward a higher frequency side, the above inconvenience would occur because of a new attenuation pole formed near the higher side of the pass band. The inventors conceived of the fact that the loss at the higher edge of the pass band and an attenuation on the lower side of the pass band would be improved when a new attenuation pole was not formed near the higher side of the pass band and was formed in lower frequencies of the pass band in the case where the frequency of the attenuation pole on the lower side of the pass band was changed toward a higher frequency side.

Figure 4A:
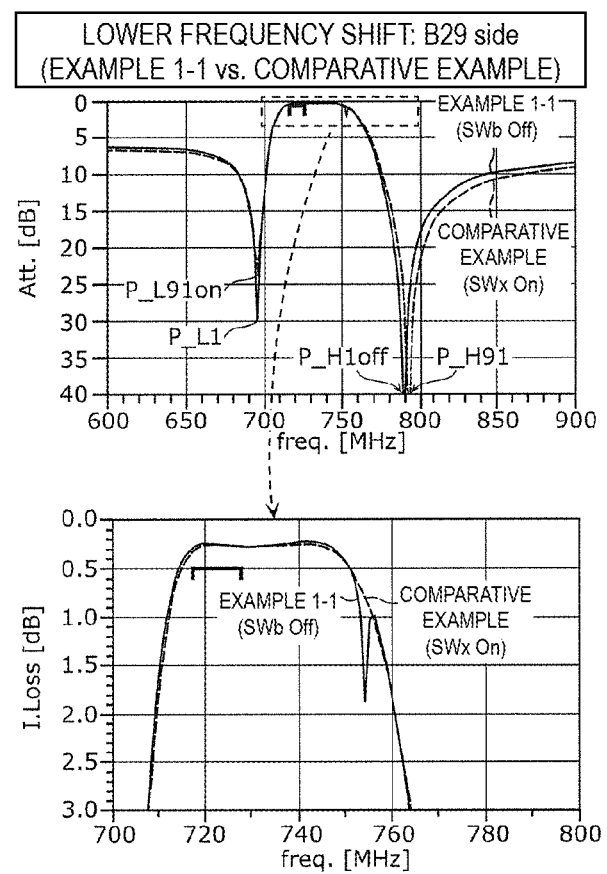
FIG. 4A shows comparison graphs of characteristics of the radio-frequency filters according to Example 1-1 and Comparative Example at the time of lower frequency shift.
Figure 4B:
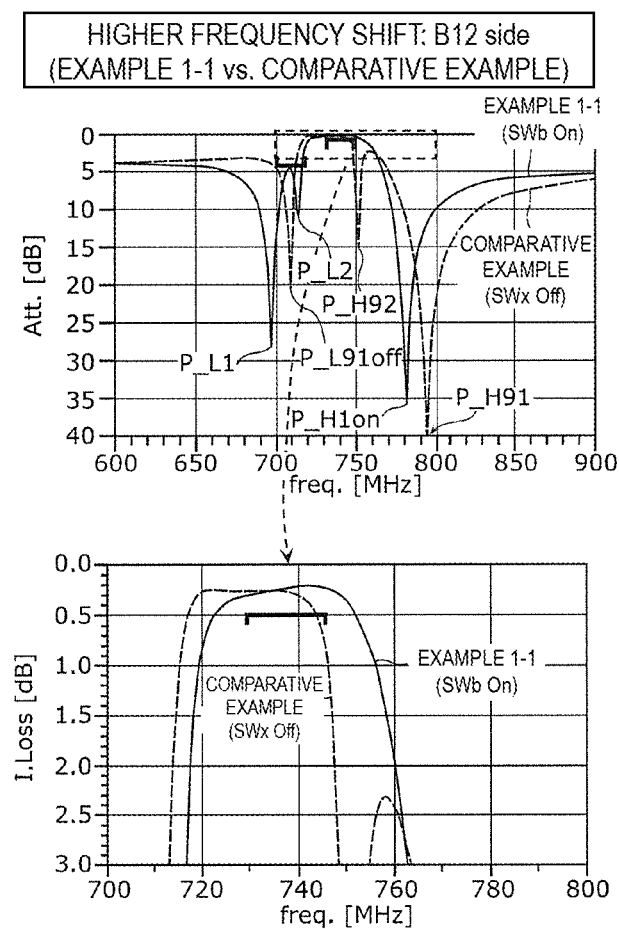
FIG. 4B shows comparison graphs of characteristics of the radio-frequency filters according to Example 1-1 and Comparative Example at the time of higher frequency shift.

FIG. 4A shows comparison graphs of characteristics of the radio-frequency filters according to Example 1-1 and Comparative Example at the time of lower frequency shift (B29 side: when the pass band frequencies and attenuation pole on the lower side of the pass band are changed in frequency toward a lower side). FIG. 4B shows comparison graphs of characteristics of the radio-frequency filters according to Example 1-1 and Comparative Example at the time of higher frequency shift (B12 side: when the pass band frequencies and attenuation pole on the lower side of the pass band are changed in frequency toward a higher frequency).

As is apparent from FIG. 4A, at the time of lower frequency shift, Example 1-1 and Comparative Example exhibit equivalent characteristics in the pass band (Band 29Rx).

As is apparent from FIG. 4A and FIG. 4B, in Comparative Example, when the pass band frequencies and attenuation pole on the lower side of the pass band are changed in frequency toward a higher frequency side by turning the switch SWx from the on state to the off state, in addition to a first attenuation pole P_H91 that is provided by the anti-resonant frequency (fa_s1) of the series arm circuit 11X on the higher side of the pass band, a second attenuation pole P_H92 that is provided by the second resonant frequency (fr2_p1_off) of the parallel arm circuit 12X appears. Since the second attenuation pole P_H92 lies on the lower frequency side than the first attenuation pole P_H91, the loss at the higher edge of the pass band when the switch SWx is on deteriorates. On the other hand, at this time, since only one attenuation pole P_L1 that is provided by the first resonant frequency (fr_p1_off) of the parallel arm circuit 12X appears on the lower side of the pass band, the attenuation is insufficient in the stop band on the lower side of the pass band.

In contrast to this, in this Example, even when the pass band frequencies and attenuation pole on the lower side of the pass band are changed in frequency toward a higher frequency side by turning the switch SWb from the off state to the on state, only one attenuation pole (an attenuation pole P_H1off when the switch SWb is off, and an attenuation pole P_H1on when the switch SWb is on) that is provided by the second anti-resonant frequency (fa2_s1_on) of the series arm circuit 11 appears on the higher side of the pass band. Therefore, in this Example, as compared to Comparative Example, the deterioration of the loss at the higher edge of the pass band when the frequencies on the lower side of the pass band are changed toward a higher frequency side is reduced. On the other hand, at this time, since two attenuation poles, that is, the attenuation pole P_L1 that is provided by the resonant frequency (fr_p1) of the parallel arm circuit 12 and the attenuation pole P_L2 that is provided by the first anti-resonant frequency (fa_s1_on) of the series arm circuit 11, appear on the lower side of the pass band, the attenuation in the stop band on the lower side of the pass band improves.

[1-3-3. Summary]

As described above, according to this Example, the resonant frequency that provides the pass band of the radio-frequency filter 10 and the anti-resonant frequency that provides the attenuation pole of the radio-frequency filter 10 can be changed for the series arm circuit 11 by switching between the on state (conductive state) and off state (non-conductive state) of the switch SWb (first switch). Specifically, when the switch SWb is off, the series arm circuit 11 has the third resonant frequency (fr2_s1_off) equal to the resonant frequency (fr_s1a) of the series arm resonator s1a (first series arm resonator) and the third anti-resonant frequency (fa_s1_off) that lies on a slightly lower frequency side than the anti-resonant frequency (fa_s1a) of the series arm resonator s1a (first series arm resonator). When the switch SWb is on, the series arm circuit 11 has the first resonant frequency (fr2_s1_on) equal to the resonant frequency (fr_s1a) of the series arm resonator s1a, the second resonant frequency (fr1_s1_on) equal to the resonant frequency (fr_s1b) of the series arm resonator s1b (second series arm resonator), the first anti-resonant frequency (fa1_s1_on) that lies between the resonant frequency (fr_s1a) of the series arm resonator s1a and the resonant frequency (fr_s1b) of the series arm resonator s1b, and the second anti-resonant frequency (fa2_s1_on) that lies on the higher frequency side than the second resonant frequency (fr1_s1_on).

In this regard, in this Example, the resonant frequency of the series arm resonator s1b is lower than the resonant frequency of the series arm resonator s1a (fr_s1b<fr_s1a). Thus, when the switch SWb is off, the third resonant frequency (fr2_s1_off) provides the pass band, and the third anti-resonant frequency provides the attenuation pole on the higher side of the pass band. When the switch SWb is on, the second resonant frequency (fr1_s1_on) provides the pass band, the first anti-resonant frequency (fa1_s1_on) provides the attenuation pole on the lower side of the pass band, and the second anti-resonant frequency (fa2_s1_on) provides the attenuation pole on the higher side of the pass band. That is, in this Example, a new attenuation pole is provided on the lower side of the pass band by turning the switch SWb from the off state to the on state.

Thus, when the attenuation pole on the lower side of the pass band, which is provided by the resonant frequency of the parallel arm circuit, is considered, the following can be said on the relationship between switching the on state and off state of the switch SWb and the pass band. Specifically, when the switch SWb is switched from the off state to the on state, a new attenuation pole is provided on the lower side of the pass band, so the stop band on the lower side of the pass band is widened. At this time, since no new attenuation pole is provided on the higher side of the pass band, the deterioration of the loss at the higher edge of the pass band is reduced, and the deterioration of the attenuation on the lower side of the pass band is reduced.

Therefore, according to this Example, the tunable radio-frequency filter 10 that reduces the loss at the higher edge of the pass band and that is able to change the pass band frequencies and the frequency of the attenuation pole on the lower side of the pass band while improving the attenuation on the lower side of the pass band can be implemented.

In this way, in this Example, since the resonant frequency of the series arm resonator s1b is lower than the frequency of the series arm resonator s1a, the number of attenuation poles on the lower side of the pass band can be increased or reduced by switching between the on state and off state of the switch SWb. Thus, the loss at the higher edge of the pass band and the attenuation on the lower side of the pass band are improved.

The resonant frequency of the series arm resonator s1b (second series arm resonator) is not limited to the frequency (702 MHz).

Figure 5:
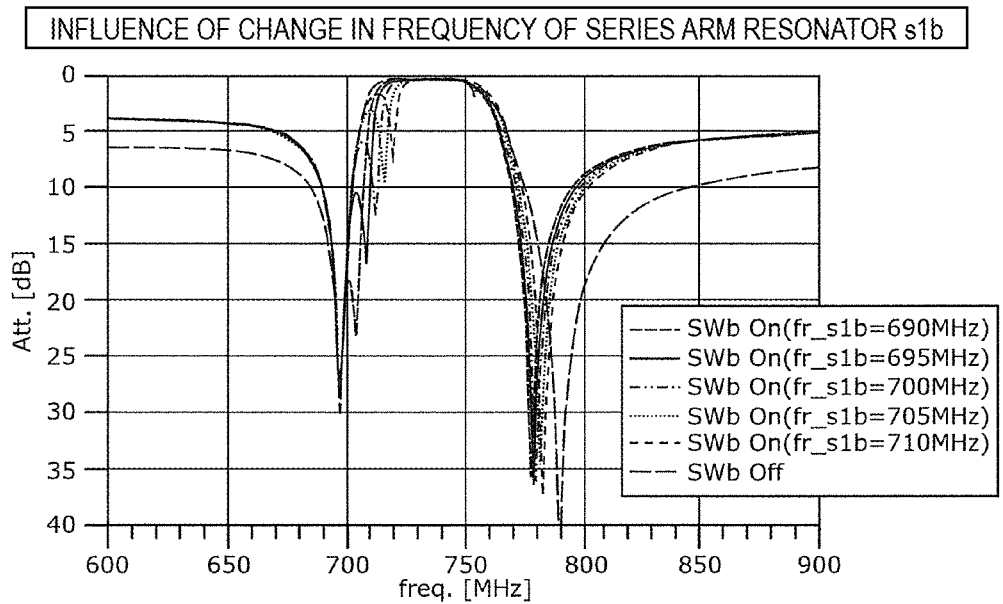
FIG. 5 is a graph that shows the influence on filter characteristics when the resonant frequency (fr_s1$b$) of a series arm resonator is changed in the radio-frequency filter according to Example 1-1.

FIG. 5 is a graph that shows the influence on filter characteristics when the resonant frequency (fr_s1b) of the series arm resonator s1b is changed in the radio-frequency filter 10 according to Example 1-1. Specifically, the graph shows filter characteristics when the resonant frequency (fr_s1b) of the series arm resonator s1b is changed in steps of 5 MHz in the range of 690 MHz to 710 MHz while the switch SWb is on, and filter characteristics when the switch SWb is off. For the series arm resonator s1b shown in the graph, a band width ratio ((fa−fr)/fr) that is a value obtained by dividing the difference (fa−fr) between the anti-resonant frequency (fa) and the resonant frequency (fr) by the resonant frequency (fr) is fixed.

When the resonant frequency (fr_s1b) of the series arm resonator s1b is changed, the first anti-resonant frequency (fa1_s1_on) of the series arm circuit 11 when the switch SWb is on changes. Therefore, as is apparent from the graph, of the two attenuation poles on the lower side of the pass band, the frequency of the attenuation pole adjacent to the pass band, which is the attenuation pole that is provided by the first anti-resonant frequency (fa1_s1_on) of the series arm circuit 11, changes.

Thus, the radio-frequency filter may have a plurality of the second series arm resonators whose resonant frequencies are different from each other. In other words, the radio-frequency filter may include a plurality of the first variable frequency circuits.

Figure 6:
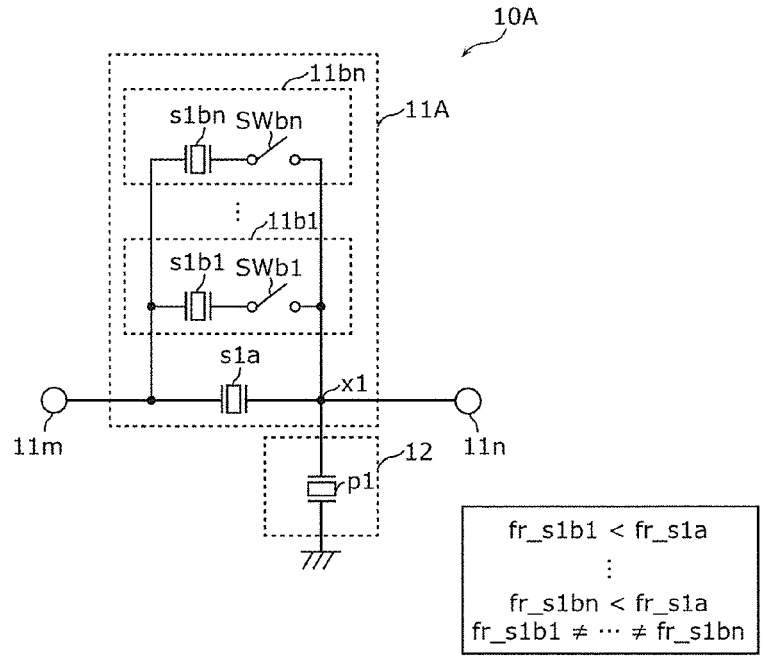
FIG. 6 is a circuit configuration diagram of a radio-frequency filter according to a modification.

FIG. 6 is a circuit configuration diagram of the thus configured radio-frequency filter 10A (radio-frequency filter according to a modification).

The radio-frequency filter 10A shown in the diagram includes a plurality of variable frequency circuits 11b1 to 11bn. Each of the plurality of variable frequency circuits 11b1 to 11bn corresponds to the variable frequency circuit 11b (first variable frequency circuit) of Example 1-1 and includes a corresponding one of series arm resonators s1b1 to s1bn, corresponding to the series arm resonator s1b (second series arm resonator) of Example 1-1, and a corresponding one of switches SWb1 to SWbn, corresponding to the switch SWb (first switch) of Example 1-1.

The resonant frequencies of the second series arm resonators s1b1 to s1bn (second series arm resonators) are different from each other (fr_s1b1≠ . . . ≠fr_s1bn). Specifically, any of the resonant frequencies of the series arm resonators s1b1 to s1bn is lower than the resonant frequency of the series arm resonator s1a (first series arm resonator) (fr_s1b1<fr_s1a, . . . , fr_s1bn<fr_s1a).

The thus configured radio-frequency filter 10A is able to change the first anti-resonant frequency (fr1_s1_on) of the series arm circuit 11 according to the switch selected and set to the on state from among the plurality of switches SWb1 to SWbn. In other words, when the frequencies of the pass band and the stop band on the lower side of the pass band can be changed in minute steps, the variable width of the frequencies of the pass band and the variable width of the frequency of the attenuation pole on the lower side of the pass band can be minutely set. Thus, filter characteristics that give the minimum loss can be selected for each channel of a band (for example, Band 12Rx) to be used.

[1-4. Other Examples]

[1-4-1. Series Connection of Capacitor or Inductor with First Series Arm Resonator]

The series arm circuit according to the present embodiment may further include a first impedance element connected in series with the first series arm resonator. Hereinafter, such a radio-frequency filter will be described by way of Examples (Example 1-2-1 and Example 1-2-2).

Figure 7A:
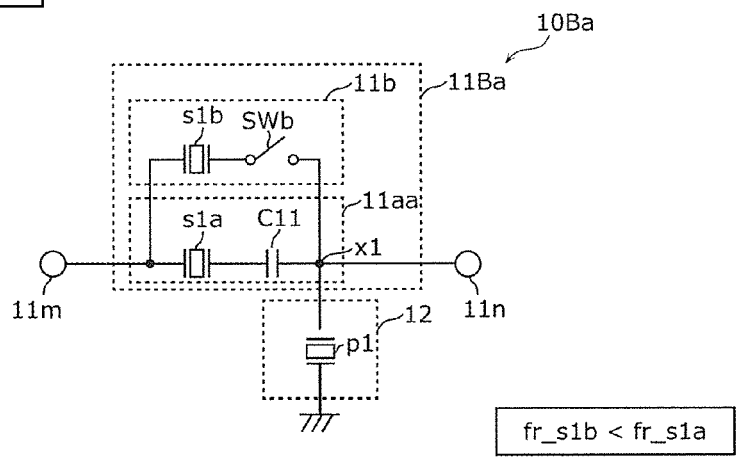
FIG. 7A is a circuit configuration diagram of a radio-frequency filter according to Example (Example 1-2-1) of the first embodiment.

FIG. 7A is a circuit configuration diagram of a radio-frequency filter 10Ba according to Example 1-2-1.

As shown in the diagram, the radio-frequency filter 10Ba according to this Example includes a series arm circuit 11Ba that further includes a capacitor C11 (first impedance element) connected in series with the series arm resonator s1a (first series arm resonator) as compared to Example 1-1. The variable frequency circuit 11b is connected in parallel with a series connection circuit 11aa (first series connection circuit) made up of the series arm resonator s1a and the capacitor C11.

Figure 7B:
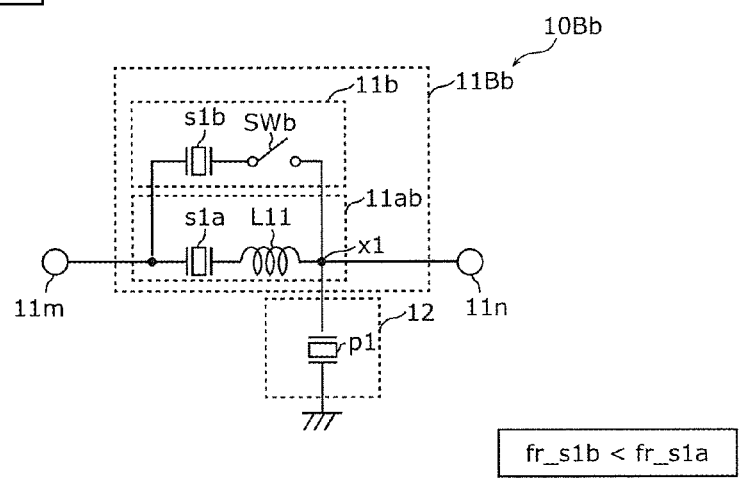
FIG. 7B is a circuit configuration diagram of a radio-frequency filter according to Example (Example 1-2-2) of the first embodiment.

FIG. 7B is a circuit configuration diagram of a radio-frequency filter 10Bb according to Example 1-2-2.

As shown in the diagram, the radio-frequency filter 10Bb according to this Example has such a configuration that the capacitor C11 is replaced by an inductor L11 (first impedance element) in the radio-frequency filter 10Ba according to Example 1-2-1.

Hereinafter, the characteristics of the thus configured radio-frequency filters according to Example 1-2-1 and Example 1-2-2 will be described in comparison with Example 1-1.

Circuit constants of the radio-frequency filter 10Ba of Example 1-2-1 are substantially the same as the circuit constants of Example 1 and differ only in that the resonant frequency (fr) of the series arm resonator s1a (first series arm resonator) is 725 MHz and the anti-resonant frequency (fa) is 783 MHz. The capacitance of the capacitor C11 is 8 pF.

Circuit constants of the radio-frequency filter 10Bb of Example 1-2-2 are substantially the same as the circuit constants of Example 1 and differ only in that the resonant frequency (fr) of the series arm resonator s1a (first series arm resonator) is 745 MHz and the anti-resonant frequency (fa) is 804 MHz. The inductance of the inductor L11 is 2 nH.

Figure 7C:
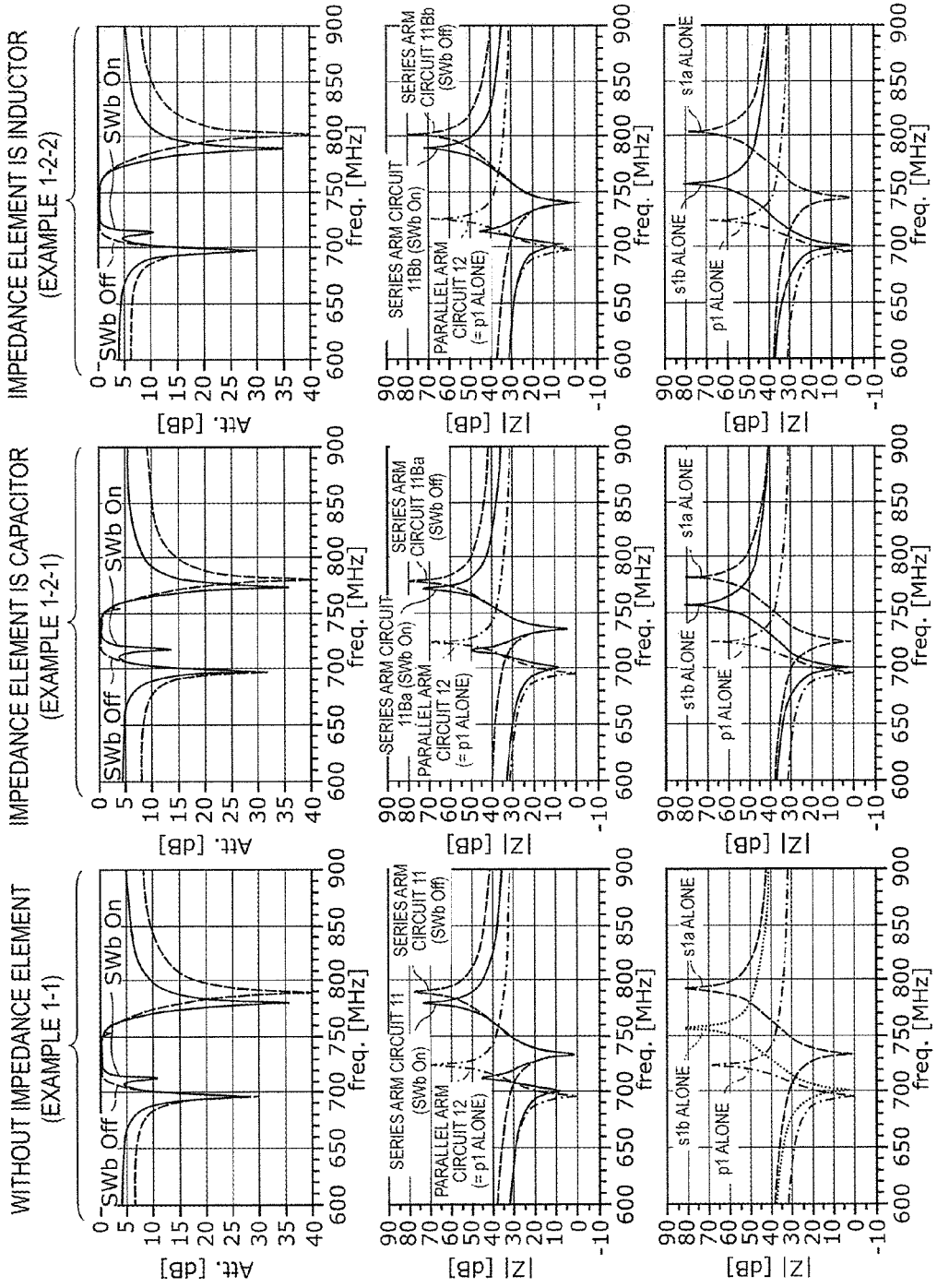
FIG. 7C shows graphs of various characteristics of the radio-frequency filters according to Example 1-2-1 and Example 1-2-2 in comparison with Example 1-1.

FIG. 7C shows graphs of various characteristics of the radio-frequency filters according to Example 1-2-1 and Example 1-2-2 in comparison with Example 1-1. Specifically, the left-column graphs show various characteristics of the radio-frequency filter 10 according to Example 1-1, the middle-column graphs show various characteristics of the radio-frequency filter 10Ba according to Example 1-2-1, and the right-column graphs show various characteristics of the radio-frequency filter 10Bb according to Example 1-2-2. The top graphs show filter characteristics in two states, that is, the case where the switch SWb is on and the case where the switch SWb is off. The middle graphs show the impedance characteristics of the series arm circuits and parallel arm circuit 12. The bottom graphs show the impedance characteristics of the series arm resonator s1a, the series arm resonator s1b, and the parallel arm resonator p1. For the series arm circuits, the impedance characteristics in two states, that is, the case where the switch SWb is on and the case where the switch SWb is off, are shown.

As is apparent from the top graphs, even with the configurations of Example 1-2-1 and Example 1-2-2 in which the impedance element is connected in series with the series arm resonator s1a, the lower side of the pass band can be changed while the loss at the higher edge of the pass band is reduced, as in the case of Example 1-1.

When the capacitor C11 is provided as the impedance element that is connected in series with the series arm resonator s1a like Example 1-2-1, filter characteristics whose pass band is narrowed can be provided as compared to Example 1-1 in which no impedance element is provided. On the other hand, when the inductor L11 is provided as the impedance element connected in series with the series arm resonator s1a like Example 1-2-2, filter characteristics whose pass band is widened can be provided as compared to Example 1-1 in which no impedance element is provided.

This will be described below with reference to FIG. 7D and FIG. 7E.

Figure 7D:
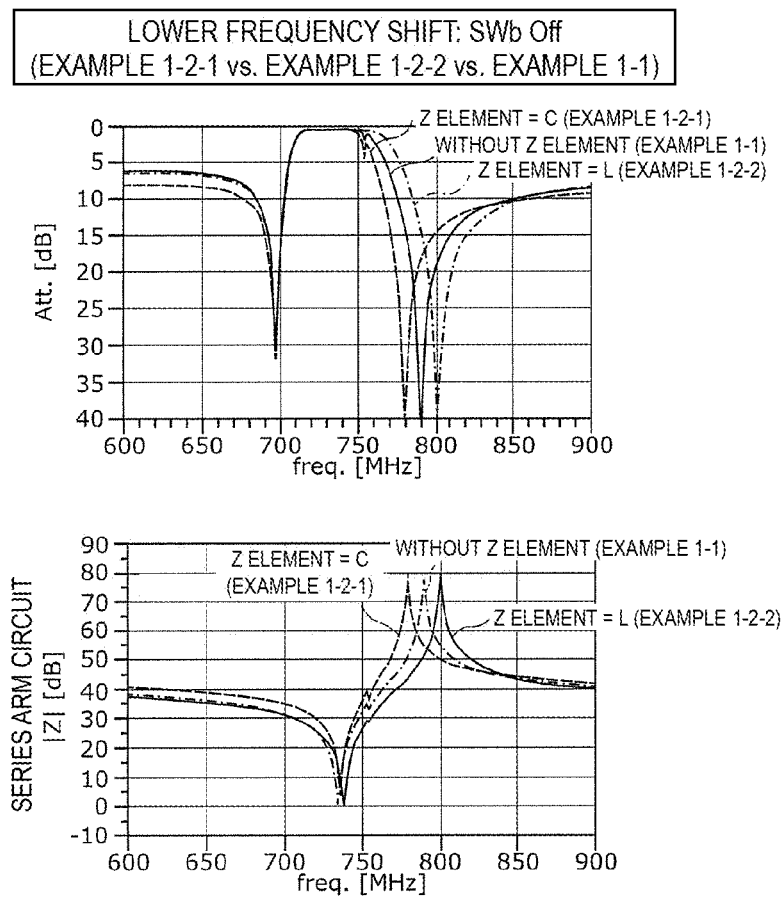
FIG. 7D shows comparison graphs of characteristics of the radio-frequency filters according to Example 1-1, Example 1-2-1, and Example 1-2-2 at the time of lower frequency shift.
Figure 7E:
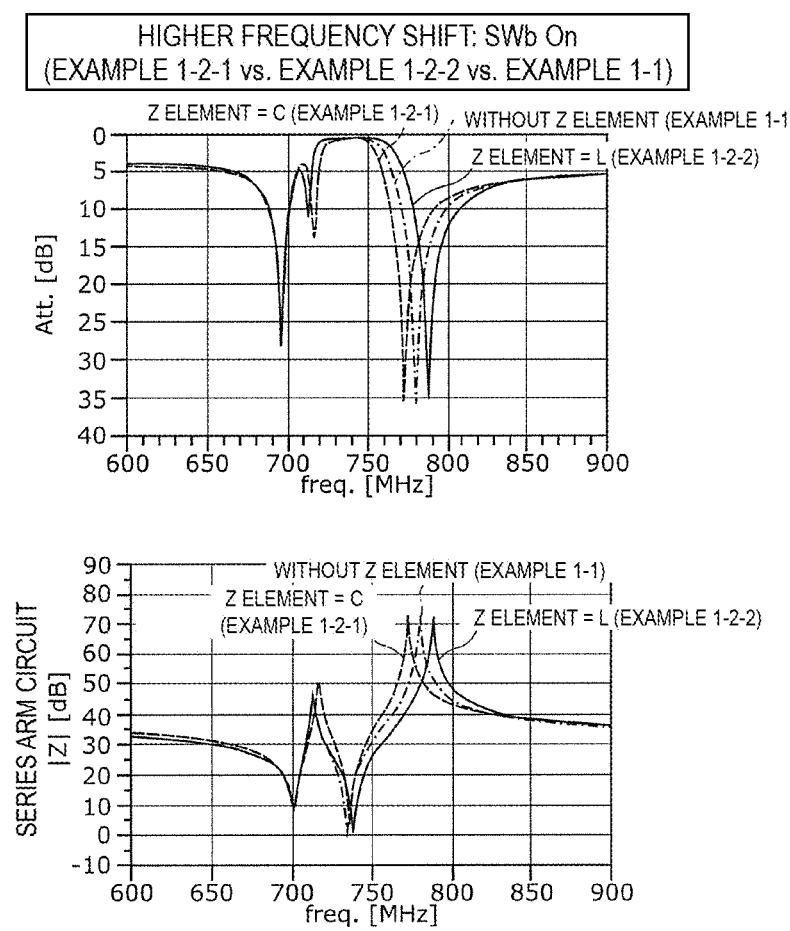
FIG. 7E shows comparison graphs of characteristics of the radio-frequency filters according to Example 1-1, Example 1-2-1, and Example 1-2-2 at the time of higher frequency shift.

FIG. 7D shows comparison graphs of characteristics of the radio-frequency filters according to Example 1-1, Example 1-2-1, and Example 1-2-2 at the time of lower frequency shift (when the switch SWb is off). FIG. 7E shows comparison graphs of characteristics of the radio-frequency filters according to Example 1-1, Example 1-2-1, and Example 1-2-2 at the time of higher frequency shift (when the switch SWb is on). Specifically, in FIG. 7D, the top graph shows filter characteristics, and the bottom graph shows the impedances of the series arm circuits when the switch SWb is off. In FIG. 7E, the top graph shows filter characteristics, and the bottom graph shows the impedances of the series arm circuits when the switch SWb is on.

First, characteristics when the switch SWb is off, shown in FIG. 7D, will be described.

In this case, since the series arm resonator s1a and the capacitor C11 are connected in series with each other, the series arm circuit 11Ba of Example 1-2-1 can reduce the difference between the resonant frequency and the anti-resonant frequency as compared to the series arm circuit 11 of Example 1-1. Thus, when the resonant frequency of the series arm circuit 11Ba is adjusted to the pass band of the radio-frequency filter 10Ba, the anti-resonant frequency of the series arm circuit 11Ba lies on the lower frequency side than the anti-resonant frequency of the series arm circuit 11. Therefore, according to Example 1-2-1, since the attenuation pole on the higher side of the pass band lies on the lower frequency side as compared to Example 1-1, the pass band is narrowed.

In this case, since the series arm resonator s1a and the inductor L11 are connected in series with each other, the series arm circuit 11Bb of Example 1-2-2 can increase the difference between the resonant frequency and the anti-resonant frequency as compared to the series arm circuit 11 of Example 1-1. Thus, when the resonant frequency of the series arm circuit 11Bb is adjusted to the pass band of the radio-frequency filter 10Bb, the anti-resonant frequency of the series arm circuit 11Bb lies on the higher frequency side than the anti-resonant frequency of the series arm circuit 11. Therefore, according to Example 1-2-2, since the attenuation pole on the higher side of the pass band lies on the higher frequency side as compared to Example 1-1, the pass band is widened.

Next, characteristics when the switch SWb is on, shown in FIG. 7E, will be described.

In this case, in the series arm circuit 11Ba of Example 1-2-1, as compared to the series arm circuit 11 of Example 1-1, the first resonant frequency (lower frequency-side resonant frequency), the second resonant frequency (higher frequency-side resonant frequency), and the first anti-resonant frequency (lower frequency-side anti-resonant frequency) are substantially the same frequency, and the second anti-resonant frequency (higher frequency-side anti-resonant frequency) lies on the lower frequency side. Therefore, according to Example 1-2-1, since the attenuation pole on the higher side of the pass band lies on the lower frequency side as compared to Example 1-1, the pass band is narrowed.

In this case, in the series arm circuit 11Bb of Example 1-2-2, as compared to the series arm circuit 11 of Example 1-1, the first resonant frequency (lower frequency-side resonant frequency), the second resonant frequency (higher frequency-side resonant frequency), and the first anti-resonant frequency (lower frequency-side anti-resonant frequency) are substantially the same frequency, and the second anti-resonant frequency (higher frequency-side anti-resonant frequency) lies on the higher frequency side. Therefore, according to Example 1-2-2, since the attenuation pole on the higher side of the pass band lies on the higher frequency side as compared to Example 1-1, the pass band is widened.

As described above, since the series arm resonator s1a (first series arm resonator) and the first impedance element (the capacitor C11 in Example 1-2-1, and the inductor L11 in Example 1-2-2) are connected in series with each other, the difference between the resonant frequency and anti-resonant frequency of the first series connection circuit (the series connection circuit 11aa in Example 1-2-1, and the series connection circuit 11ab in Example 1-2-2) can be changed from the frequency difference of the series arm resonator s1a. Specifically, the frequency difference is reduced when the first impedance element is a capacitor (in the case of Example 1-2-1), and the frequency difference is increased when the first impedance element is an inductor (in the case of Example 1-2-2). Thus, since the difference between the second resonant frequency and second anti-resonant frequency of the series arm circuit can be adjusted by adjusting the circuit constant of the first impedance element as needed, the difference between the cut-off frequency on the higher side of the pass band, determined by the frequency difference, and the attenuation pole on the higher side of the pass band can be adjusted. Therefore, the pass band width and the steepness of an attenuation slope can be selectively set.

The variable width of narrowing or widening the pass band depends on the constant of the first impedance element. For example, when the first impedance element is a capacitor, the variable width narrows as the constant of the capacitor reduces. When the first impedance element is an inductor, the variable width widens as the constant of the inductor increases. For this reason, the constant of the first impedance element can be determined as needed depending on the frequency specifications that are required from the radio-frequency filter. The capacitor may be a variable capacitor, such as a varicap diode and a DTC (digitally tunable capacitor). The inductor may be a variable inductor that uses MEMS (micro electro mechanical systems).

[1-4-2. Connecting Variable Frequency Circuit Including Series Arm Resonator Whose Resonant Frequency is High]

Up to here, the description is made on the assumption that the variable frequency circuit (first variable frequency circuit) of the series arm circuit includes the second series arm resonator whose resonant frequency is lower than the resonant frequency of the first series arm resonator (the series arm resonator s1 of the above-described Examples). However, the resonant frequency of the second series arm resonator just needs to be different from the resonant frequency of the first series arm resonator and may be higher than the resonant frequency of the first series arm resonator.

Hereinafter, such a radio-frequency filter will be described by way of Example (Example 1-3).

Figure 8A:
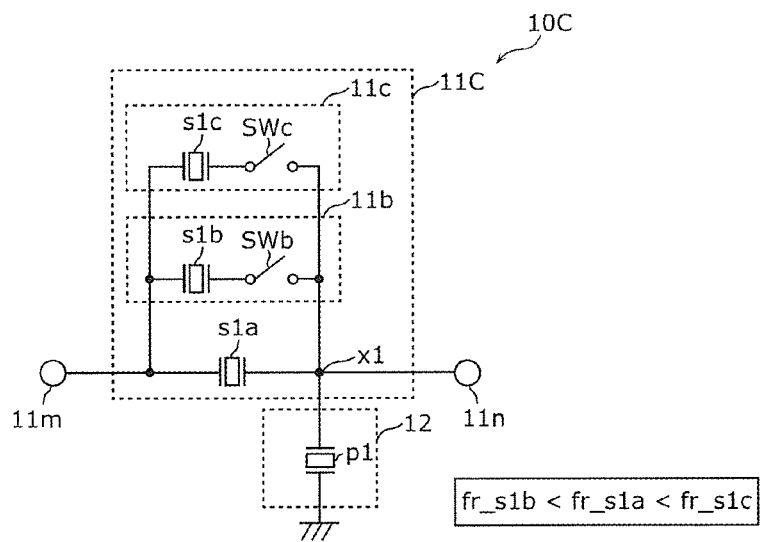
FIG. 8A is a circuit configuration diagram of a radio-frequency filter according to Example (Example 1-3) of the first embodiment.

FIG. 8A is a circuit configuration diagram of a radio-frequency filter 10C according to Example 1-3.

The radio-frequency filter 10C shown in the diagram differs from the radio-frequency filter 10 according to Example 1-1 in that a series arm circuit 11C further includes a variable frequency circuit 11c (first variable frequency circuit). The variable frequency circuit 11c is made up of a series arm resonator s1c (second series arm resonator) and a switch SWc (first switch) connected in series with the series arm resonator s1c.

The resonant frequency (fr_s1c) of the series arm resonator sic is higher than the resonant frequency (fr_s1a) of the series arm resonator s1a.

In other words, in this Example, the series arm circuit 11C includes a plurality of the first variable frequency circuits (two variable frequency circuits 11b, 11c). The resonant frequency of at least one (here, the series arm resonator s1b) of the plurality of second series arm resonators (two second series arm resonators s1b, s1c) is lower than the resonant frequency of the series arm resonator s1a (first series arm resonator) (fr_s1b<fr_s1a). Of the plurality of second series arm resonators, the resonant frequency of at least another one (here, the series arm resonator s1c) is higher than the resonant frequency of the series arm resonator s1a (fr_s1a<fr_s1c). The number of the first variable frequency circuits is not limited to two and may be three or more.

The thus configured radio-frequency filter 10C is, for example, able to individually switch between an on state and off state of each of the switch SWb and the switch SWc.

Hereinafter, the characteristics of the radio-frequency filter 10C according to Example 1-3 will be described.

Circuit constants of the radio-frequency filter 10C of Example 1-3 are shown in Table 3. The off capacitance (Coff) of each of the switches SWb, SWc is 0.2 pF.

TABLE 3

|  | Series Arm Resonator s1a | Series Arm Resonator s1b | Series Arm Resonator s1c | Parallel Arm Resonator p1 |
| --- | --- | --- | --- | --- |
| Resonant Frequency fr [MHz] | 735 | 702 | 1050 | 697 |
| Anti-Resonant Frequency fa [MHz] | 794 | 758 | 1134 | 725 |
| Electrostatic Capacity $C_0$ [pF] | 2.0 | 2.0 | 2.0 | 2.0 |

Figure 8B:
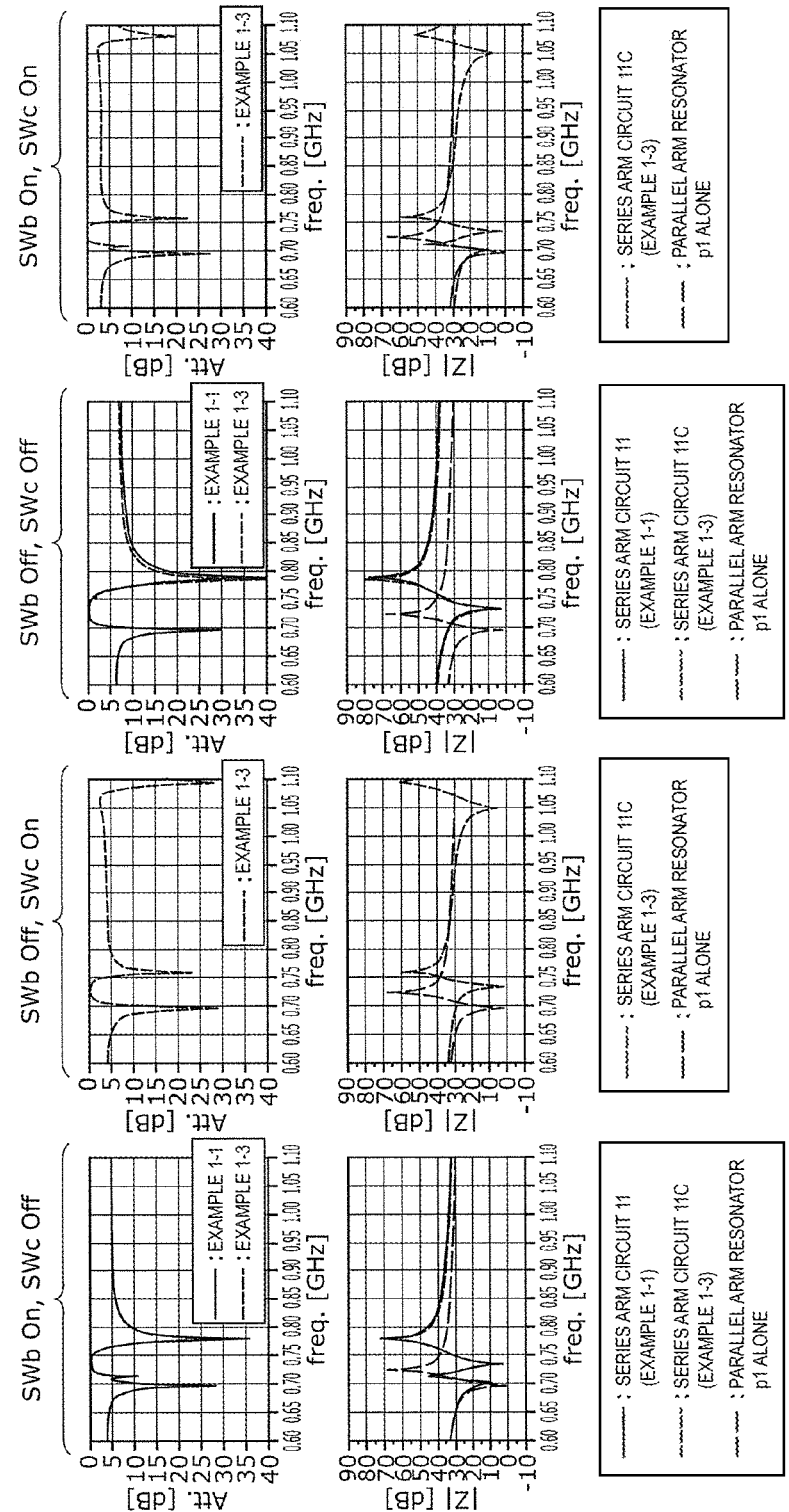
FIG. 8B shows graphs of various characteristics of the radio-frequency filter according to Example 1-3 in comparison with Example 1-1.

FIG. 8B shows graphs of various characteristics of the radio-frequency filter 10C according to Example 1-3 in comparison with Example 1-1.

Specifically, the graphs show, in order from the left column to the right column, (i) various characteristics of Example 1-3 and Example 1-1 when the switch SWb is on and the switch SWc is off, (ii) various characteristics of Example 1-3 when the switch SWb is off and the switch SWc is on, (iii) various characteristics of Example 1-3 and Example 1-1 when the switch SWb is off and the switch SWc is off, and (iv) various characteristics of Example 1-3 when the switch SWb is on and the switch SWc is on. The top graphs show the filter characteristics, and the bottom graphs show the impedance characteristics of the series arm circuits and parallel arm resonator (that is, the parallel arm circuit).

Various characteristics of Example 1-1 when the switch SWb is on (or off) and the switch SWc is off are various characteristics of Example 1-1 when the switch SWb is on (or off).

As is apparent from the graphs, according to Example 1-3, the resonant frequency and anti-resonant frequency of the series arm circuit 11C can be changed not only by switching between the on state and off state of the switch SWb, but also by switching between the on state and off state of the switch SWc.

Specifically, as a result of turning the switch SWc from the off state to the on state, the series arm circuit 11C further has a resonant frequency having the same frequency as the resonant frequency (fr_s1c) of the series arm resonator s1c and has an anti-resonant frequency on the higher frequency side than the resonant frequency. Thus, in the series arm circuit 11C, the anti-resonant frequency closest on the lower frequency side than the resonant frequency (fr_s1c) of the series arm resonator s1c is shifted toward a lower frequency side. The anti-resonant frequency provides an attenuation pole on the higher side of the pass band. Therefore, as a result of turning the switch SWc from the off state to the on state, the attenuation pole on the higher side of the pass band is shifted toward a lower frequency side.

Figure 8C:
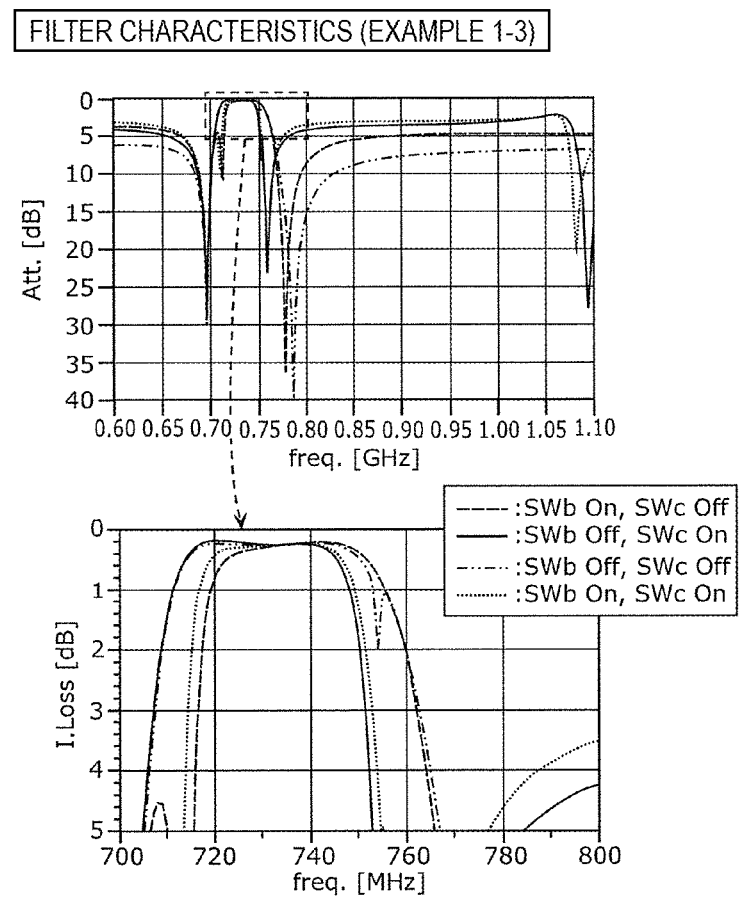
FIG. 8C shows graphs of changes in filter characteristics when switches of the radio-frequency filter according to Example 1-3 are individually switched between an on state and an off state.

FIG. 8C shows graphs of changes in filter characteristics when the switches SWb, SWc of the radio-frequency filter 10C according to Example 1-3 are individually switched between an on state and an off state.

As shown in the graphs, the radio-frequency filter 10C is able to change the frequencies of the pass band and the frequency of the attenuation pole on the lower side of the pass band while reducing the loss at the higher edge of the pass band by switching between the on state and off state of the switch SWb. The radio-frequency filter 10C is able to change the frequencies of the pass band and the frequency of the attenuation pole on the higher side of the pass band while reducing the loss at the lower edge of the pass band by switching between the on state and off state of the switch SWc.

Therefore, the radio-frequency filter 10C is able to change the stop band while reducing the loss at the edges of the pass band for both the lower side and higher side of the pass band by individually switching between the on state and off state of each of the switches SWb, SWc.

[1-5. Resonance Analysis]

The resonant characteristics of the radio-frequency filter according to the embodiment will be described by way of an equivalent circuit.

[1-5-1. Resonator Alone]

First, the resonant characteristics of a resonator alone will be described.

Figure 9A:
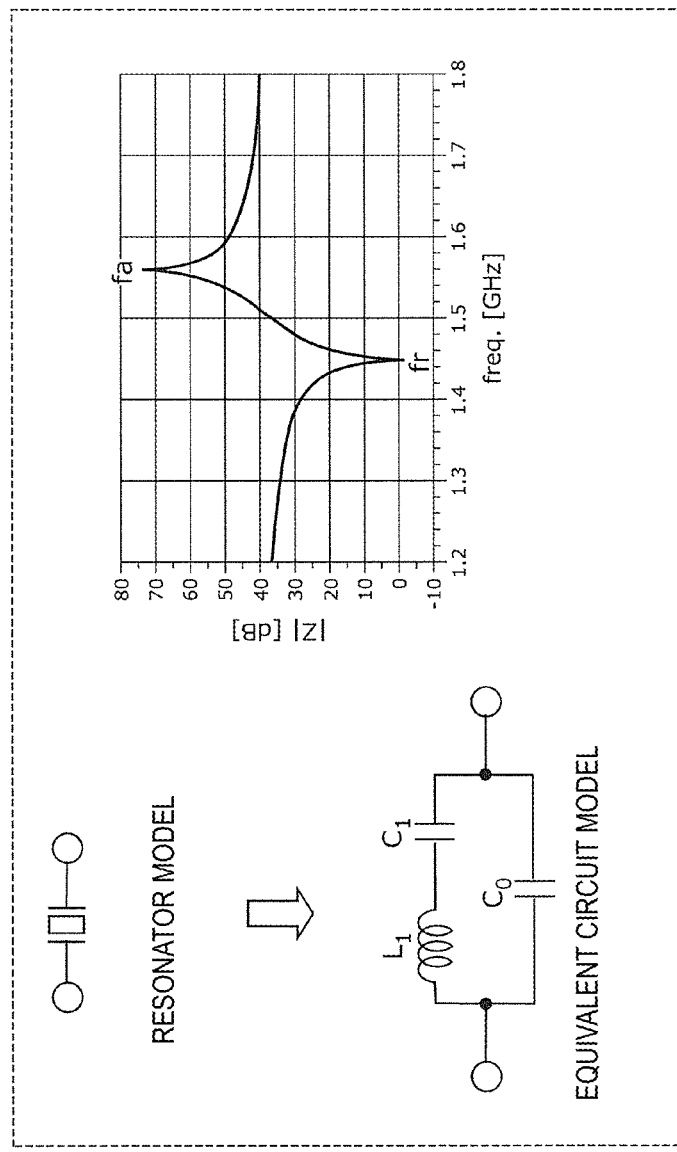
FIG. 9A shows an equivalent circuit model of a resonator and its resonant characteristics.

FIG. 9A shows an equivalent circuit model of one resonator and its resonant characteristics. As shown in the diagram, the resonator is represented by a parallel circuit (parallel connection circuit) of a capacitor $C_0$ and a series circuit (series connection circuit) of a capacitor $C_1$ and an inductor $L_1$. The capacitor $C_0$ is the electrostatic capacity of the resonator.

In the equivalent circuit, the resonant frequency fr of the resonator is determined by the series circuit of the capacitor $C_1$ and the inductor $L_1$ and is a frequency at which the impedance of the equivalent circuit is zero, so the resonant frequency fr is expressed by the mathematical expression 3 when the mathematical expression 2 is solved.

[Mathematical 2]

$$Z = 0 = j\omega L_1 + \frac{1}{j\omega C_1} \quad (2)$$

[Mathematical 3]

$$f_r = \frac{1}{2\pi\sqrt{L_1 C_1}} \quad (3)$$

The anti-resonant frequency fa of the resonator is a frequency at which the admittance Y of the equivalent circuit is zero, so the anti-resonant frequency fa is expressed by the mathematical expression 5 when the mathematical expression 4 is solved.

[Mathematical 4]

$$Y = \frac{1}{Z} = 0 = \frac{1}{\frac{1}{j\omega C_0}} + \frac{1}{j\omega L_1 + \frac{1}{j\omega C_1}} \quad (4)$$

[Mathematical 5]

$$f_r = \frac{\sqrt{1 + \frac{C_1}{C_0}}}{2\pi\sqrt{L_1 C_1}} = f_r \sqrt{1 + \frac{C_1}{C_0}} \quad (5)$$

Through the mathematical expression 3 and the mathematical expression 5, as shown in the right-side graph of FIG. 9A, the anti-resonant frequency fa appears on a higher frequency side than the resonant frequency fr.

In other words, the resonator has one resonant frequency and one anti-resonant frequency that lies on the higher frequency side than the resonant frequency.

[1-5-2. Connecting Impedance Element in Series with Resonator]

Next, the resonant characteristics when an impedance element is connected in series with the resonator will be described by way of an equivalent circuit model.

Figure 9B:
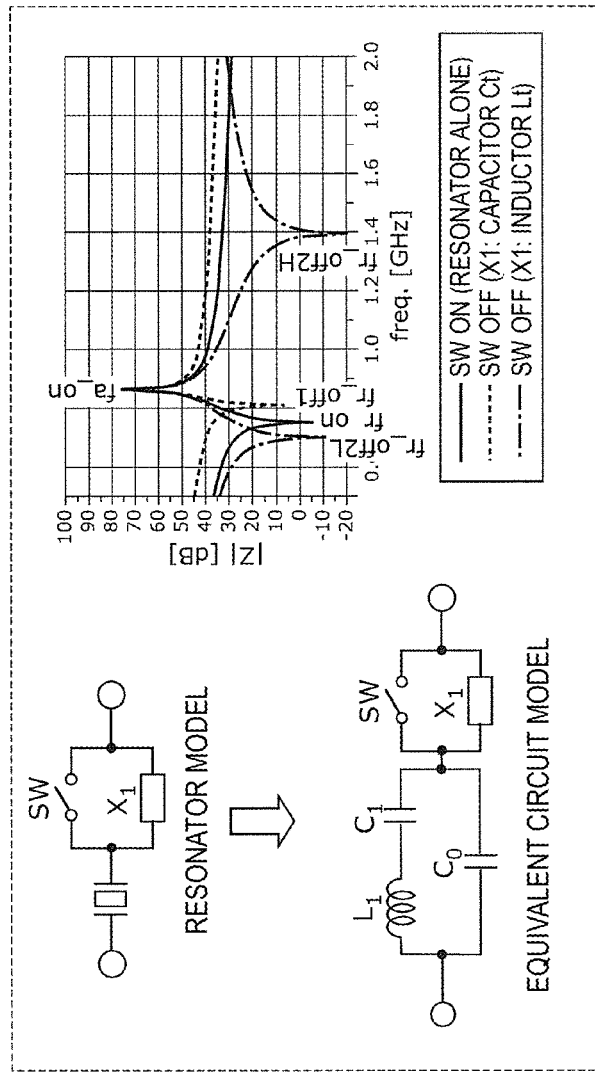
FIG. 9B shows an equivalent circuit model when an impedance element is connected in series with a resonator and its resonant characteristics.

FIG. 9B shows an equivalent circuit model when an impedance element $X_1$ is connected in series with a resonator and its resonant characteristics. As shown in the diagram, the resonator is represented by a parallel circuit of the capacitor $C_0$ and the series circuit of the capacitor $C_1$ and the inductor $L_1$. The capacitor C0 is the electrostatic capacity of the resonator. A parallel circuit of the impedance element $X_1$ and the switch SW is connected to the resonator. In the equivalent circuit model in resonance analysis, the switch SW is treated as an ideal switch that has no capacitive component (that is, the impedance is infinite) in the off state and that has zero resistive component (that is, the impedance is zero) in the on state.

First, the resonant characteristics of the equivalent circuit when the switch SW is on will be described. When the switch SW is on, the impedance element $X_1$ is short-circuited, so the resonant frequency fr_on and the anti-resonant frequency fa_on are respectively the same as the resonant frequency fr and the anti-resonant frequency fa in FIG. 9A and are expressed by the mathematical expression 6 and the mathematical expression 7.

[Mathematical 6]

$$f_r\_on = \frac{1}{2\pi\sqrt{L_1 C_1}} \quad (6)$$

[Mathematical 7]

$$f_a\_on = \frac{\sqrt{1 + \frac{C_1}{C_0}}}{2\pi\sqrt{L_1 C_1}} = f_r\_on \sqrt{1 + \frac{C_1}{C_0}} \quad (7)$$

Next, the case where the switch SW is off will be described separately (1) when the impedance element $X_1$ is a capacitor or (2) when the impedance element $X_1$ is an inductor.

(1) When Impedance Element $X_1$ is Capacitor Ct A resonant frequency fr_off1 when the switch SW is off is a frequency at which the impedance Z of the equivalent circuit is zero, so the resonant frequency fr_off1 is expressed by the mathematical expression 9 when the mathematical expression 8 is solved.

[Mathematical 8]

$$Z = 0 = \frac{1}{\frac{1}{j\omega C_0} + \frac{1}{j\omega L_1 + \frac{1}{j\omega C_1}}} + \frac{1}{j\omega C_t} \quad (8)$$

[Mathematical 9]

$$f_r\_off1 = \frac{\sqrt{\frac{C_0 + C_1 + C_t}{L_1 C_1 C_t + L_1 C_0 C_t}}}{2\pi} \quad (9)$$

On the other hand, an anti-resonant frequency fa_off1 when the switch SW is off is the same as the anti-resonant frequency fa_on when the switch SW is on and is expressed by the mathematical expression 10.

[Mathematical 10]

$$f_a\_off1 = \frac{\sqrt{1 + \frac{C_1}{C_0}}}{2\pi\sqrt{L_1 C_1}} \quad (10)$$

Through the mathematical expression 6, the mathematical expression 7, the mathematical expression 9, and the mathematical expression 10, when the impedance element $X_1$ is a capacitor, the anti-resonant frequencies fa_on, fa_off1 coincide with each other regardless of switching between the on state and off state of the switch SW, as shown in the right-side graph of FIG. 9B. On the other hand, the resonant frequency appears to shift toward a higher frequency side when the switch SW is off (fr_off1) as compared to when the switch SW is on (fr_on).

(2) When Impedance Element $X_1$ Is Inductor Lt A resonant frequency fr_off2 when the switch SW is off is a frequency at which the impedance of the equivalent circuit is zero, so the resonant frequency fr_off2 is expressed by the mathematical expression 12 when the mathematical expression 11 is solved.

[Mathematical 11]

$$Z = 0 = \cfrac{1}{\cfrac{1}{\cfrac{1}{j\omega C_0} + \cfrac{1}{j\omega L_1 + \cfrac{1}{j\omega C_1}}}} + \cfrac{1}{j\omega C_t} \quad (11)$$

[Mathematical 12]

$$f_{r\_\text{off}2L} = \frac{\sqrt{\cfrac{-b - \sqrt{b^2 - 4ac}}{2a}}}{2\pi} \quad (12)$$

$$f_{r\_\text{off}2H} = \frac{\sqrt{\cfrac{-b + \sqrt{b^2 - 4ac}}{2a}}}{2\pi}$$

$$a = L_1 L_t C_0 C_1$$
$$b = -L_1 C_1 - L_t C_0 - L_t C_1$$
$$c = 1$$

In the mathematical expression 12, fr_off2L is a lower frequency-side resonant frequency when the switch SW is off, and fr_off2H is a higher frequency-side resonant frequency when the switch SW is off.

On the other hand, an anti-resonant frequency fa_off2 when the switch SW is off is the same as the anti-resonant frequency fa_on when the switch SW is on and is expressed by the mathematical expression 13.

[Mathematical 13]

$$f_{a\_\text{off}2} = \frac{\sqrt{1 + \cfrac{C_1}{C_0}}}{2\pi\sqrt{L_1 C_1}} \quad (13)$$

Through the mathematical expression 6, the mathematical expression 7, the mathematical expression 12, and the mathematical expression 13, when the impedance element $X_1$ is an inductor, the anti-resonant frequencies fa_on, fa_off2 coincide with each other regardless of switching between the on state and off state of the switch SW, as shown in the right-side graph of FIG. 9B. On the other hand, the resonant frequency appears to shift toward a lower frequency side when the switch SW is off (fr_off2L) as compared to when the switch SW is on (fr_on).

[1-5-3. Two Resonators are Connected in Parallel with Each Other]

Next, the characteristics when two resonators are connected in parallel with each other will be described by way of an equivalent circuit model.

Figure 9C:
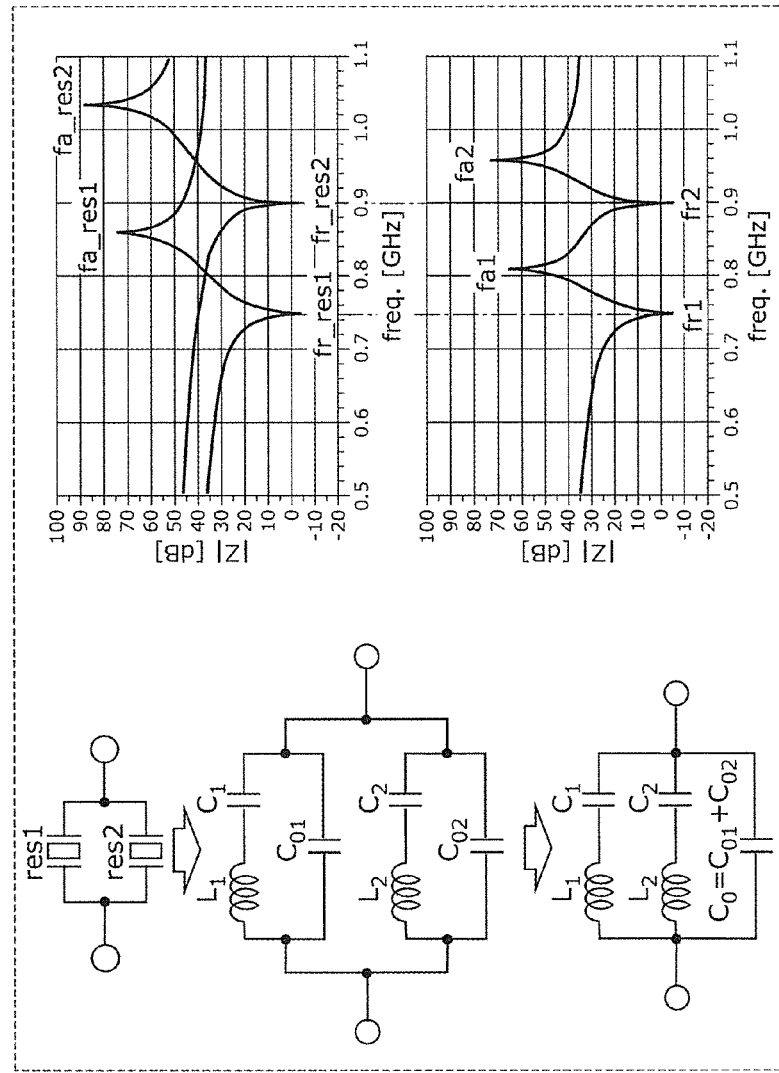
FIG. 9C shows an equivalent circuit model of two resonators connected in parallel with each other and its resonant characteristics.

FIG. 9C shows an equivalent circuit model of two resonators connected in parallel with each other and its resonant characteristics. The drawing shows a model in which resonators res1, res2 are connected in parallel with each other. The resonator res1 is represented by a parallel circuit of a capacitor $C_{01}$ and a series circuit of the capacitor $C_1$ and the inductor $L_1$. The resonator res2 is represented by a parallel circuit of a capacitor $C_{02}$ and a series circuit of a capacitor $C_2$ and an inductor $L_2$. The capacitors $C_{01}$, $C_{02}$ are respectively the electrostatic capacities of the resonators res1, res2. A resonant circuit made up of these two resonators res1, res2 is represented by an equivalent circuit shown at the lower left side of FIG. 9C. In other words, the resonant circuit is represented by the series circuit of the capacitor $C_1$ and the inductor $L_1$, the series circuit of the capacitor $C_2$ and the inductor $L_2$, and the parallel circuit of the capacitor $C_0$ (=$C_{01}$+$C_{02}$).

In the equivalent circuit, the resonant frequency fr of the resonator is determined by the series circuit of the capacitor $C_1$ and the inductor $L_1$ and is expressed by the mathematical expression 2.

In the equivalent circuit, two resonant frequencies are determined. The resonant frequency fr1 is determined by the series circuit of the capacitor $C_1$ and the inductor $L_1$. The resonant frequency fr2 is determined by the series circuit of the capacitor $C_2$ and the inductor $L_2$. The resonant frequencies fr1, fr2 are expressed by the mathematical expression 14.

[Mathematical 14]

$$f_r 1 = \frac{1}{2\pi\sqrt{L_1 C_1}} \quad (14)$$

$$f_r 2 = \frac{1}{2\pi\sqrt{L_2 C_2}}$$

In other words, the two resonant frequencies fr1, fr2 that are represented by the equivalent circuit are respectively substantially equal to the resonant frequency fr_res1 of the resonator res1 and the resonant frequency fr_res2 of the resonator res2.

The anti-resonant frequency of the equivalent circuit is a frequency at which the admittance Y of the equivalent circuit is zero, so it is found that the equivalent circuit has two anti-resonant frequencies (fa1, fa2) as expressed by the mathematical expression 16 when the mathematical expression 15 is solved.

[Mathematical 15]

$$Y = \frac{1}{Z} = 0 = j\omega C_0 + \cfrac{1}{j\omega L_1 + \cfrac{1}{j\omega C_1}} + \cfrac{1}{j\omega L_2 + \cfrac{1}{j\omega C_2}} \quad (15)$$

[Mathematical 16]

$$f_a 1 = \frac{\sqrt{\cfrac{-b - \sqrt{b^2 - 4ac}}{2a}}}{2\pi} \quad (16)$$

$$f_a 2 = \frac{\sqrt{\cfrac{-b + \sqrt{b^2 - 4ac}}{2a}}}{2\pi}$$

$$a = L_1 L_2 C_0 C_1 C_2$$
$$b = -L_1 C_0 C_1 - L_2 C_0 C_2 - L_1 C_1 C_2 - L_2 C_1 C_2$$
$$c = C_0 + C_1 + C_2$$

It is found that the anti-resonant frequencies fa1, fa2 that are obtained from the mathematical expression 16 are different from the anti-resonant frequencies (indicated as fa_res1, fa_res2 in the graph of FIG. 9C) of the resonators alone, which are obtained from the mathematical expression 4. The anti-resonant frequency fa1 that is derived from the mathematical expression 15 is lower than the anti-resonant frequency fa_res1 of the resonator res1 alone and is lower than the anti-resonant frequency fa_res2 of the resonator res2 alone.

[1-5-4. Description of Examples Based on Resonance Analysis]

Based on the above-described resonance analysis, the fact that the resonant characteristics of the series arm circuit shift in response to switching between the on state and off state of the first switch in the radio-frequency filter according to the present embodiment will be described.

In other words, for example, in Example 1-1, when the switch SWb (first switch) is on, the series arm resonator s1a and the series arm resonator s1b are connected in parallel with each other. Therefore, the series arm circuit 11 has two resonant frequencies (the first resonant frequency and the second resonant frequency) and the two anti-resonant frequencies (the first anti-resonant frequency and the second anti-resonant frequency). In other words, the first resonant frequency and second resonant frequency of the series arm circuit 11 are respectively the same as the resonant frequency of the series arm resonator s1a and the resonant frequency of the series arm resonator s1b. The first anti-resonant frequency of the series arm circuit 11 is lower than the anti-resonant frequency of the series arm resonator s1a. The second anti-resonant frequency of the series arm circuit 11 is lower than the anti-resonant frequency of the series arm resonator s1b.

On the other hand, when the switch SWb (first switch) is off, a combined capacitance of the electrostatic capacity of the series arm resonator s1b and the off capacitance of the switch SWb is connected in parallel with the series arm resonator s1a. As described above, the off capacitance of the switch SWb is sufficiently less than the electrostatic capacity of the series arm resonator s1b, so the combined capacitance of the electrostatic capacity of the series arm resonator s1b and the off capacitance (Coff) of the switch SWb is sufficiently less than the capacitance of the electrostatic capacity of the series arm resonator s1b. Therefore, in this case, the third resonant frequency that is the resonant frequency of the series arm circuit 11 is the same as the resonant frequency of the series arm resonator s1a, and the third anti-resonant frequency that is the anti-resonant frequency of the series arm circuit 11 shifts slightly toward a lower frequency side than the anti-resonant frequency of the series arm resonator s1a.

In other words, in response to turning the switch SWb from the off state to the on state, the resonant frequency and the anti-resonant frequency shift toward a lower frequency side, and a new resonant frequency and a new anti-resonant frequency are added.

For example, in Example 1-2-1 and Example 1-2-2, the impedance element (the capacitor in Example 1-2-1, and the inductor in Example 1-2-2) is connected in series with the series arm resonator s1a. Therefore, the resonant frequency of the first series connection circuit made up of the series arm resonator s1a and the impedance element shifts toward a higher frequency side or a lower frequency side as compared to the resonant frequency of the series arm resonator s1a. The anti-resonant frequency of the first series connection circuit is equal to the anti-resonant frequency of the series arm resonator s1a.

For example, the resonant characteristics of the series arm circuit 11 when both the switches SWb, SWc are on in Example 1-3 will also be described by way of an equivalent circuit model of three resonators connected in parallel with one another. Therefore, in this case, the series arm circuit 11 has three resonant frequencies at which the impedance of the equivalent circuit model (equivalent circuit) is zero and has three anti-resonant frequencies at which the admittance is zero. The description of specific examples of the resonant frequencies and anti-resonant frequencies in this case is omitted.

Second Embodiment

In the above-described embodiment, the resonant frequency or anti-resonant frequency of the parallel arm circuit is fixed. However, as in the case of the series arm circuit, the resonant frequency or anti-resonant frequency of the parallel arm circuit may be variable. In the present embodiment, such a radio-frequency filter will be described by way of Examples (Example 2-1 and Example 2-2).

[2-1. Configuration]

Figure 10A:
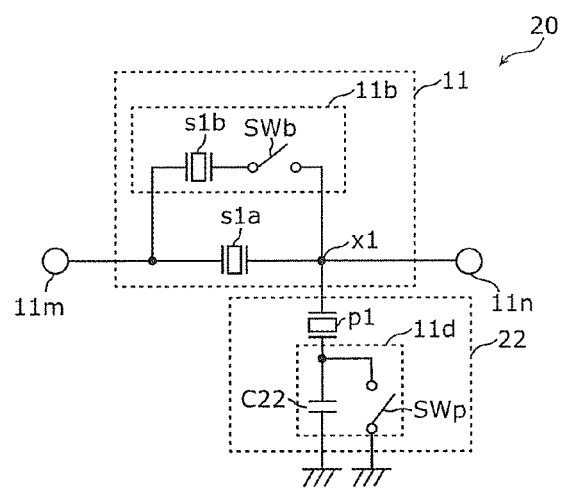
FIG. 10A is a circuit configuration diagram of a radio-frequency filter according to Example (Example 2-1) of a second embodiment.

FIG. 10A is a circuit configuration diagram of a radio-frequency filter 20 according to Example 2-1.

As shown in the diagram, a parallel arm circuit 22 in this Example further includes a variable frequency circuit 11d (second variable frequency circuit) connected in series with the parallel arm resonator p1 (first parallel arm resonator) as compared to the parallel arm circuit 12 in Examples of the first embodiment.

The variable frequency circuit 11d is the second variable frequency circuit including a capacitor C22 (second impedance element) and a switch SWp (second switch) connected in parallel with the capacitor C22. In other words, the variable frequency circuit 11d is a parallel connection circuit of the capacitor C22 and the switch SWp and is connected in series with the parallel arm resonator p1. The variable frequency circuit 11d changes the resonant frequency of the parallel arm circuit 22 as a result of switching between the on state and off state of the switch SWp in accordance with a control signal from a control unit (not shown), such as an RFIC.

In this Example, the parallel arm resonator p1 and the variable frequency circuit 11d are connected in this order from the node x1 side. Alternatively, the parallel arm resonator p1 and the variable frequency circuit 11d may be connected in reverse order. However, when the switch SWp is disposed closer to the node x1 than the parallel arm resonator p1, the loss of the radio-frequency filter 20 deteriorates because of the resistive component (on resistance) of the switch SWp when the switch SWp is on. Therefore, it is desirable that the variable frequency circuit 11d be disposed closer to the ground than the parallel arm resonator p1.

In this Example, in the variable frequency circuit 11b and the variable frequency circuit 11d, when the switch SWb (first switch) is on (conductive state), the switch SWp (second switch) is off (nonconductive state); whereas, when the switch SWb is off, the switch SWp is on. In other words, when one of the switches SWb, SWp is turned from the on state to the off state, the other one is turned from the off state to the on state at the same time. Thus, control circuits that control the on state and off state of each of the switches SWb, SWp can be integrated, so the miniaturization of the radio-frequency filter 20 is possible.

The switch SWp is an SPST switch element and is configured similarly to, for example, the switch SWb.

[2-2. Characteristics]

Next, the filter characteristics (bandpass characteristics) of the radio-frequency filter 20 of this Example will be described while impedance characteristics (resonant characteristics) that determine the filter characteristics are discussed.

Of the circuit elements that make up the radio-frequency filter 20 of this Example, the same circuit elements as those of Example 1-1 have the same constants. The capacitance of the capacitor C22 is 12 pF, and the off capacitance of the switch SWp is 0.2 pF.

FIG. 10B shows graphs of various characteristics of the radio-frequency filter 20. Specifically, the top graph shows filter characteristics in two states, that is, the case where the switch SWb is on and the switch SWp is off and the case where the switch SWb is off and the switch SWp is on. The middle graph shows the impedance characteristics of the series arm circuit 11 and parallel arm circuit 22. The bottom graph shows the impedance characteristics of the series arm resonator s1a, the series arm resonator s1b, and the parallel arm resonator p1. For the series arm circuit 11, the impedance characteristics in two states, that is, the case where the switch SWb is on and the case where the switch SWb is off, are shown. For the parallel arm circuit 22, the impedance characteristics in two states, that is, the case where the switch SWp is on and the case where the switch SWp is off, are shown.

First, characteristics when the switch SWb is off and the switch SWp is on (lower frequency shift) in the circuit configuration shown in FIG. 10A will be described.

In this case, the characteristics of the series arm circuit 11 are similar to the characteristics when the switch SWb is off in Example 1-1, so the detailed description is omitted.

In this case, the parallel arm circuit 22 exhibits the same characteristics as the parallel arm resonator p1 since the capacitor C22 is short-circuited by the switch SWp.

Next, characteristics when the switch SWb is on and the switch SWp is off (higher frequency shift) in the circuit configuration shown in FIG. 10A will be described.

In this case, the characteristics of the series arm circuit 11 are similar to the characteristics when the switch SWb is on in Example 1-1, so the detailed description is omitted.

In this case, the parallel arm circuit 22 is a circuit in which the parallel arm resonator p1 and the capacitor C22 are connected in series with each other when the switch SWp is off, so the parallel arm circuit 22 exhibits the combined characteristics of the parallel arm resonator p1 and the capacitor C22.

In this case, actually, there is the off capacitance of the switch SWp, the parallel arm circuit 22 exhibits characteristics slightly different from the combined characteristics. However, since the off capacitance of the switch SWp is small enough (0.2 pF in this Example) as compared to the capacitance (12 pF in this Example) of the capacitor C22, the off capacitance almost does not influence the characteristics of the parallel arm circuit 22. Thus, for the sake of succinctness, the description will be made on the assumption that the switch SWp is an ideal switch having no off capacitance.

Therefore, as shown in the middle and bottom graphs of FIG. 10B, the parallel arm circuit 22 has a resonant frequency that lies on the higher frequency side than the resonant frequency of the parallel arm resonator p1 and an anti-resonant frequency equal to the anti-resonant frequency of the parallel arm resonator p1.

Thus, in this Example, when the switch SWb is off and the switch SWp is on, the filter characteristics represented by the dashed line (SWb Off, SWp On) in the top graph of FIG. 10B are provided. On the other hand, when the switch SWb is on and the switch SWp is off, the filter characteristics represented by the continuous line (SWb On, SWp Off) in the top graph of FIG. 10B are provided.

[2-3. Advantageous Effects]

Hereinafter, advantageous effects that are obtained from this Example will be described by way of comparison with Example 1-1.

Figure 11A:
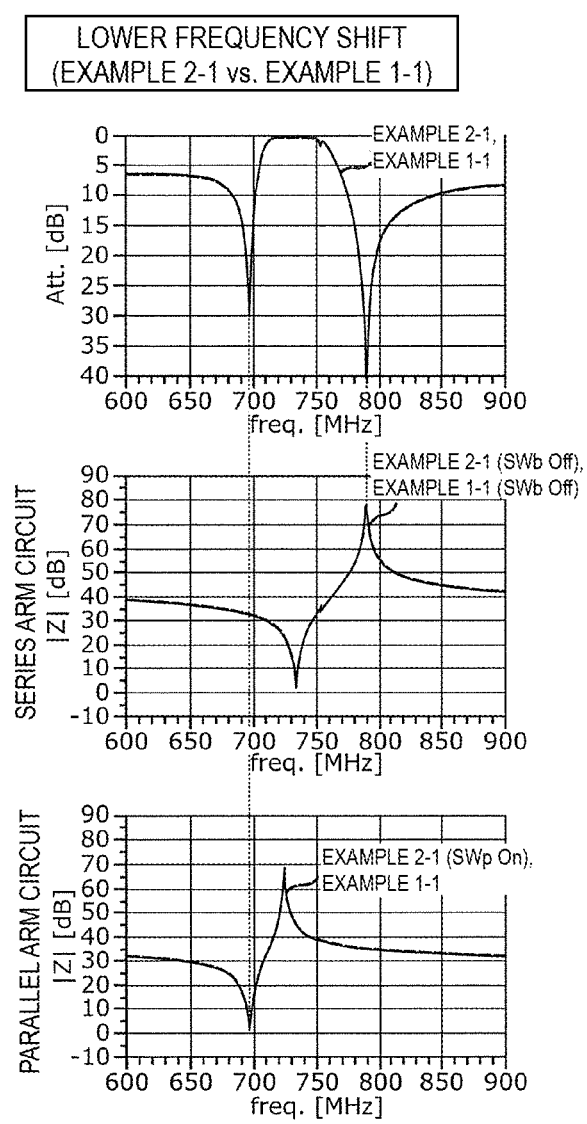
FIG. 11A shows comparison graphs of characteristics of the radio-frequency filters according to Example 2-1 and Example 1-1 at the time of lower frequency shift.
Figure 11B:
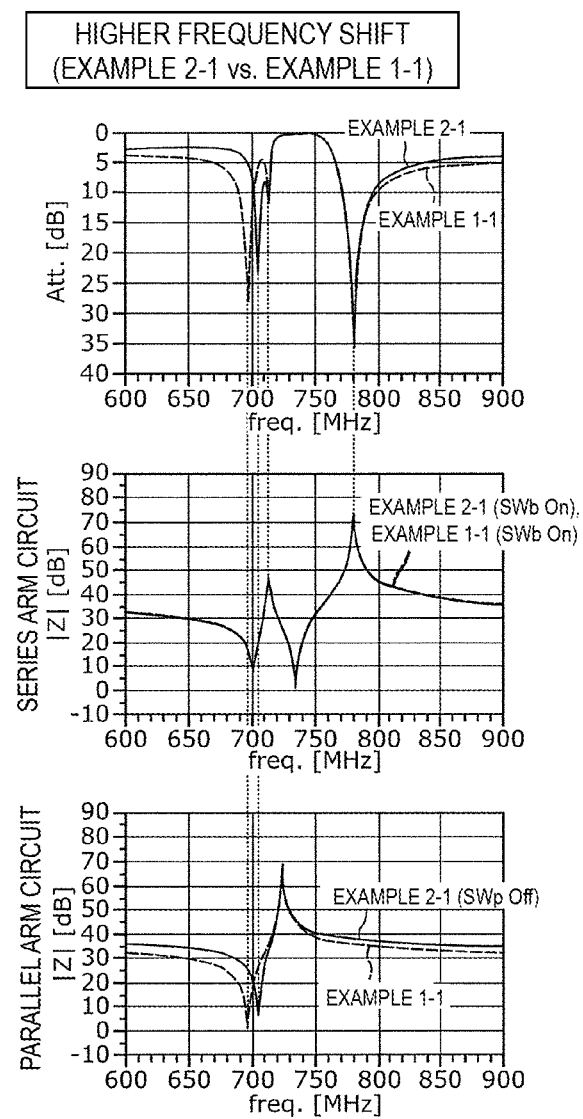
FIG. 11B shows comparison graphs of characteristics of the radio-frequency filters according to Example 2-1 and Example 1-1 at the time of higher frequency shift.

FIG. 11A shows comparison graphs of characteristics of the radio-frequency filters according to Example 2-1 and Example 1-1 at the time of lower frequency shift. FIG. 11B shows comparison graphs of characteristics of the radio-frequency filters according to Example 2-1 and Example 1-1 at the time of higher frequency shift. Specifically, in these graphs, the top graphs show filter characteristics, the middle graphs show the impedance characteristics of the series arm circuit, and the bottom graphs show the impedance characteristics of the parallel arm circuit.

As is apparent from FIG. 11A, according to Example 2-1, characteristics equivalent to those of Example 1-1 are obtained at the time of lower frequency shift.

As is apparent from the top graph of FIG. 11B, according to Example 2-1, the attenuation on the lower side of the pass band is improved as compared to Example 1-1 at the time of higher frequency shift. Specifically, in Example 2-1, the capacitor C22 is connected in series with the parallel arm resonator p1 as a result of turning the switch SWp from the on state to the off state. Thus, the resonant frequency of the parallel arm circuit 22 shifts toward a higher frequency side, so the attenuation pole on the lower side of the pass band, which is provided by the resonant frequency, shifts toward a higher frequency side, and the frequency at the lower edge of the pass band shifts to a higher frequency. Therefore, since the switch SWp is off when the switch SWb is on, the attenuation on the lower side of the pass band when the frequency at the lower edge of the pass band and the attenuation pole on the lower side of the pass band are shifted toward a higher frequency side (at the time of higher frequency shift) is improved (increased).

For example, in most of bands that are defined in 3GPP, a Tx band (transmission band) is on the lower frequency side, an Rx band (receiving band) is on the higher frequency side, and the center frequency and the band width vary among the bands. Therefore, a tunable radio-frequency filter that is used for any one of these bands needs to have any one of the Tx band and the Rx band as a pass band and the other as a stop band, and needs to shift the pass band and the stop band at the same time toward a lower frequency side or a higher frequency side.

The radio-frequency filter 20 according to this Example is able to improve the attenuation on the lower side of the pass band when the pass band is shifted toward a higher frequency side, so the radio-frequency filter 20 is suitable as, for example, a receiving filter for the bands defined in 3GPP.

The switch SWb and the switch SWp may be individually switched between the on state and the off state.

Figure 12:
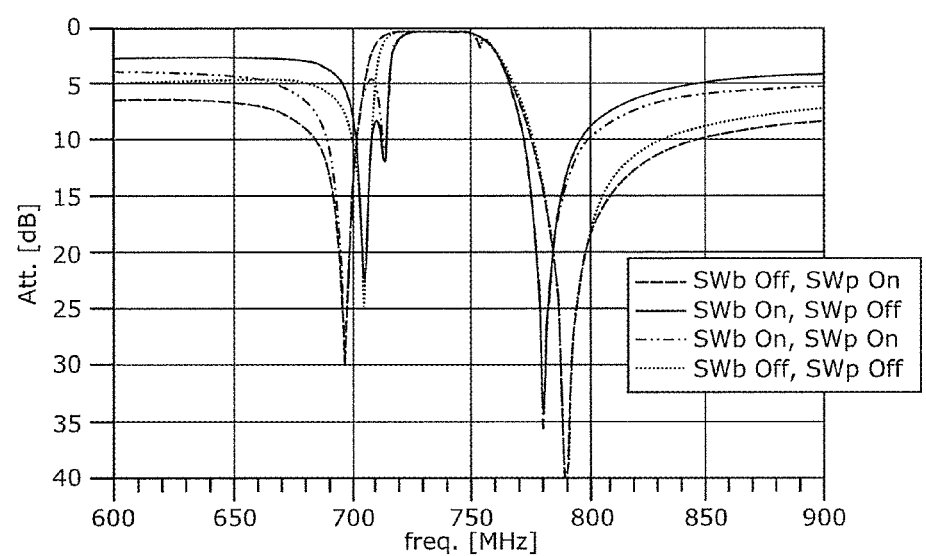
FIG. 12 shows graphs of changes in filter characteristics when switches of the radio-frequency filter according to Example 2-1 are individually switched between an on state and an off state.

FIG. 12 shows graphs of changes in filter characteristics when the switches SWb, SWp of the radio-frequency filter 20 according to Example 2-1 are individually switched between the on state and the off state.

As shown in the graphs, the radio-frequency filter 20 is able to change the lower side of the pass band while reducing the loss at the higher edge of the pass band by switching between the on state and off state of the switch SWb. The radio-frequency filter 20 is able to change the attenuation pole on the lower side of the pass band by switching between the on state and off state of the switch SWp.

Therefore, the radio-frequency filter 20 is able to provide filter characteristics for the required frequency specifications by switching between the on state and off state of each of the switches SWb, SWp as needed.

[2-4. Other Examples]

The impedance element that is connected in series with the parallel arm resonator p1 is not limited to a capacitor and may be an inductor.

Figure 13A:
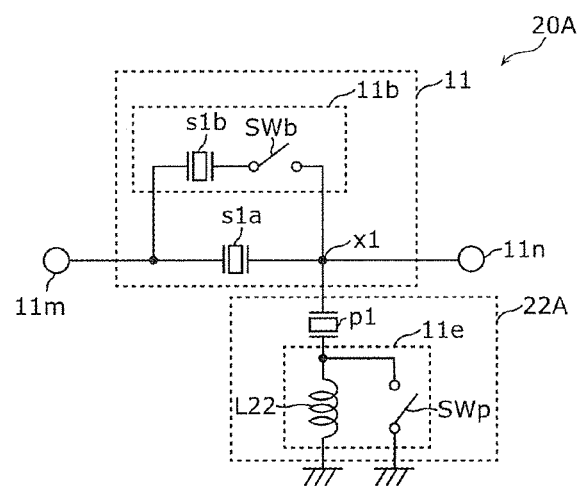
FIG. 13A is a circuit configuration diagram of a radio-frequency filter according to Example (Example 2-2) of the second embodiment.

FIG. 13A is a circuit configuration diagram of a radio-frequency filter 20A according to Example 2-2.

As shown in the diagram, a parallel arm circuit 22A in this Example includes an inductor L22 instead of the capacitor C22 in Example 2-1. In other words, the parallel arm circuit 22A in this Example includes a variable frequency circuit 11e (second variable frequency circuit) connected in series with the parallel arm resonator p1 (first parallel arm resonator). The variable frequency circuit 11e is the second variable frequency circuit including the inductor L22 (second impedance element) and the switch SWp (second switch) connected in parallel with the inductor L22.

In this Example, in the variable frequency circuit 11b and the variable frequency circuit 11e, when the switch SWb (first switch) is on (conductive state), the switch SWp (second switch) is on; whereas, when the switch SWb is off (nonconductive state), the switch SWp is off. In other words, the switches SWb, SWp are on at the same time or are off at the same time.

Next, the filter characteristics (bandpass characteristics) of the radio-frequency filter 20A of this Example will be described while impedance characteristics (resonant characteristics) that determine the filter characteristics are discussed.

Of the circuit elements that make up the radio-frequency filter 20A of this Example, the same circuit elements as those of Example 2-1 have the same constants. The inductance of the inductor L22 is 3 nH.

Figure 13B:
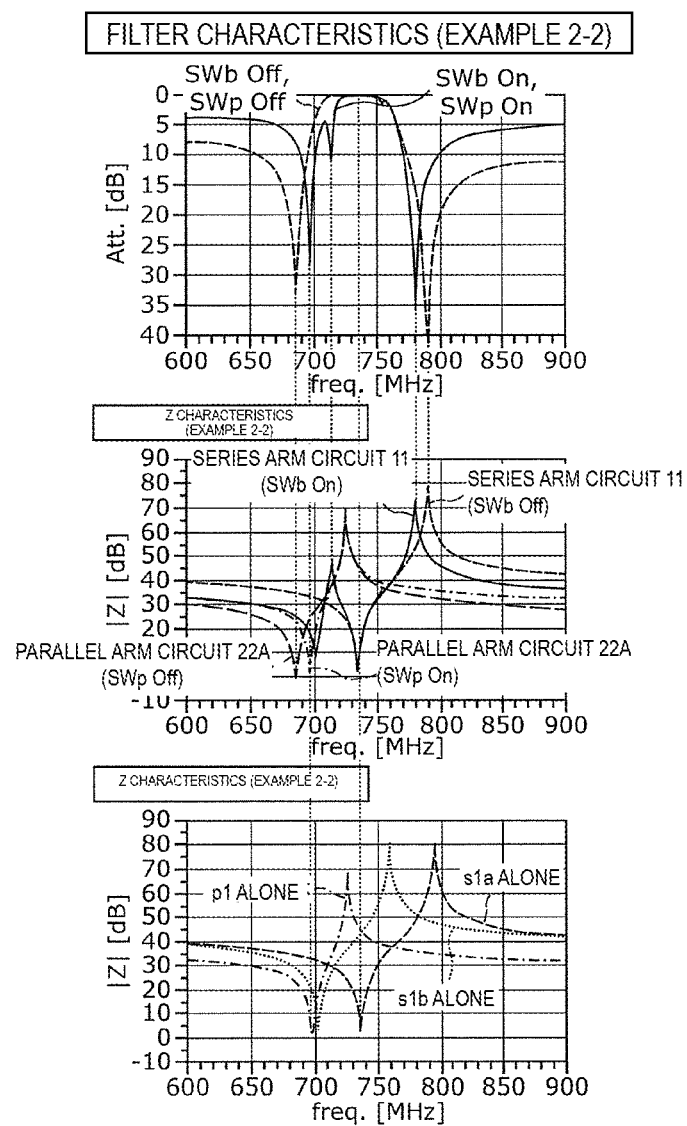
FIG. 13B shows graphs of various characteristics of the radio-frequency filter according to Example 2-2.

FIG. 13B shows graphs of various characteristics of the radio-frequency filter 20A. Specifically, the top graph shows filter characteristics in two states, that is, the case where the switch SWb is on and the switch SWp is on and the case where the switch SWb is off and the switch SWp is off. The middle graphs show the impedance characteristics of the series arm circuit 11 and parallel arm circuit 22A. The bottom graphs show the impedance characteristics of the series arm resonator s1a, the series arm resonator s1b, and the parallel arm resonator p1. For the series arm circuit 11, the impedance characteristics in two states, that is, the case where the switch SWb is on and the case where the switch SWb is off, are shown. For the parallel arm circuit 22A, the impedance characteristics in two states, that is, the case where the switch SWp is on and the case where the switch SWp is off, are shown.

First, characteristics when the switch SWb is off and the switch SWp is off (lower frequency shift) in the circuit configuration shown in FIG. 13A will be described.

In this case, the characteristics of the series arm circuit 11 are similar to the characteristics when the switch SWb is off in Example 1-1, so the detailed description is omitted.

In this case, the parallel arm circuit 22A is a circuit in which the parallel arm resonator p1 and the inductor L22 are connected in series with each other when the switch SWp is off, so the parallel arm circuit 22A exhibits the combined characteristics of the parallel arm resonator p1 and the inductor L22.

In this case, actually, there is the off capacitance of the switch SWp, and a ripple occurs in the impedance characteristics of the parallel arm circuit 22A. However, when the off capacitance of the switch SWp is small enough (for example, 0.4 pF or below), the ripple almost does not influence the characteristics in the pass band, and the off capacitance of the switch SWp is 0.2 pF in this Example, so the influence on the characteristics in the pass band is ignored. Thus, for the sake of succinctness, the description will be made on the assumption that the switch SWp is an ideal switch having no off capacitance.

Therefore, as shown in the middle and bottom graphs of FIG. 13B, the parallel arm circuit 22A has a resonant frequency that lies on the lower frequency side than the resonant frequency of the parallel arm resonator p1 and an anti-resonant frequency equal to the anti-resonant frequency of the parallel arm resonator p1.

Next, characteristics when the switch SWb is on and the switch SWp is on (higher frequency shift) in the circuit configuration shown in FIG. 13A will be described.

In this case, the characteristics of the series arm circuit 11 are similar to the characteristics when the switch SWb is on in Example 1-1, so the detailed description is omitted.

In this case, the parallel arm circuit 22A exhibits the same characteristics as the parallel arm resonator p1 since the inductor L22 is short-circuited by the switch SWp.

Thus, in this Example, when the switch SWb is off and the switch SWp is off, the filter characteristics represented by the dashed line (SWb Off, SWn Off) in the top graph of FIG. 13B are provided. On the other hand, when the switch SWb is on and the switch SWp is on, the filter characteristics represented by the continuous line (SWb On, SWp On) in the top graph of FIG. 13B are provided.

Hereinafter, advantageous effects that are obtained from this Example will be described by way of comparison with Example 1-1.

Figure 14A:
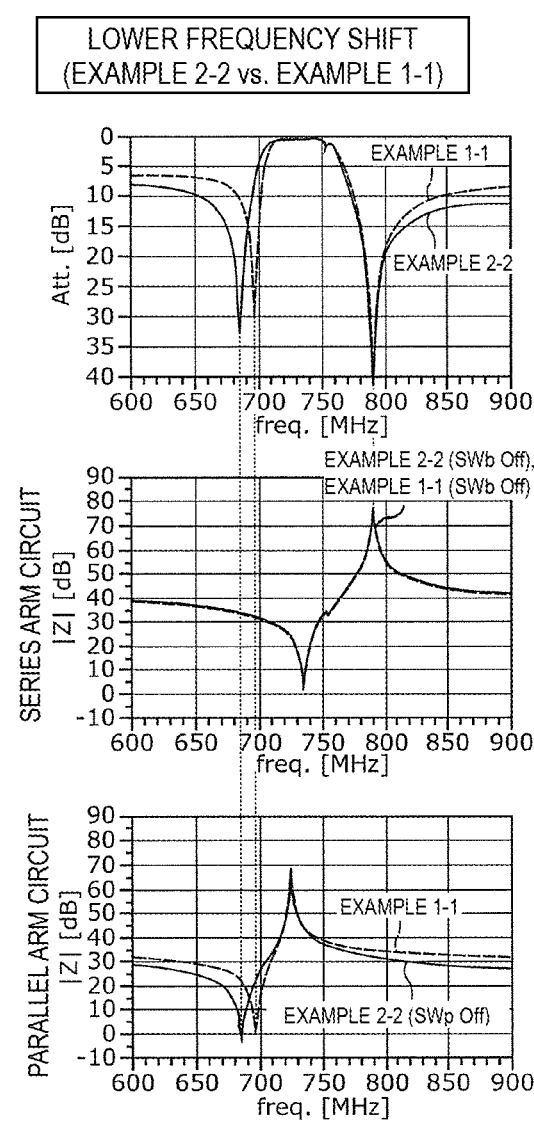
FIG. 14A shows comparison graphs of characteristics of the radio-frequency filters according to Example 2-2 and Example 1-1 at the time of lower frequency shift.
Figure 14B:
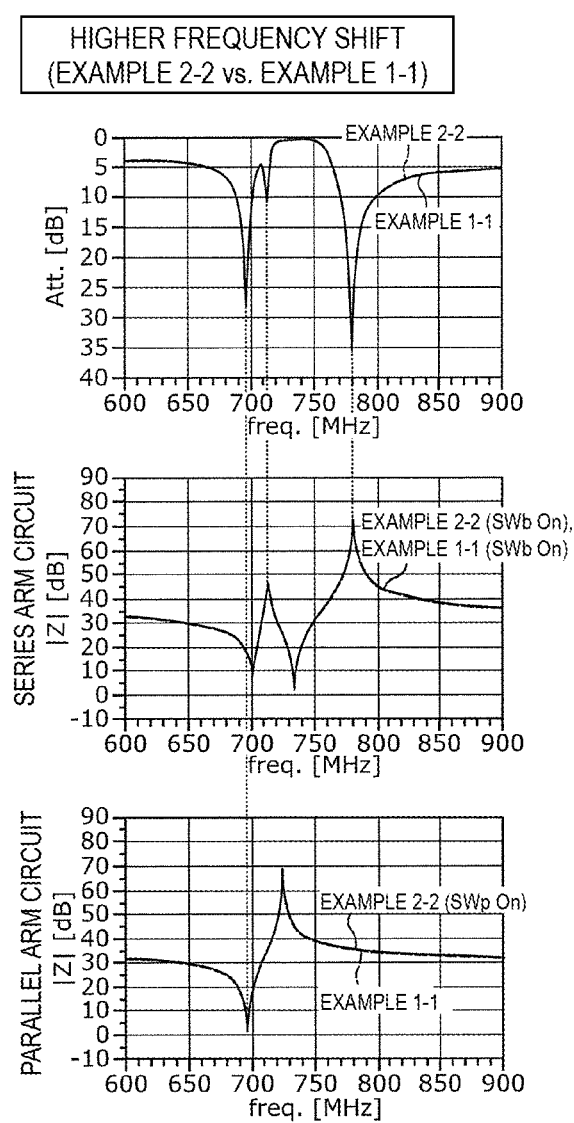
FIG. 14B shows comparison graphs of characteristics of the radio-frequency filters according to Example 2-2 and Example 1-1 at the time of higher frequency shift.

FIG. 14A shows comparison graphs of characteristics of the radio-frequency filters according to Example 2-2 and Example 1-1 at the time of lower frequency shift. FIG. 14B shows comparison graphs of characteristics of the radio-frequency filters according to Example 2-2 and Example 1-1 at the time of higher frequency shift. Specifically, in these graphs, the top graphs show filter characteristics, the middle graphs show the impedance characteristics of the series arm circuit, and the bottom graphs show the impedance characteristics of the parallel arm circuit.

As is apparent from FIG. 14A, according to Example 2-2, the attenuation pole on the lower side of the pass band can be shifted toward a lower frequency side as compared to Example 1-1 at the time of lower frequency shift. Specifically, in Example 2-1, the inductor L22 is connected in series with the parallel arm resonator p1 when the switch SWp is turned from the on state to the off state. Thus, the resonant frequency of the parallel arm circuit 22A shifts toward a lower frequency side, so the attenuation pole on the lower side of the pass band, which is provided by the resonant frequency, shifts toward a lower frequency side, and the frequency at the lower edge of the pass band shifts to a higher frequency. Therefore, since the switch SWp is off when the switch SWb is on, the attenuation on the lower side of the pass band when the frequency at the lower edge of the pass band and the attenuation pole on the lower side of the pass band are shifted toward a lower frequency side (at the time of lower frequency shift) is improved.

As is apparent from FIG. 14B, according to Example 2-2, characteristics equivalent to those of Example 1-1 are obtained at the time of higher frequency shift.

Therefore, according to Example 2-2, the variable width of the frequencies on the lower side of the pass band and the variable width of the frequency at the attenuation pole on the lower side of the pass band are increased while the loss at the higher edge of the pass band is reduced.

The switch SWb and the switch SWp may be individually switched between the on state and the off state.

Figure 15:
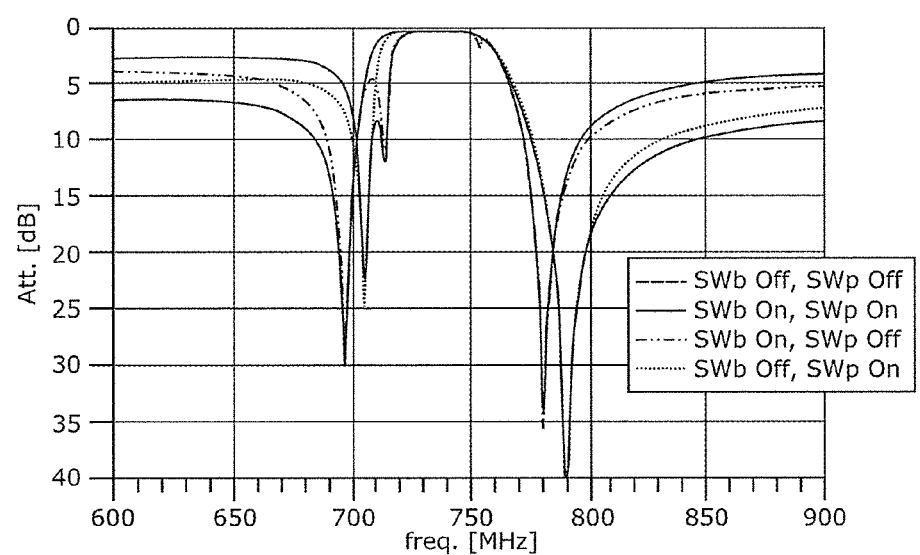
FIG. 15 shows graphs of changes in filter characteristics when switches of the radio-frequency filter according to Example 2-2 are individually switched between an on state and an off state.

FIG. 15 shows graphs of changes in filter characteristics when the switches SWb, SWp of the radio-frequency filter 20A according to Example 2-2 are individually switched between the on state and the off state.

As shown in the graphs, the radio-frequency filter 20A is able to change the frequency at the lower edge of the pass band and the frequency at the attenuation pole on the lower side of the pass band while reducing the loss at the higher edge of the pass band by switching between the on state and off state of the switch SWb. The radio-frequency filter 20A is able to change the frequency at the lower edge of the pass band and at the frequency of the attenuation pole on the lower side of the pass band by switching between the on state and off state of the switch SWp.

Therefore, the radio-frequency filter 20A is able to provide filter characteristics for the required frequency specifications by switching between the on state and off state of each of the switches SWb, SWp as needed.

Third Embodiment

In the above-described first and second embodiments, the parallel arm circuit includes one parallel arm resonator. However, as in the case of the series arm circuit, the parallel arm circuit may include a plurality of parallel arm resonators. In the present embodiment, such a radio-frequency filter will be described by way of Example (Example 3).

[3-1. Configuration]

Figure 16A:
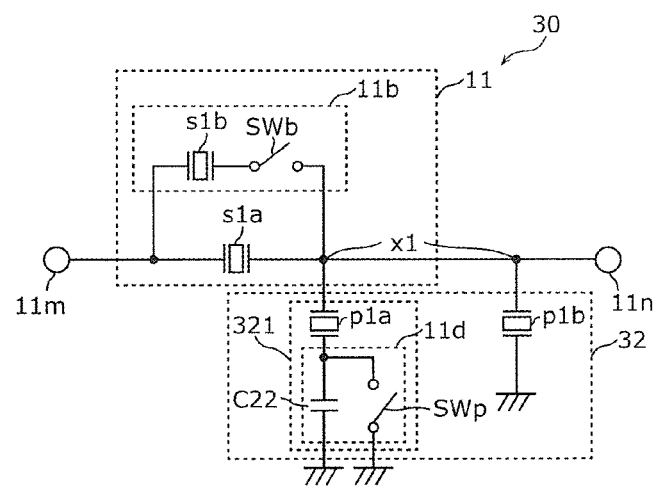
FIG. 16A is a circuit configuration diagram of a radio-frequency filter according to Example (Example 3) of a third embodiment.

FIG. 16A is a circuit configuration diagram of a radio-frequency filter 30 according to Example 3.

As shown in the diagram, a parallel arm circuit 32 in this Example includes a parallel arm resonator p1b (second parallel arm resonator) connected in parallel with a series connection circuit 321 (second series connection circuit) made up of the parallel arm resonator p1a (first parallel arm resonator) and the variable frequency circuit 11d (second variable frequency circuit) as compared to the parallel arm circuit 22 in Example 2-1 of the second embodiment. The parallel arm resonator p1a corresponds to the parallel arm resonator p1 of Example 2-1.

The parallel arm resonator p1b is a resonator (second parallel arm resonator) provided in a parallel arm connecting the node x1 and the ground. One terminal of the parallel arm resonator p1b is connected to the node x1, and the other terminal of the parallel arm resonator p1b is connected to the ground. The resonant frequency of the parallel arm resonator p1b is higher than the resonant frequency of the parallel arm resonator p1a.

In this Example, as in the case of Example 2-1, in the variable frequency circuit 11b and the variable frequency circuit 11d, when the switch SWb (first switch) is on (conductive state), the switch SWp (second switch) is off (nonconductive state); whereas, when the switch SWb is off, the switch SWp is on. In other words, when one of the switches SWb, SWp is turned from the on state to the off state, the other one is turned from the off state to the on state at the same time.

[3-2. Characteristics]

Next, the filter characteristics (bandpass characteristics) of the radio-frequency filter 30 of this Example will be described while impedance characteristics (resonant characteristics) that determine the filter characteristics are discussed.

Circuit constants of the radio-frequency filter 30 of Example 3 are shown in Table 4. The capacitance of the capacitor C22 is 3 pF, and the off capacitances (Coff) of the switches SWb, SWp both are 0.2 pF.

TABLE 4

|  | Series Arm Resonator s1a | Series Arm Resonator s1b | Parallel Arm Resonator p1a | Parallel Arm Resonator p1b |
|---|---|---|---|---|
| Resonant Frequency fr [MHz] | 737 | 692 | 697 | 770 |
| Anti-Resonant Frequency fa [MHz] | 796 | 747 | 725 | 801 |
| Electrostatic Capacity $C_0$ [pF] | 2.0 | 2.0 | 4.0 | 0.5 |

Figure 16B:
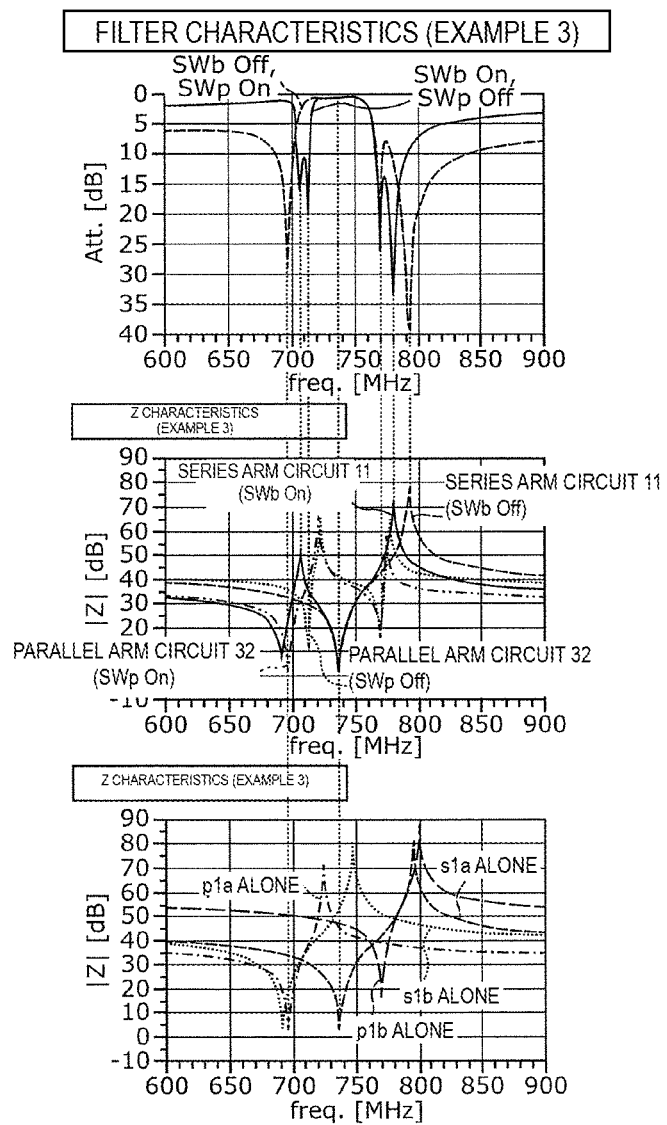
FIG. 16B shows graphs of various characteristics of the radio-frequency filter according to Example 3.

FIG. 16B shows graphs of various characteristics of the radio-frequency filter 30. Specifically, the top graph shows filter characteristics in two states, that is, the case where the switch SWb is on and the switch SWp is off and the case where the switch SWb is off and the switch SWp is on. The middle graph shows the impedance characteristics of the series arm circuit 11 and parallel arm circuit 32. The bottom graphs show the impedance characteristics of the series arm resonator s1a, the series arm resonator s1b, the parallel arm resonator p1a, and the parallel arm resonator p1b. For the series arm circuit 11, the impedance characteristics in two states, that is, the case where the switch SWb is on and the case where the switch SWb is off, are shown. For the parallel arm circuit 32, the impedance characteristics in two states, that is, the case where the switch SWp is on and the case where the switch SWp is off, are shown.

First, characteristics when the switch SWb is off and the switch SWp is on (lower frequency shift) in the circuit configuration shown in FIG. 16A will be described.

In this case, the characteristics of the series arm circuit 11 are similar to the characteristics when the switch SWb is off in Example 1-1, so the detailed description is omitted.

In this case, the parallel arm circuit 32 is in a state where the parallel arm resonator p1a and the parallel arm resonator p1b are connected in parallel with each other since the capacitor C22 is short-circuited by the switch SWp. Therefore, the parallel arm circuit 32 exhibits combined characteristics of the parallel arm resonator p1a and the parallel arm resonator p1b. Thus, as shown in the middle graph of FIG. 16B, the parallel arm circuit 32 has two resonant frequencies and two anti-resonant frequencies. Specifically, the parallel arm circuit 32 has a first resonant frequency equal to the resonant frequency of the parallel arm resonator p1a, a second resonant frequency equal to the resonant frequency of the parallel arm resonator p1b, a first anti-resonant frequency that lies between the first resonant frequency and the second resonant frequency, and a second anti-resonant frequency that lies between the second resonant frequency and the anti-resonant frequency of the parallel arm resonator p1b.

Next, characteristics when the switch SWb is on and the switch SWp is off (higher frequency shift) in the circuit configuration shown in FIG. 16A will be described.

In this case, the characteristics of the series arm circuit 11 are similar to the characteristics when the switch SWb is on in Example 1-1, so the detailed description is omitted.

In this case, the parallel arm circuit 32 is in a state where the series connection circuit 321 of the parallel arm resonator p1a and the capacitor C22 and the parallel arm resonator p1b are connected in parallel with each other. Therefore, the parallel arm circuit 32 exhibits combined characteristics of the parallel arm resonator p1a and the capacitor C22 and the parallel arm resonator p1b. Thus, as shown in the middle graph of FIG. 16B, the parallel arm circuit 32 has two resonant frequencies and two anti-resonant frequencies.

Specifically, the parallel arm circuit 32 has a third resonant frequency that lies on the higher frequency side than the resonant frequency of the parallel arm resonator p1a, a fourth resonant frequency equal to the resonant frequency of the parallel arm resonator p1b, a third anti-resonant frequency that lies between the first resonant frequency and the second resonant frequency, and a fourth anti-resonant frequency that lies between the second resonant frequency and the anti-resonant frequency of the parallel arm resonator p1b. In other words, the parallel arm circuit 32 has a third resonant frequency higher in frequency than the first resonant frequency, a fourth resonant frequency equal to the second resonant frequency, a third anti-resonant frequency higher in frequency than the first anti-resonant frequency, and a fourth anti-resonant frequency substantially equal to the second anti-resonant frequency.

Therefore, as shown in the middle graph of FIG. 16B, in the parallel arm circuit 32, when the switch SWp is turned from the on state to the off state, the lower frequency-side resonant frequency shifts toward a higher frequency side from the first resonant frequency to the third resonant frequency, and the lower frequency-side anti-resonant frequency shifts toward a higher frequency side from the first anti-resonant frequency to the third anti-resonant frequency.

Thus, in this Example, when the switch SWb is off and the switch SWp is on, the filter characteristics represented by the dashed line (SWb Off, SWp On) in the top graph of FIG. 16B are provided. On the other hand, when the switch SWb is on and the switch SWp is off, the filter characteristics represented by the continuous line (SWb On, SWp Off) in the top graph of FIG. 16B are provided.

[3-3. Advantageous Effects]

Hereinafter, advantageous effects that are obtained from this Example will be described by way of comparison with Example 1-1.

Figure 17A:
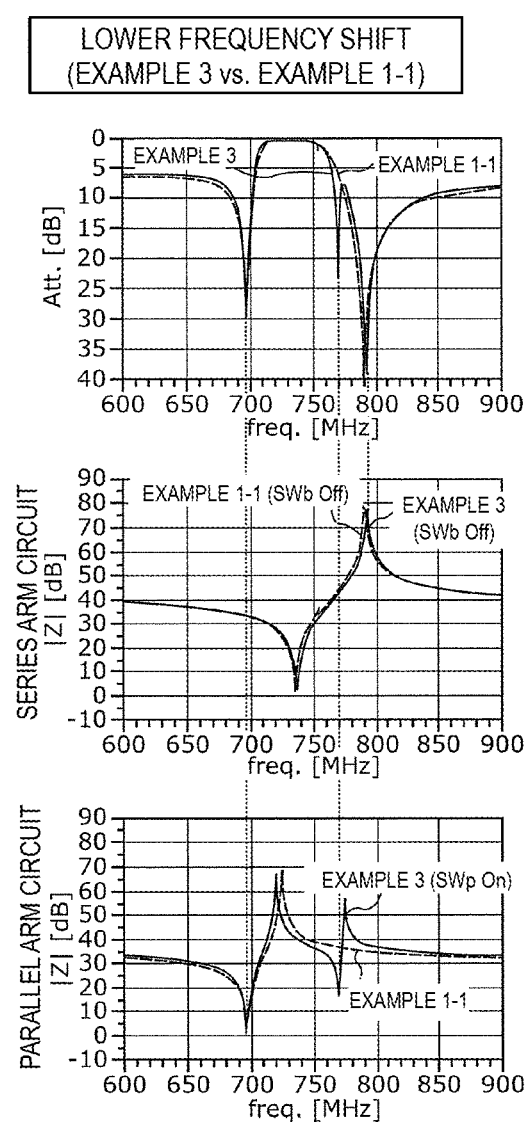
FIG. 17A shows comparison graphs of characteristics of the radio-frequency filters according to Example 3 and Example 1-1 at the time lower frequency shift.
Figure 17B:
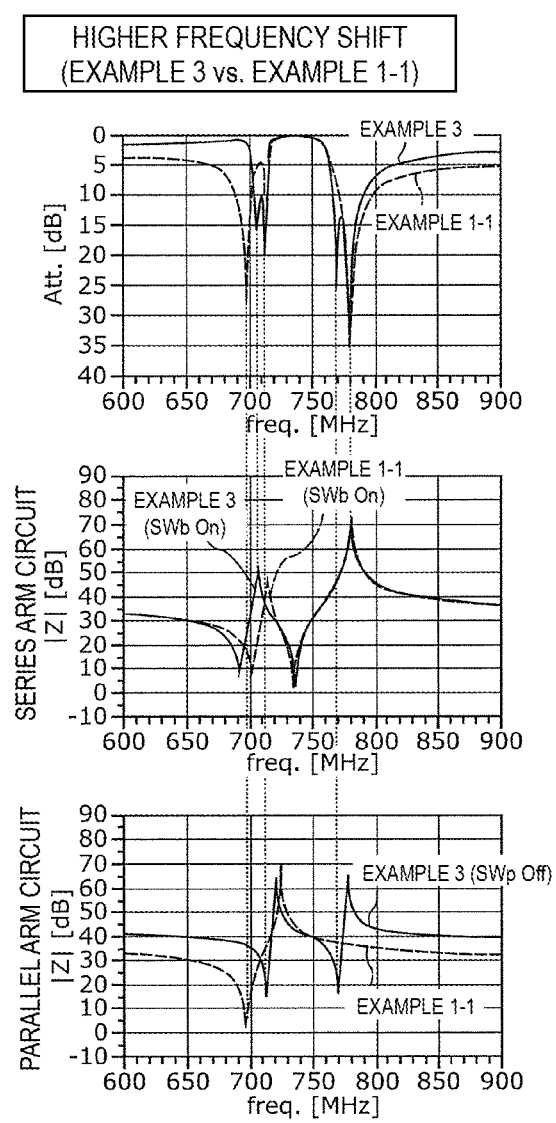
FIG. 17B shows comparison graphs of characteristics of the radio-frequency filters according to Example 3 and Example 1-1 at the time of higher frequency shift.

FIG. 17A shows comparison graphs of characteristics of the radio-frequency filters according to Example 3 and Example 1-1 at the time of lower frequency shift. FIG. 17B shows comparison graphs of characteristics of the radio-frequency filters according to Example 3 and Example 1-1 at the time of higher frequency shift. Specifically, in these graphs, the top graphs show filter characteristics, the middle graphs show the impedance characteristics of the series arm circuit, and the bottom graphs show the impedance characteristics of the parallel arm circuit.

As is apparent from the top graphs of FIG. 17A and FIG. 17B, according to Example 3, the attenuation on the higher side of the pass band is improved both at the time of lower frequency shift and at the time of higher frequency shift as compared to Example 1-1. Specifically, the parallel arm circuit 32 of Example 3 includes the parallel arm resonator p1b (second parallel arm resonator) as compared to the parallel arm circuit 12 of Example 1-1, so the parallel arm circuit 32 has a second resonant frequency equal to the resonant frequency of the parallel arm resonator p1b. Thus, a new attenuation pole is provided on the higher side of the pass band by the resonant frequency of the parallel arm resonator p1b, so the attenuation on the higher side of the pass band is improved.

As is apparent from the top graph of FIG. 17B, according to Example 3, the attenuation on the lower side of the pass band is improved at the time of higher frequency shift as compared to Example 1-1. Specifically, in Example 3-1, when the switch SWp is turned from the on state to the off state, the capacitor C22 connected in series with the parallel arm resonator p1a becomes effective. Thus, the first resonant frequency of the parallel arm circuit 32 shifts toward a higher frequency side, so the attenuation pole on the lower side of the pass band, which is provided by the resonant frequency, shifts toward a higher frequency side. Therefore, since the switch SWp is off when the switch SWb is on, the attenuation on the lower side of the pass band when the lower side of the pass band is shifted toward a higher frequency side (at the time of higher frequency shift) is improved.

Figure 18A:
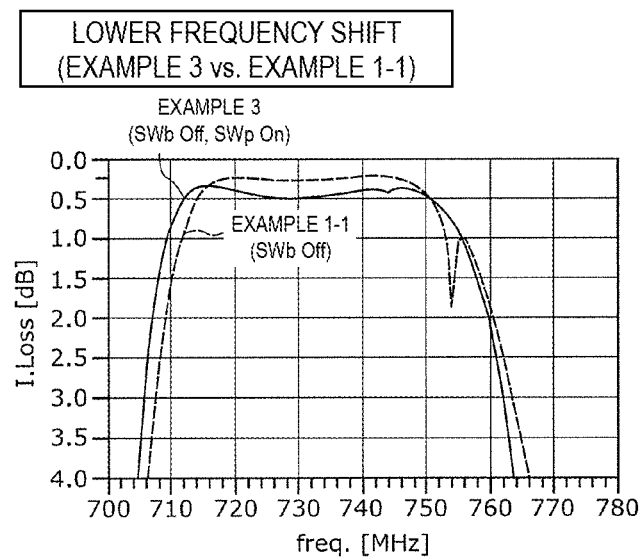
FIG. 18A is an enlarged view of the pass band and its vicinity of the graph shown at the top of FIG. 17A.
Figure 18B:
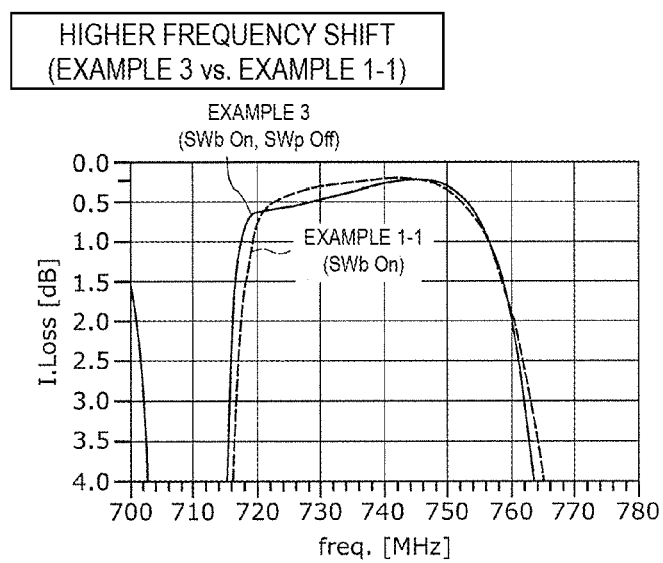
FIG. 18B is an enlarged view of the pass band and its vicinity of the graph shown at the top of FIG. 17B.

FIG. 18A is an enlarged view of the pass band and its vicinity of the graph shown at the top of FIG. 17A. FIG. 18B is an enlarged view of the pass band and its vicinity of the graph shown at the top of FIG. 17B.

As is apparent from FIG. 18A and FIG. 18B, according to Example 3, the loss at the lower edge of the pass band is improved (reduced) both at the time of lower frequency shift and at the time of higher frequency shift as compared to Example 1-1. Specifically, the parallel arm circuit 32 of Example 3 includes the parallel arm resonator p1b and, therefore, has two resonant frequencies and two anti-resonant frequencies. As compared to the difference between the resonant frequency and anti-resonant frequency of the parallel arm circuit 12 of Example 1-1, the parallel arm circuit 32 is able to reduce the difference between the lower frequency-side resonant frequency and the lower frequency-side anti-resonant frequency. Therefore, according to Example 3, the cut-off frequency on the lower side of the pass band can be shifted toward a lower frequency side as compared to Example 1-1, so the loss at the lower edge of the pass band is improved.

The switch SWb and the switch SWp may be individually switched between the on state and the off state.

Figure 19:
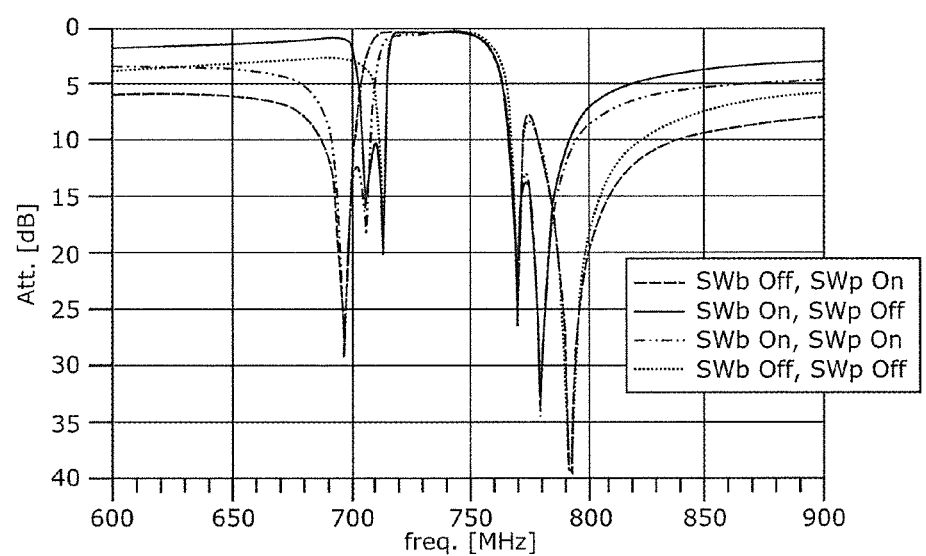
FIG. 19 shows graphs of changes in filter characteristics when switches of the radio-frequency filter according to Example 3 are individually switched between an on state and an off state.

FIG. 19 shows graphs of changes in filter characteristics when the switches SWb, SWp of the radio-frequency filter 30 according to Example 3 are individually switched between the on state and the off state.

As shown in the graphs, the radio-frequency filter 30 is able to change the lower side of the pass band while reducing the loss at the higher edge of the pass band by switching between the on state and off state of the switch SWb. The radio-frequency filter 30 is able to change the attenuation pole on the lower side of the pass band by switching between the on state and off state of the switch SWp.

Therefore, the radio-frequency filter 30 is able to provide filter characteristics for the required frequency specifications by switching between the on state and off state of each of the switches SWb, SWp as needed.

Fourth Embodiment

The configuration of the above-described radio-frequency filter may be applied to a configuration having a plurality of series arm resonators. In the present embodiment, such a radio-frequency filter will be described by way of Example (Example 4).

[4-1. Configuration]

Figure 20A:
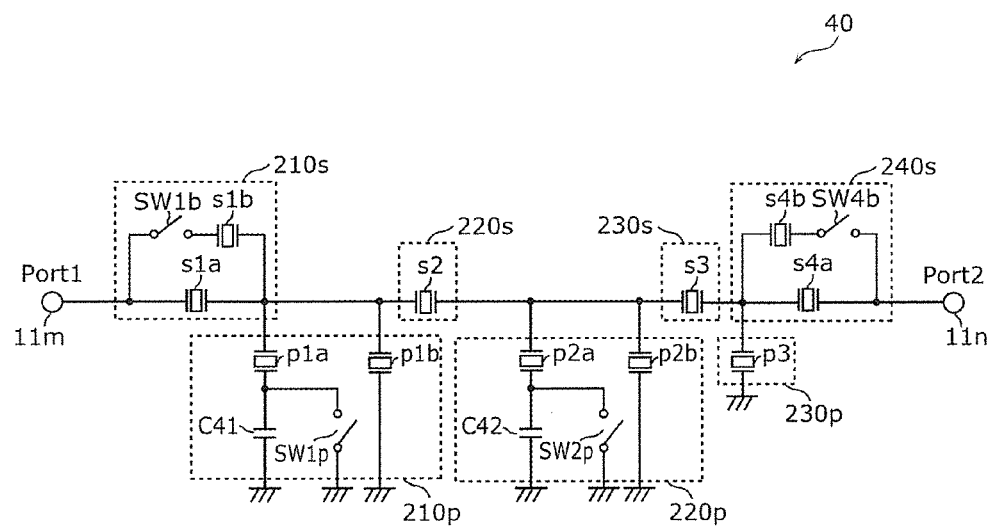
FIG. 20A is a circuit configuration diagram of a radio-frequency filter according to Example (Example 4) of a fourth embodiment.

FIG. 20A is a circuit configuration diagram of a radio-frequency filter 40 according to Example 4.

The radio-frequency filter 40 shown in the diagram is a ladder filter circuit made up of a plurality of series arm circuits (four series arm circuits 210s, 220s, 230s, 240s in this Example) and one or more parallel arm circuits (three parallel arm circuits 210p, 220p, 230p in this Example). The plurality of series arm circuits is provided in the path connecting the input and output terminal 11m (first input and output terminal) and the input and output terminal 11n (second input and output terminal). Specifically, the radio-frequency filter 40 is a variable frequency band pass filter that has a plurality of bands as pass bands, and includes six series arm resonators s1a, s1b, s2, s3, s4a, s4b, fifth parallel arm resonators p1a, p1b, p2a, p2b, p3, four switches SW1b, SW4b, SW1p, SW2p, and two capacitors C41, C42. The number of the series arm circuits and the number of the parallel arm circuits are not limited to the above-described numbers.

Of the series arm circuits 210s, 220s, 230s, 240s, the series arm circuit 210s provided closest to the input and output terminal 11m and the series arm circuit 240s provided closest to the input and output terminal 11n correspond to the series arm circuit 11 of the radio-frequency filter according to any one of the above-described first to third embodiments (here, the first embodiment). Thus, the series arm resonators s1a, s4a correspond to the series arm resonator s1a of the series arm circuit 11, the series arm resonators s1b, s4b correspond to the series arm resonator s1b of the series arm circuit 11, and the switches SW1b, SW4b correspond to the switch SW1b of the series arm circuit 11. The parallel arm circuits 210p, 220p correspond to the parallel arm circuit 32 of the radio-frequency filter 30 according to Example 3, and the parallel arm circuit 230p corresponds to the parallel arm circuit 12 of the radio-frequency filter according to the first embodiment (Example 1-1, the modification, Examples 1-2-1, 1-2-2, 1-3). Therefore, the parallel arm resonators p1a, p2a correspond to the parallel arm resonator p1a of the parallel arm circuit 32, the parallel arm resonator p3 corresponds to the parallel arm resonator p1 of the parallel arm circuit 12, the capacitors C41, C42 correspond to the capacitor C22 of the parallel arm circuit 32, the parallel arm resonators p1b, p2b correspond to the parallel arm resonator p1b of the parallel arm circuit 32, and the switches SW1p, SW2p correspond to the switch SWp of the parallel arm circuit 32. That is, in the radio-frequency filter 40, the configuration corresponding to the radio-frequency filter 30 according to Example 3 is provided closest to the input and output terminal 11m, and the configuration corresponding to the radio-frequency filter according to the first embodiment is provided closest to the input and output terminal 11n.

The configuration of the radio-frequency filter 40 is not limited thereto. For example, at least one of the plurality of series arm circuits just needs to correspond to the series arm circuit of any one of the above-described first to third embodiments, only the series arm circuit provided closest to one of the input and output terminals may correspond to the series arm circuit of any one of the first to third embodiments, or only the series arm circuit different from the series arm circuit provided closest to any one of the input and output terminals may correspond to the series arm circuit of any one of the first to third embodiments.

A parallel arm circuit that connects a ground and a node in a path connecting any one of the input and output terminals (the input and output terminal 11m or the input and output terminal 11n) to the series arm circuit provided closest to the any one of the input and output terminals may be provided.

The thus configured radio-frequency filter 40 includes the configuration of the radio-frequency filter of any one of the above-described first to third embodiments, so a variable frequency radio-frequency filter that improves the loss at the lower edge of the pass band and the attenuation on the higher side of the pass band is implemented.

[4-2. Structure]

Figure 20B:
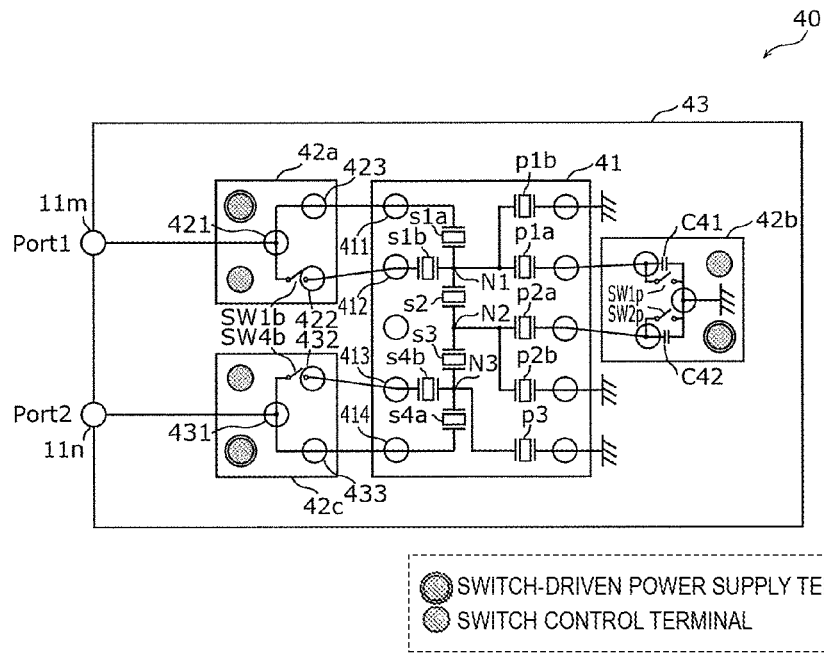
FIG. 20B is a plan view that illustrates the structure of the radio-frequency filter according to Example 4.

FIG. 20B is a plan view that illustrates the structure of the radio-frequency filter 40 according to Example 4.

As shown in the diagram, in this Example, the resonators (the series arm resonators s1a, s1b, s2, s3, s4a, s4b and the parallel arm resonators p1a, p1b, p2a, p2b, p3) are formed in one package 41 (chip) for resonators, the other elements (the switches SW1b, SW4b, SW1p, SW2p, and the capacitors C41, C42) are formed in packages 42a to 42c other than the package 41 for resonators, and these packages 41, 42a to 42c are mounted on a circuit board 43. In other words, the resonators and the switches are formed in different packages.

The packages 41, 42a to 42c have surface electrodes (the circle marks in FIG. 20B; also referred to as lands or pads) at their bottom surfaces for being mounted on the circuit board 43. In FIG. 20B, for the sake of succinctness, the circuit elements and wires formed on or in the packages are schematically shown, and the surface electrodes on the bottom surfaces are shown through the insides of the packages 41, 42a to 42c.

The circuit board 43 has external connection electrodes (the circle marks in FIG. 20B) that are respectively the input and output terminal 11m and the input and output terminal 11n. The external connection electrodes are, for example, the surface electrodes for mounting the circuit board 43 on a mother board or the like, the connectors that connect the circuit board 43 to another electronic component, or, when another electronic component is mounted on the circuit board 43, a part of the pattern wires that connect the other electronic component to the package 42a or the package 42c.

As is apparent from the diagram, in the package 42a, one terminal of the switch SW1b is connected to a common terminal 421 and is connected to the input and output terminal 11m via the common terminal 421. The other terminal of the switch SW1b is connected to a first terminal 422 of the package 42a. The common terminal 421 and a second terminal 423 of the package 42a are short-circuited.

In the package 42c, one terminal of the switch SW4b is connected to a common terminal 431 and is connected to the input and output terminal 11n via the common terminal 431. The other terminal of the switch SW4b is connected to a first terminal 432. The common terminal 431 and a second terminal 433 of the package 42c are short-circuited.

In the package 41 for resonators, the resonators are connected as follows.

First, the connection relation among the series arm resonators (series arm resonators s1a, s1b, s2, s3, s4a, s4b) will be described. One terminal of the series arm resonator s1a is connected to a first terminal 411 of the package 41, and the other terminal is connected to a first node N1. One terminal of the series arm resonator s1b is connected to a second terminal 412 of the package 41, and the other terminal is connected to the first node N1. One terminal of the series arm resonator s2 is connected to the first node N1, and the other terminal is connected to a second node N2. One terminal of the series arm resonator s3 is connected to the second node N2, and the other terminal is connected to a third node N3. One terminal of the series arm resonator s4a is connected to the third node N3, and the other terminal is connected to a fourth terminal 414 of the package 41. One terminal of the series arm resonator s4b is connected to the third node N3, and the other terminal is connected to a third terminal 413 of the package 41.

Subsequently, the connection relation among the parallel arm resonators (parallel arm resonators p1a, p1b, p2a, p2b, p3) will be described. One terminal of the parallel arm resonator p1a is connected to the first node N1, and the other terminal is connected to the terminal of the package 42b via the terminal of the package 41 and further connected to the ground terminal of the package 42b via a parallel circuit of the switch SW1p and the capacitor C41, formed in the package 42b. One terminal of the parallel arm resonator p1b is connected to the first node N1, and the other terminal is connected to the ground terminal of the package 41. One terminal of the parallel arm resonator p2a is connected to the second node N2, and the other terminal is connected to the terminal of the package 42b via the terminal of the package 41 and further connected to the ground terminal of the package 42b via a parallel circuit of the switch SW2p and the capacitor C42, formed in the package 42b. One terminal of the parallel arm resonator p2b is connected to the second node N2, and the other terminal is connected to the ground terminal of the package 41. One terminal of the parallel arm resonator p3 is connected to the third node N3, and the other terminal is connected to the ground terminal of the package 41.

In this way, in the case where one terminal of the switch provided in the series arm is connected to one of the input and output terminals 11m, 11n, when divided into the packages 42a, 42c each including the switch and the package 41 including the resonators, the switch is located closer to one of the input and output terminals than the resonators. Therefore, the number of terminals of the package 41 for resonators and the packages 42a, 42c for a switch is reduced, so the miniaturization of the radio-frequency filter 40 is achieved.

Not limited to the above configuration, the switch (first switch; here, the switches SW1b, SW4b) provided in the series arm just needs to be connected to the input and output terminal 11m (first input and output terminal) or the input and output terminal 11n (second input and output terminal) without intervening any series arm resonator. With such a configuration, when the series arm resonators are provided on or in a chip (here, the package 41) for resonators and the switch is provided on or in another chip (here, the packages 42a, 42c), the number of terminals of the chip for resonators is reduced. Specifically, in this case, in the chip for resonators, terminals that are connected to any one of the input and output terminals and terminals that are connected to the other chip are respectively shared. Therefore, in comparison with the configuration in which these terminals are individually provided, the number of terminals of the chip for resonators is reduced, so the miniaturization of the radio-frequency filter is achieved.

For example, in the circuit configuration shown in FIG. 20A, at least one of the capacitors C41, C42 may be incorporated in the package 41 for resonators.

At least one of the parallel arm resonators p1a, p1b, p2a, p2b, p3 may be provided separately from the package 41 for resonators, or the switches SW1b, SW4b, SW1p, SW2p and the capacitors C41, C42 may be packaged with a combination different from the above combination.

[4-3. Application Examples to Multiplexer]

The above-described radio-frequency filter 40 is applicable to a multiplexer.

Figure 21:
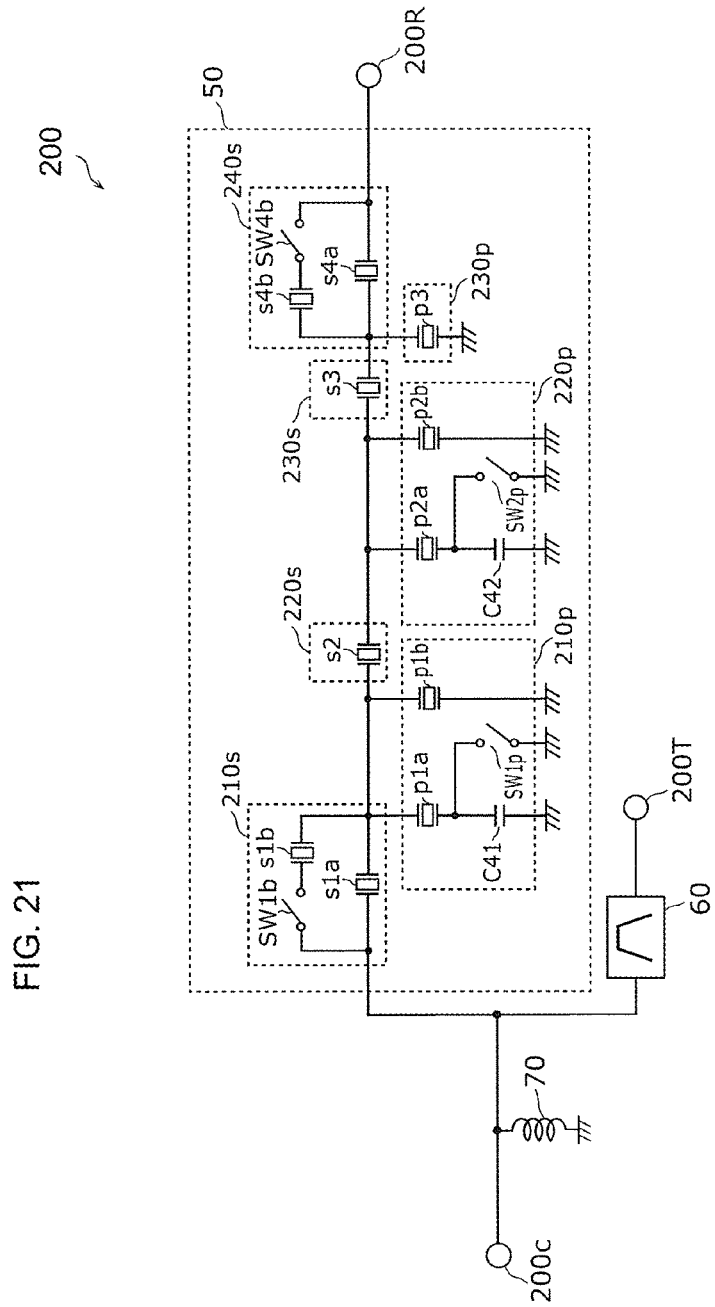
FIG. 21 is a circuit configuration diagram of a multiplexer according to Example 4.

FIG. 21 is a circuit configuration diagram of a multiplexer (duplexer) 200 according to Example 4. The multiplexer 200 shown in the diagram includes a transmission filter 60, a receiving filter 50, and a matching inductor 70. The transmission filter 60 is connected to an input terminal 200T and a common terminal 200c. The receiving filter 50 is connected to the common terminal 200c and an output terminal 200R.

The transmission filter 60 is a band pass filter having a transmission band as a pass band, and its circuit configuration is not specifically limited.

The receiving filter 50 corresponds to the radio-frequency filter 40 according to Example 4. The receiving filter 50 is a tunable band pass filter having a plurality of bands as pass bands.

With the above configuration, in a tunable duplexer that is applied to a system that selects from among a plurality of frequency bands as needed, a high-performance duplexer that is able to improve the loss at the higher edge of the pass band and the attenuation on the lower side of the pass band is achieved. Since a corresponding filter is not disposed for each frequency band and a single filter circuit having a switch is able to support a plurality of frequency bands, the multiplexer is miniaturized.

The receiving filter 50 is not limited to the configuration of Example 4 and may be the configuration of any one of Examples of the first to third embodiments. The radio-frequency filters according to Examples are not limited to application to receiving filters and may be applied to transmission filters. These radio-frequency filters are not limited to application to duplexers and may be applied to multiplexers including a plurality of transmission filters or a plurality of receiving filters.

Fifth Embodiment

The radio-frequency filters and multiplexers described in the first to fourth embodiments are applicable to a radio-frequency front-end circuit that supports a system having many service bands. In the present embodiment, such a radio-frequency front-end circuit and a communication device will be described.

Figure 22:
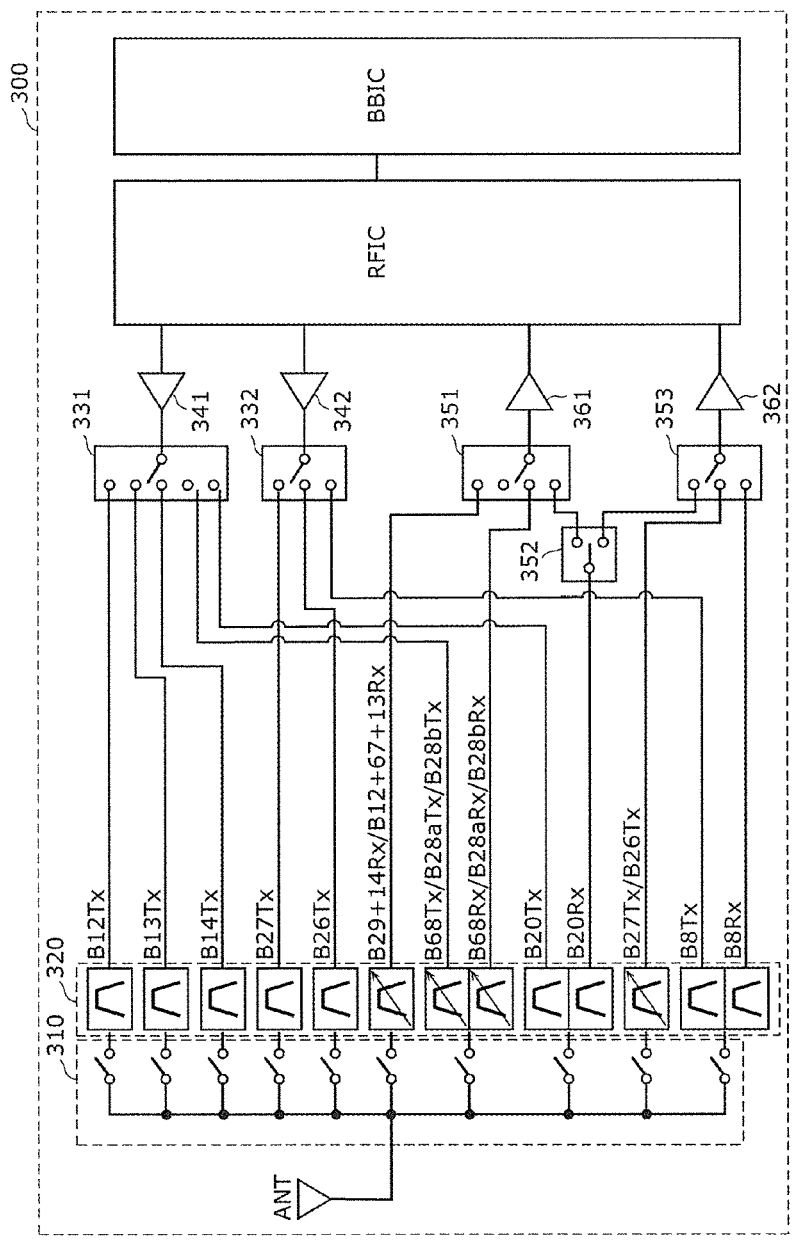
FIG. 22 is a configuration diagram of a communication device according to a fifth embodiment.

FIG. 22 is a configuration diagram of a communication device 300 according to a fifth embodiment.

As shown in the diagram, the communication device 300 includes a switch group 310 made up of a plurality of switches, a filter group 320 made up of a plurality of filters, transmission switches 331, 332, receiving switches 351, 352, 353, transmission amplifier circuits 341, 342, receiving amplifier circuits 361, 362, an RF signal processing circuit (RFIC), a baseband signal processing circuit (BBIC), and an antenna element (ANT). The antenna element (ANT) needs not be incorporated in the communication device 300.

The switch group 310 connects the antenna element (ANT) to a signal path that supports the predetermined band in accordance with a control signal from a control unit (not shown). The switch group 310 is made up of, for example, a plurality of SPST switches. The signal path to be connected to the antenna element (ANT) is not limited to one and may be multiple. That is, the communication device 300 may support carrier aggregation.

The filter group 320 is, for example, made up of a plurality of filters (including a duplexer) having the following bands as pass bands. Specifically, the bands include (i) a transmission band of Band 12, (ii) a transmission band of Band 13, (iii) a transmission band of Band 14, (iv) a transmission band of Band 27, (v) a transmission band of Band 26, (vi) a receiving band of Band 29 and Band 14 (or Band 12, Band 67, and Band 13), (vii-Tx) a transmission band of Band 68 (or Band 28a or Band 28b), (vii-Rx) a receiving band of Band 68 (or Band 28a or Band 28b), (viii-Tx) a transmission band of Band 20, (viii-Rx) a receiving band of Band 20, (ix-Tx) a transmission band of Band 27 (or Band 26), (x-Tx) a transmission band of Band 8, and (x-Rx) a receiving band of Band 8.

The transmission switch 331 is a switch circuit that includes a plurality of selection terminals connected to a plurality of low-band transmission signal paths and a common terminal connected to the transmission amplifier circuit 341. The transmission switch 332 is a switch circuit that includes a plurality of selection terminals connected to a plurality of high-band transmission signal paths and a common terminal connected to the transmission amplifier circuit 342. These transmission switches 331, 332 are switch circuits that are provided upstream (here, upstream in the transmission signal paths) of the filter group 320 and whose connection statuses are switched in accordance with control signals from a control unit (not shown). Thus, radio-frequency signals (here, radio-frequency transmission signals) amplified by the transmission amplifier circuits 341, 342 are outputted to the antenna element (ANT) via predetermined filters of the filter group 320.

The receiving switch 351 is a switch circuit that includes a plurality of selection terminals connected to a plurality of low-band reception signal paths and a common terminal connected to the receiving amplifier circuit 361. The receiving switch 352 is a switch circuit that includes a common terminal connected to a reception signal path of the predetermined band (here, Band 20) and two selection terminals connected to a common terminal of the receiving switch 352. The receiving switch 353 is a switch circuit that includes a plurality off selection terminals connected to a plurality of high-band reception signal paths and a common terminal connected to the receiving amplifier circuit 362. These receiving switches 351 to 353 are provided downstream (here, downstream in the reception signal paths) of the filter group 320 and whose connection statuses are switched in accordance with control signals from the control unit (not shown). Thus, radio-frequency signals (here, radio-frequency reception signals) inputted to the antenna element (ANT) are amplified by the receiving amplifier circuits 361, 362 via predetermined filters of the filter group 320 and outputted to the RF signal processing circuit (RFIC). An RF signal processing circuit (RFIC) that supports a low band and an RF signal processing circuit (RFIC) that supports a high band may be individually provided.

The transmission amplifier circuit 341 is a power amplifier that amplifies the electric power of a low-band radio-frequency transmission signal. The transmission amplifier circuit 342 is a power amplifier that amplifies the electric power of a high-band radio-frequency transmission signal.

The receiving amplifier circuit 361 is a low-noise amplifier that amplifies the electric power of a low-band radio-frequency reception signal. The receiving amplifier circuit 362 is a low-noise amplifier that amplifies the electric power of a high-band radio-frequency reception signal.

The RF signal processing circuit (RFIC) is a circuit that processes a radio-frequency signal that is transmitted or received by the antenna element (ANT). Specifically, the RF signal processing circuit (RFIC) processes a radio-frequency signal (here, radio-frequency reception signal) inputted from the antenna element (ANT) via the reception signal path by down conversion, or the like, and outputs the processed and generated reception signal to the baseband signal processing circuit (BBIC). The RF signal processing circuit (RFIC) also processes a transmission signal inputted from the baseband signal processing circuit (BBIC) by up conversion, or the like, and outputs the processed and generated radio-frequency signal (here, radio-frequency transmission signal) to the transmission signal path.

The thus configured communication device 300 includes the radio-frequency filter according to any one of the first to fourth embodiments as at least one of a filter having (vi) a receiving band of Band 29 and Band 14 (or Band 12, Band 67, and Band 13) as a pass band, a filter having (vii-Tx) a transmission band of Band 68 (or Band 28a or Band 28b) as a pass band, a filter having (vii-Rx) a receiving band of Band 68 (or Band 28a or Band 28b) as a pass band, and a filter having (ix-Tx) a transmission band of Band 27 (or Band 26) as a pass band. That is, the filter switches the pass band in accordance with a control signal.

In the communication device 300, the switch group 310, the filter group 320, the transmission switches 331, 332, the receiving switches 351, 352, 353, the transmission amplifier circuits 341, 342, the receiving amplifier circuits 361, 362, and the control unit make up the radio-frequency front-end circuit.

Although the control unit is not shown in FIG. 22, the RF signal processing circuit (RFIC) may include the control unit, or the control unit may make up a switch IC together with the switches that the control unit controls.

With the thus configured radio-frequency front-end circuit and communication device 300, since the radio-frequency filter according to any one of the above-described first to fourth embodiments is provided, the loss at the higher edge of the pass band and the attenuation on the lower side of the pass band are improved. That is, for example, a high-performance radio-frequency front-end circuit and communication device that are able to switch the pass band and the stop band while reducing the loss at the higher edge of the pass band are achieved. The number of filters is reduced as compared to the case where a filter is provided for each band, so miniaturization is achieved.

With the radio-frequency front-end circuit according to the present embodiment, the transmission switches 331, 332 and the receiving switches 351 to 353 (switch circuits) provided upstream or downstream of the filter group 320 (the plurality of radio-frequency filters) are provided. Thus, parts of signal paths through which a radio-frequency signal is transferred can be integrated. Thus, for example, the transmission amplifier circuits 341, 342 or the receiving amplifier circuits 361, 362 (amplifier circuits), each of which corresponds to a plurality of radio-frequency filters, can be integrated. Therefore, miniaturization and cost reduction of the radio-frequency front-end circuit are possible.

At least one of the transmission switches 331, 332 or at least one of the receiving switches 351 to 353 just needs to be provided. The number of the transmission switches 331, 332 and the number of the receiving switches 351 to 353 are not limited to the above-described numbers. For example, one transmission switch and one receiving switch may be provided. The number of the selection terminals, or the like, of the transmission switches or receiving switches is not limited to the present embodiment and may be two of each.

Other Embodiments, and Others

The radio-frequency filter, radio-frequency front-end circuit, and communication device according to the embodiments of the present disclosure are described by way of the first to fifth embodiments; however, the radio-frequency filter, radio-frequency front-end circuit, and communication device of the present disclosure are not limited to the above-described embodiments. The present disclosure also encompasses other embodiments implemented by combining selected elements of the above-described embodiments, modifications obtained by applying various alterations that are conceived of by persons skilled in the art to the above-described embodiments without departing from the purport of the present disclosure, and various devices that include the radio-frequency filter, radio-frequency front-end circuit, or communication device of the present disclosure.

The radio-frequency filters according to the first to fourth embodiments are not limited to application to a system that exclusively switches among the frequency bands close to one another and may also be applicable to a system that exclusively switches among a plurality of channels close to one another and allocated to within one frequency band.

In the radio-frequency filters according to the first to fourth embodiments, the series arm resonator(s) and the parallel arm resonator(s) are not limited to acoustic wave resonators that use surface acoustic waves and may be, for example, acoustic wave resonators that use bulk waves or boundary acoustic waves. Each of the series arm resonator and the parallel arm resonator is not limited to one acoustic wave resonator and includes a plurality of split resonators into which one acoustic wave resonator is, for example, serially divided.

In the radio-frequency filters according to the first to fourth embodiments, the series arm circuit includes at least one second series arm resonator lower in resonant frequency than the first series arm resonator; however, the series arm circuit just needs to include a second series arm resonator having a resonant frequency different from that of the first series arm resonator. Therefore, the series arm circuit may be made up of one first series arm resonator and one first variable frequency circuit, and the one first variable frequency circuit may be made up of a second switch and a second series arm resonator higher in resonant frequency than the first series arm resonator. With the thus configured radio-frequency filter, the higher side of the pass band can be changed (shifted in frequency) while the loss at the lower edge of the pass band is reduced.

Specifically, when the resonant frequency (fr_s1a) of the first series arm resonator is higher than the resonant frequency (fr_s1b) of the second series arm resonator (fr_s1b>fr_s1a), both the first anti-resonant frequency (fa1_s1_on) that lies between the resonant frequency (fr_s1a) of the first series arm resonator and the resonant frequency (fr_s1b) of the second series arm resonator and the second anti-resonant frequency (fa2_s1_on) that lies on the higher frequency side than the first anti-resonant frequency provide attenuation poles on the higher side of the pass band. That is, a new attenuation pole is provided on the higher side of the pass band by turning the first switch from the off state (nonconductive state) to the on state (conductive state).

Thus, when the attenuation pole on the lower side of the pass band, which is provided by the resonant frequency of the parallel arm circuit, is considered, the following can be said on the relationship between switching the on state and off state of the first switch and the pass band. Specifically, when the first switch is turned from the on state to the off state, a new attenuation pole is provided on the higher side of the pass band, so the stop band on the higher side of the pass band is widened. At this time, since no new attenuation pole is provided on the lower side of the pass band, the deterioration of the loss at the lower edge of the pass band is reduced, and the deterioration of the attenuation on the higher side of the pass band is reduced. In other words, the tunable radio-frequency filter that improves the loss at the lower edge of the pass band and the attenuation on the higher side of the pass band is achieved.

In the radio-frequency filters according to the first to fourth embodiments, the parallel arm circuit may be not an acoustic wave resonator and may be an LC resonant circuit.

The parallel arm circuit is not limited to a resonant circuit and may be an inductance element or a capacitance element.

The configuration of each of the series arm circuit described in any one of the first to third embodiments is applicable to a ladder filter circuit that includes a plurality of series arm circuits including the series arm circuit and one or more parallel arm circuits. In such a filter circuit, the configuration of the series arm circuit different from the series arm circuits described in the first to third embodiments is not specifically limited. The series arm circuit may be, for example, a resonant circuit, such as a longitudinally-coupled resonator or an LC resonant circuit or may be an inductance element or a capacitance element. Therefore, the configuration of the series arm circuit just needs to be selected as needed according to the required specifications and may be a longitudinally coupled resonator, for example, when attenuation reinforcement, or the like, is required.

In the above-described fourth embodiment, the configuration in which the series arm circuit described in any one of the first to third embodiments is provided closest to the input and output terminal 11m or the input and output terminal 11n is described as the configuration of a ladder filter circuit that includes a plurality of series arm circuits, including the series arm circuit described in the first to third embodiments, and one or more parallel arm circuits. However, the configuration of the ladder filter circuit is not limited thereto. For example, a series arm circuit different from the series arm circuit described in any one of the first to third embodiments may be provided closest to the input and output terminal 11m or the input and output terminal 11n. That is, the series arm circuit described in any one of the first to fourth embodiments may be provided other than an end portion of the plurality of series arm circuits.

In the radio-frequency filters, radio-frequency front-end circuit, and communication device according to the first to fifth embodiments, an inductance element or a capacitance element may be further connected between each input and output terminal and the common terminal. An inductance component caused by wires that connect the circuit elements may be provided.

The present disclosure is widely usable in communication equipment, such as cellular phones, as a small radio-frequency filter, radio-frequency front-end circuit, and communication device that simultaneously or exclusively use a plurality of close bands and that are applicable to multiband and multimode systems.

10, 10A, 10Ba, 10Bb, 10C, 10X, 20, 20A, 30, 40 radio-frequency filter
11, 11A, 11Ba, 11Bb, 11C, 11X, 210s, 220s, 230s, 240s series arm circuit
11aa, 11ab, 321 series connection circuit
11b, 11b1, 11bn, 11c, 11d variable frequency circuit
11m input and output terminal
11n input and output terminal
12, 22, 22A, 32, 210p, 220p, 230p parallel arm circuit
41, 42a, 42b, 42c package
43 circuit board
50 receiving filter
60 transmission filter
70 matching inductor
101 piezoelectric substrate
111 interdigital transducer electrode
111a electrode finger
120 acoustic wave resonator
200 multiplexer (duplexer)
200c common terminal
200R output terminal 200T input terminal
300 communication device
310 switch group
320 filter group
331, 332 transmission switch
341, 342 transmission amplifier circuit
351 to 353 receiving switch
361, 362 receiving amplifier circuit
411, 422, 432 first terminal
412, 423, 433 second terminal
413 third terminal
414 fourth terminal
421, 431 common terminal
ANT antenna element
BBIC baseband signal processing circuit
C11, C22, C41, C42 capacitor
L11, L22 inductor
N1 first node
N2 second node
N3 third node
p1, p1a, p1b, p2a, p2b, p3 parallel arm resonator
s1, s1a, s1b, s1b1, s1bn, s2, s3, s4a, s4b series arm resonator
SW1b, SW1p, SW2p, SW4b, SWb, SWb1, SWbn, SWp, SWx switch
x1 node

The invention claimed is:

1. A radio-frequency filter comprising:
a series arm circuit located in a path that connects a first input/output terminal and a second input/output terminal; and
a parallel arm circuit connected between ground and a node on the path, wherein:
the series arm circuit comprises:
a first series arm resonator in the path, and
a first variable frequency circuit connected in parallel with the first series arm resonator,
the first variable frequency circuit comprises:
a second series arm resonator, and
a first switch connected in series with the second series arm resonator,
the first variable frequency circuit is configured to change a resonant frequency or an anti-resonant frequency of the radio-frequency filter, a pass band of the radio-frequency filter being based on the resonant frequency and an attenuation pole of the radio-frequency circuit being based on the anti-resonant frequency, and
a resonant frequency of the second series arm resonator is different from a resonant frequency of the first series arm resonator.

2. The radio-frequency filter according to claim 1, wherein the resonant frequency of the second series arm resonator is less than the resonant frequency of the first series arm resonator.

3. The radio-frequency filter according to claim 1, wherein:
the series arm circuit further comprises another variable frequency circuit connected in parallel with the first series arm resonator, said another variable frequency circuit comprising another series arm resonator and another switch connected in series with said another series arm resonator,
said another variable frequency circuit is connected in parallel with the first series arm resonator, and
a resonant frequency of the other series arm resonator is different from the resonant frequency of the second series arm resonator.

4. The radio-frequency filter according to claim 3, wherein:
the resonant frequency of the second series arm resonator is less than the resonant frequency of the first series arm resonator, and
the resonant frequency of said another series arm resonator is greater than the resonant frequency of the first series arm resonator.

5. The radio-frequency filter according to claim 3, wherein the resonant frequency of the second series arm circuit or said another series arm circuit is less than the resonant frequency of the first series arm resonator.

6. The radio-frequency filter according to claim 1, wherein:
the series arm circuit further comprises a first impedance element connected in series with the first series arm resonator, and
the first variable frequency circuit is further connected in parallel with the first impedance element.

7. The radio-frequency filter according to claim 1, wherein:
the parallel arm circuit comprises:
a first parallel arm resonator connected between the node and ground, and
a second variable frequency circuit connected in series with the first parallel arm resonator,
the second variable frequency circuit comprises:
a second impedance element, and
a second switch connected in parallel with the second impedance element, and
a resonant frequency of the first parallel arm resonator is less than the resonant frequency of the first series arm resonator.

8. The radio-frequency filter according to claim 7, wherein:
the parallel arm circuit further comprises a second parallel arm resonator connected in parallel with the first parallel arm resonator and the second variable frequency circuit, and
a resonant frequency of the second parallel arm resonator is greater than the resonant frequency of the first parallel arm resonator.

9. The radio-frequency filter according to claim 7, wherein:
the second impedance element is a capacitor,
when the first switch is in a conductive state, the second switch is in a nonconductive state, and
when the first switch is in a nonconductive state, the second switch is in a conductive state.

10. The radio-frequency filter according to claim 7, wherein
the second impedance element is an inductor,
when the first switch is in a conductive state, the second switch is in a conductive state, and
when the first switch is in a nonconductive state, the second switch is in a nonconductive state.

11. The radio-frequency filter according to claim 1, wherein the first switch is directly connected to the first input/output terminal or the second input/output terminal.

12. The radio-frequency filter according to claim 1, wherein the first switch is a field effect transistor (FET) switch of gallium arsenide (GaAs) or a complementary metal-oxide-semiconductor (CMOS), or is a diode switch.

13. A radio-frequency front-end circuit comprising:
the radio-frequency filter according to claim 1; and
a controller configured to selectively control the first switch between a conductive state and a nonconductive state.

14. A communication device comprising:
a radio frequency (RF) signal processing circuit configured to process a radio-frequency signal that is transmitted or received by an antenna; and
the radio-frequency front-end circuit according to claim 13, the radio-frequency front-end circuit being configured to transfer the radio-frequency signal between the antenna and the RF signal processing circuit.

\* \* \* \* \*